US012709682B2

(12) United States Patent
Fujishima et al.

(10) Patent No.: US 12,709,682 B2
(45) Date of Patent: Aug. 18, 2026

(54) RESIN COMPOSITION

(71) Applicant: Ajinomoto Co., Inc., Tokyo (JP)

(72) Inventors: Shohei Fujishima, Kawasaki (JP); Shu Ikehira, Kawasaki (JP)

(73) Assignee: Ajinomoto Co., Inc., Tokyo (JP)

( * ) Notice: Subject to any disclaimer, the term of this patent is extended or adjusted under 35 U.S.C. 154(b) by 94 days.

(21) Appl. No.: 18/583,637

(22) Filed: Feb. 21, 2024

(65) Prior Publication Data

US 2024/0254328 A1 Aug. 1, 2024

Related U.S. Application Data

(63) Continuation of application No. PCT/JP2022/031539, filed on Aug. 22, 2022.

(30) Foreign Application Priority Data

Aug. 23, 2021 (JP) ................................ 2021-135951

(51) Int. Cl.

| | |
|---|---|
| ***C08L 63/00*** | (2006.01) |
| ***C08L 35/02*** | (2006.01) |
| ***C08L 71/12*** | (2006.01) |
| ***H05K 1/03*** | (2006.01) |

(52) U.S. Cl.

CPC ............... *C08L 63/00* (2013.01); *C08L 35/02* (2013.01); *C08L 71/12* (2013.01); *H05K 1/0346* (2013.01); *C08L 2203/20* (2013.01); *C08L 2205/03* (2013.01)

(58) Field of Classification Search

None

See application file for complete search history.

(56) References Cited

U.S. PATENT DOCUMENTS

| | | | | |
|---|---|---|---|---|
| 5,371,148 | A * | 12/1994 | Taylor .................. | C08F 290/12 525/308 |
| 2019/0276585 | A1 | 9/2019 | Torii | |
| 2021/0301071 | A1* | 9/2021 | Yamaguchi ............. | B32B 15/20 |

FOREIGN PATENT DOCUMENTS

| | | | | |
|---|---|---|---|---|
| CN | 105199326 | A * | 12/2015 | |
| EP | 808828 | A2 * | 11/1997 | |
| JP | 9-308871 | A | 12/1997 | |
| JP | 2006-335834 | | 12/2006 | |
| JP | 2019-156909 | A | 9/2009 | |
| WO | WO-2020031545 | A1 * | 2/2020 | ............. C08J 5/244 |

OTHER PUBLICATIONS

CN 105199326 translation (Year: 2005).*

International Search Report in Application PCT/JP2022/031539 issued Nov. 8, 2022.

* cited by examiner

*Primary Examiner* — Katarzyna I Kolb

(74) *Attorney, Agent, or Firm* — Oblon, McClelland, Maier & Neustadt, L.L.P.

(57) ABSTRACT

Resin compositions including (A) a compound containing a radical polymerizable group having a carbodiimide structure, and at least any one of (B) a compound containing a radical polymerizable group not having a carbodiimide structure and (C) a thermosetting resin can afford a cured product having excellent mechanical strength and plating adhesion property.

23 Claims, No Drawings

RESIN COMPOSITION

CROSS REFERENCES TO RELATED APPLICATIONS

This application is a continuation of International Patent Application No. PCT/JP2022/031539, filed on Aug. 22, 2022, and claims priority to Japanese Patent Application No. 2021-135951, filed on Aug. 23, 2021, both of which are incorporated herein by reference in their entireties.

BACKGROUND OF THE INVENTION

Field of the Invention

The present invention relates to resin compositions including a carbodiimide compound. In addition, the present invention relates to resin sheets, printed wiring boards, and semiconductor devices, these being obtained by using the resin composition.

Discussion of the Background

As a manufacturing technology for a printed wiring board, a build-up method in which insulating layers and conductive layers are alternately stacked is known. In the manufacturing method using the build-up method, in general, the insulating layer is formed by curing a resin composition. For example, Japanese Patent Application Laid-open No. 2006-335834, which is incorporated herein by reference in its entirety, discloses a technology in which the insulating layer is formed by curing a resin composition including a carbodiimide compound.

SUMMARY OF THE INVENTION

In recent years, due to a finer wiring as the result of improvement in functions of an electronic component, there is a need to further improve a mechanical strength and a plating adhesion property of the insulating layer.

Thus, it is an object of the present invention to provide a resin composition capable of producing a cured product having excellent mechanical strength and plating adhesion property.

This and other objects, which will become apparent during the following detailed description, have been achieved by the inventor' discovery that when a resin composition including (A) a compound containing a radical polymerizable group having a carbodiimide structure and further including at least any one of (B) a compound containing a radical polymerizable group not having a carbodiimide structure and (C) a thermosetting resin was used, a cured product having excellent plating adhesion property and mechanical strength could be obtained. The present invention was completed on the basis of this finding.

In other words, the present inventions contain the following.

(1) A resin composition comprising (A) a compound containing a radical polymerizable group having a carbodiimide structure, the resin composition further comprising at least any one of (B) a compound containing a radical polymerizable group not having a carbodiimide structure, and (C) a thermosetting resin.

(2) The resin composition according to (1), wherein the component (A) comprises a compound containing a radical polymerizable group represented by formula (1)

(1)

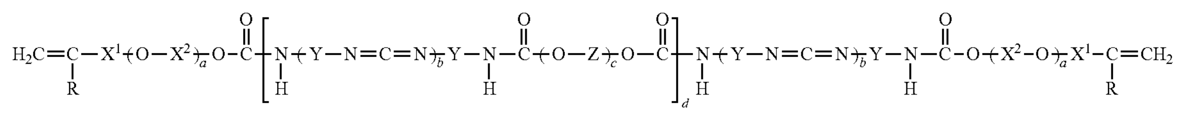

in the formula, each R independently represents a hydrogen atom or a methyl group;

each $X^1$ independently represents a carbonyl group, a methylene group, a phenylene group, or a phenylene-methylene group;

each $X^2$ independently represents a saturated divalent hydrocarbon group having 2 to 4 carbon atoms;

each Y independently represents a saturated divalent hydrocarbon group having 2 to 30 carbon atoms optionally having a substituent group, or an unsaturated divalent hydrocarbon group having 2 to 30 carbon atoms optionally having a substituent group;

each Z independently represents a saturated divalent hydrocarbon group having 2 to 300 carbon atoms optionally having a substituent group, or an unsaturated divalent hydrocarbon group having 2 to 300 carbon atoms optionally having a substituent group;

each a independently represents 0, or an integer of 1 or more;

each b independently represents an integer of 1 or more;

each c independently represents an integer of 1 or more; and d represents 0, or an integer of 1 or more.

(3) The resin composition according to (1), wherein a content of the component (A) relative to 100% by mass of nonvolatile components in the resin composition is in a range of 0.05% by mass to 10% by mass.

(4) The resin composition according to (1), wherein the component (C) comprises an epoxy resin.

(5) The resin composition according to (4), wherein the component (C) further comprises an active ester type curing agent.

(6) The resin composition according to (4), wherein the component (C) further comprises a phenol type curing agent.

(7) The resin composition according to (1), further comprising (D) an inorganic filler.

(8) The resin composition according to (7), wherein the component (D) is silica.

(9) The resin composition according to (7), wherein a content of the component (D) relative to 100% by mass of nonvolatile components in the resin composition is 40% by mass or more.

(10) The resin composition according to (1), further comprising a phenoxy resin.

(11) The resin composition according to (1), wherein a dielectric dissipation factor (Df) of a cured product of the resin composition is 0.006 or less when measured at 5.8 GHz and 23° C.

(12) The resin composition according to (1), wherein an elongation at a breaking point of a cured product of the resin composition is 1.2% or more when measured at 23° C.

(13) The resin composition according to (1), wherein the resin composition is for forming an insulating layer to form a conductive layer.

(14) The resin composition according to (1), wherein the resin composition is for forming an insulating layer of a printed wiring board.

(15) A cured product of the resin composition according to any one of (1) to (14).

(16) A sheet-like laminate material comprising the resin composition according to any one of (1) to (14).

(17) A resin sheet comprising:

a support; and a resin composition layer formed on the support, the resin composition layer being formed from the resin composition according to any one of (1) to (14).

(18) A printed wiring board comprising an insulating layer composed of a cured product of the resin composition according to any one of (1) to (14).

(19) A semiconductor device comprising the printed wiring board according to (18).

Advantageous Effects of Invention

According to the resin composition of the present invention, it is possible to obtain a cured product having excellent mechanical strength and plating adhesion property.

DETAILED DESCRIPTION OF THE PREFERRED EMBODIMENTS

Hereinafter, the present invention will be explained in detail in line with preferred embodiments thereof. Here, it must be noted that the present invention is not limited to the embodiments and examples described below, so that the present invention may be carried out with any arbitrary modification made so far as such modification is not outside the claims or equivalent thereto of the present invention.

Resin Composition

The resin composition according to the present invention includes (A) a compound containing a radical polymerizable group having a carbodiimide structure, and further includes at least any one of (B) a compound containing a radical polymerizable group not having a carbodiimide structure and (C) a thermosetting resin. According to the resin composition as described above, it is possible to obtain a cured product having excellent mechanical strength and plating adhesion property.

In addition to (A) the compound containing a radical polymerizable group having a carbodiimide structure, (B) the compound containing a radical polymerizable group not having a carbodiimide structure, and (C) the thermosetting resin, the resin composition according to the present invention may further include an optional component. Illustrative examples of the optional component include (A') another carbodiimide compound, (D) an inorganic filler, (E) a thermoplastic resin, (F) a stress relaxing agent, (G) a radical polymerization initiator, (H) a curing accelerator, (I) another additive, and (J) an organic solvent.

Hereinafter, each component included in the resin composition will be explained in detail.

(A) Compound Containing Radical Polymerizable Group Having Carbodiimide Structure The resin composition according to the present invention includes (A) a compound containing a radical polymerizable group having a carbodiimide structure. (A) The compound containing a radical polymerizable group having a carbodiimide structure is a compound having one or more (preferably two or more) of a carbodiimide structure (—N═C═N—) and one or more (preferably two or more) of a radical polymerizable group in one molecule. It is preferable that the component (A) further include a compound having one or more (preferably two or more) of a urethane bond (—O—CO—NH—) in one molecule. The component (A) may have a function to react with and cure (C1) an epoxy resin when (C1) the epoxy resin is included as (C) the thermosetting resin, which is going to be described later. The component (A) may be used singly, or as a combination of two or of it.

The radical polymerizable group is the group having a radical polymerizable ethylenic unsaturated bond. Although the example thereof is not particularly restricted, illustrative examples thereof include (1) a group represented by the formula (R):

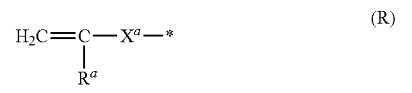

(R)

in the formula: each $R^a$ independently represents a hydrogen atom or a methyl group; each $X^a$ independently represents a carbonyl group, a methylene group, or a phenylene group; and * indicates a bonding site, and (2) a maleimide group (2,5-dihydro-2,5-dioxo-1H-pyrrole-1-yl group).

The phenylene group includes a 1,2-phenylene group, a 1,3-phenylene group, and a 1,4-phenylene group.

In one embodiment, the component (A) includes preferably a compound containing a radical polymerizable group represented by the formula (1):

(1)

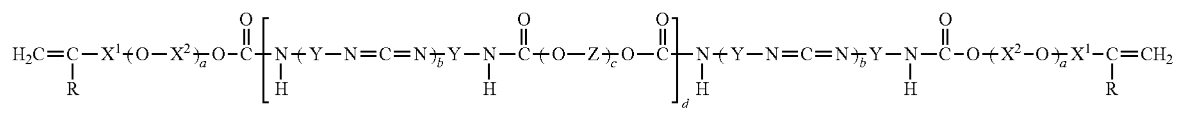

in the formula:

each R independently represents a hydrogen atom or a methyl group;

each $X^1$ independently represents a carbonyl group, a methylene group, a phenylene group, or a phenylene-methylene group;

each $X^2$ independently represents a saturated divalent hydrocarbon group having 2 to 4 carbon atoms;

each Y independently represents a saturated divalent hydrocarbon group having 2 to 30 carbon atoms optionally having a substituent group, or an unsaturated divalent hydrocarbon group having 2 to 30 carbon atoms optionally having a substituent group;

each Z independently represents a saturated divalent hydrocarbon group having 2 to 300 carbon atoms optionally having a substituent group, or an unsaturated divalent hydrocarbon group having 2 to 300 carbon atoms optionally having a substituent group;

each a independently represents 0, or an integer of 1 or more;

each b independently represents an integer of 1 or more;

each c independently represents an integer of 1 or more; and d represents 0, or an integer of 1 or more. The a unit, the b unit, the c unit, and the d unit each may be the same or different in each structural unit.

Each R independently represents a hydrogen atom or a methyl group.

Each $X^1$ independently represents a carbonyl group, a methylene group, a phenylene group, or a phenylene-methylene group (the bonding direction is not particularly restricted, but the phenylene side is preferably bonded to C in "R—C"). In one embodiment, a methylene group or a carbonyl group is preferable. The phenylene-methylene group includes a 1,2-phenylene-methylene group, a 1,3-phenylene-methylene group, and a 1,4-phenylene-methylene group.

Each $X^2$ independently represents a saturated divalent hydrocarbon group having 2 to 4 carbon atoms. The saturated divalent hydrocarbon group means a linear or a branched-chain saturated divalent hydrocarbon group and/or a cyclic saturated divalent hydrocarbon group. Specifically, illustrative examples of the saturated divalent hydrocarbon group having 2 to 4 carbon atoms include a linear alkylene group having 2 to 4 carbon atoms such as an ethylene group, a trimethylene group, and a tetramethylene group; and a branched chain alkylene group having 2 to 4 carbon atoms such as an ethylidene group, a propylidene group, an isopropylidene group, and an ethyl methyl methylene group. In one embodiment, each $X^2$ independently represents preferably a saturated divalent hydrocarbon group having 2 or 3 carbon atoms, and more preferably an ethylene group ($—CH_2—CH_2—$).

Each Y independently represents a saturated divalent hydrocarbon group having 2 to 30 carbon atoms optionally having a substituent group, or an unsaturated divalent hydrocarbon group having 2 to 30 carbon atoms optionally having a substituent group. The unsaturated divalent hydrocarbon group means a linear, a branched, and/or a cyclic unsaturated divalent hydrocarbon group having at least one carbon-carbon double bond or an aromatic hydrocarbon ring.

There is no particular restriction in the "substituent group" in the saturated divalent hydrocarbon group and in the unsaturated divalent hydrocarbon group. Illustrative examples thereof include, but not particularly limited to, a halogen atom, an alkyl-oxy group, an alkenyl-oxy group, an aryl-oxy group, an alkyl-oxy-carbonyl group, an alkenyl-oxy-carbonyl group, an aryl-oxy-carbonyl group, an alkyl-carbonyl-oxy group, an alkenyl-carbonyl-oxy group, and an aryl-carbonyl-oxy group.

The alkyl (group) means a linear, a branched, and/or a cyclic monovalent saturated aliphatic hydrocarbon group. The alkyl (group) is preferably an alkyl (group) having 1 to 14 carbon atoms, more preferably an alkyl (group) having 1 to 10 carbon atoms, and still more preferably an alkyl (group) having 1 to 6 carbon atoms, unless otherwise specifically mentioned. Illustrative examples of the alkyl (group) include a methyl group, an ethyl group, a propyl group, an isopropyl group, a butyl group, an isobutyl group, a sec-butyl group, a tert-butyl group, a pentyl group, an isopentyl group, a sec-pentyl group, a neopentyl group, a tert-pentyl group, a hexyl group, an isohexyl group, a heptyl group, an isoheptyl group, an octyl group, an isooctyl group, a tert-octyl group, a cyclopentyl group, and a cyclohexyl group.

The alkenyl (group) means a linear, a branched, and/or a cyclic monovalent unsaturated aliphatic hydrocarbon group having at least one carbon-carbon double bond. Unless otherwise specifically mentioned, the alkenyl (group) is preferably an alkenyl group having 2 to 14 carbon atoms, more preferably an alkenyl group having 2 to 10 carbon atoms, and still more preferably an alkenyl group having 2 to 6 carbon atoms. Illustrative examples of the alkenyl (group) include a vinyl group, a propenyl group (an allyl group, a 1-propenyl group, and an isopropenyl group), a butenyl group (a 1-butenyl group, a crotyl group, a methallyl group, an isocrotyl, etc.), a pentenyl group (e.g., a 1-pentenyl group), a hexenyl group (e.g., a 1-hexenyl group), a heptenyl group (e.g., a 1-heptenyl group), an octenyl group (e.g., a 1-octenyl group), a cyclopentenyl group (e.g., a 2-cyclopentenyl group), and a cyclohexenyl group (e.g., a 3-cyclohexenyl group).

The aryl (group) means a monovalent aromatic hydrocarbon group having one hydrogen atom removed in the aromatic carbon ring. The aryl (group) is preferably an aryl (group) having 6 to 14 carbon atoms, and more preferably an aryl (group) having 6 to 10 carbon atoms, unless otherwise specifically mentioned. Illustrative examples of the aryl (group) include a phenyl group, a 1-naphtyl group, and a 2-naphthyl group. The halogen atom is a fluorine atom, a chlorine atom, a bromine atom, or an iodine atom.

In one embodiment, each Y independently represents preferably a saturated divalent hydrocarbon group having a ring structure (e.g., a ring structure selected from a cycloalkane ring, a benzene ring, and a naphthalene ring) with 2 to 30 carbon atoms optionally having a substituent group, or an unsaturated divalent hydrocarbon group having a ring structure (e.g., a ring structure selected from a cycloalkane ring, a benzene ring, and a naphthalene ring) with 2 to 30 carbon atoms optionally having a substituent group, and more preferably a divalent group represented by the formula (Y):

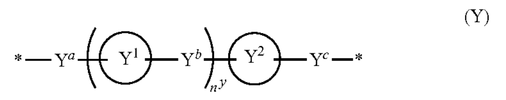

(Y)

in the formula each $Y^a$, each $Y^b$, and each $Y^c$ independently represent a single bond or $C(R^y)_2$;

each $R^y$ independently represents a hydrogen atom or a methyl group;

each ring $Y^1$ and each ring $Y^2$ independently represent a cycloalkane ring having 4 to 10 carbon atoms optionally having a substituent group, a benzene ring optionally having a substituent group, or a naphthalene ring optionally having a substituent group;

$n^y$ represents 0 or 1; and

* indicates a bonding site.

Illustrative examples of the cycloalkane ring having 4 to 10 carbon atoms include monocyclic saturated hydrocarbon rings such as a cyclobutane ring, a cyclopentane ring, a cyclohexane ring, a cycloheptane ring, a cyclooctane ring, a cyclononane ring, and a cyclodecane ring; bicyclic saturated hydrocarbon rings such as a bicyclo[2.2.1]heptane ring (norbornane ring), a bicyclo[4.4.0]decane ring (decalin ring), a bicyclo[5.3.0]decane ring, a bicyclo[4.3.0]nonane ring (hydrindane ring), a bicyclo[3.3.0]octane ring, and a bicyclo[3.3.1]nonane ring; and tricyclic saturated hydrocarbon rings such as a tricyclo[5.2.1.$0^{2,6}$]decane ring (tetrahydrodicyclopentadiene ring) and a tricyclo[3.3.1.$1^{3,7}$]decane ring (adamantane ring).

There is no particular restriction in the "substituent group" in the cycloalkane ring, the benzene ring, and the naphthalene ring; here, illustrative examples thereof include a halogen atom, an alkyl group, an alkenyl group, an aryl group, an aryl-alkyl group (alkyl group substituted with an aryl group), an alkyl-aryl group (aryl group substituted with an alkyl group), an alkyl-oxy group, an alkenyl-oxy group, an aryl-oxy group, an alkyl-oxy-carbonyl group, an alkenyl-oxy-carbonyl group, an aryl-oxy-carbonyl group, an alkyl-carbonyl-oxy group, alkenyl-carbonyl-oxy group, and an aryl-carbonyl-oxy group.

Each of $Y^a$, $Y^b$, and $Y^c$ independently represent a single bond or $C(R^y)_2$, and in one embodiment, it is preferable that $Y^a$ and $Y^c$ be a single bond and $Y^b$ be $C(R^y)_2$. Each $R^y$ independently represents a hydrogen atom or a methyl group, and in one embodiment, this is preferably a hydrogen atom.

Each ring $Y^1$ and each ring $Y^2$ independently represent a cycloalkane ring having 4 to 10 carbon atoms optionally having a substituent group, a benzene ring optionally having a substituent group, or a naphthalene ring optionally having a substituent group, and in one embodiment, they are preferably a cycloalkane ring having 4 to 10 carbon atoms optionally having a substituent group, more preferably a cyclohexane ring optionally having a substituent group, and especially preferably a (unsubstituted) cyclohexane ring.

There is no particular restriction in the specific example of Y; but the divalent groups illustrated by the formulae (Y1) to (Y14) may be preferable:

(Y1)

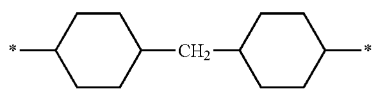

(Y2)

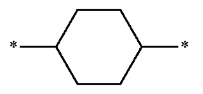

(Y3)

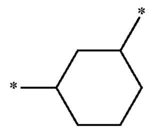

-continued (Y4)

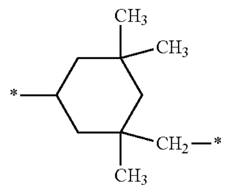

(Y5)

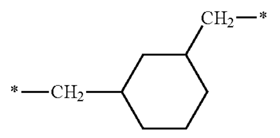

(Y6)

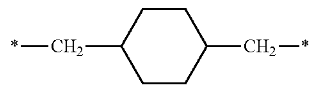

(Y7)

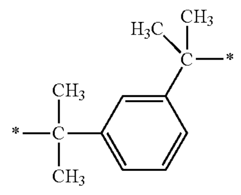

(Y8)

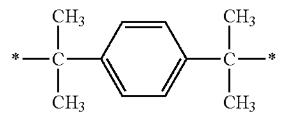

(Y9)

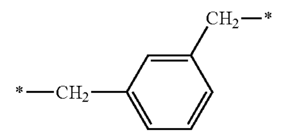

(Y10)

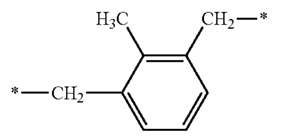

(Y11)

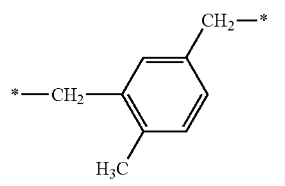

(Y12)

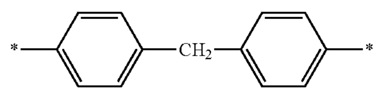

(Y13)

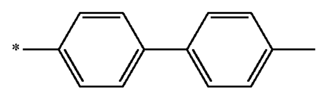

(Y14)

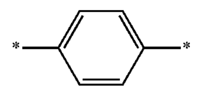

in the formulae, * indicates a bonding site. Among these, the divalent group illustrated by the formula (Y1) is especially preferable.

Each Z independently represents a saturated divalent hydrocarbon group having 2 to 300 carbon atoms optionally having a substituent group, or an unsaturated divalent hydrocarbon group having 2 to 300 carbon atoms optionally having a substituent group, and in one embodiment, preferably a saturated divalent hydrocarbon group having 2 to 300 carbon atoms, or an unsaturated divalent hydrocarbon group having 2 to 300 carbon atoms, more preferably a divalent hydrocarbon group having 300 or less carbon atoms and having a structural unit (preferably a repeating structural unit) selected from the formulae (Z1) to (Z8):

(Z1)
(Z2)
(Z3)
(Z4)
(Z5)
(Z6)
(Z7)
(Z8)

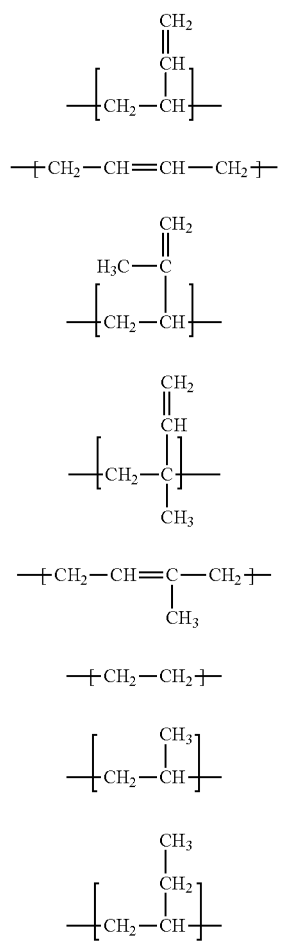

(especially preferably a divalent hydrocarbon group having 300 or less carbon atoms formed of a structural unit (preferably a repeating structural unit) selected from the formulae (Z1) to (Z8)), and still more preferably a divalent hydrocarbon group having 300 or less carbon atoms and having a structural unit (preferably a repeating structural unit) represented by the formula (Z1) (especially preferably a divalent hydrocarbon group having 300 or less carbon atoms, formed of a structural unit (preferably a repeating structural unit) selected from formulae (Z1) to (Z8), and having at least a structural unit (preferably a repeating structural unit) represented by the formula (Z1)), a divalent hydrocarbon group having 300 or less carbon atoms represented by the formula (Z1'):

(Z1')

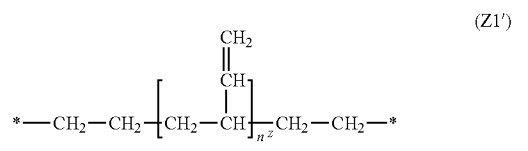

in the formula, $n^z$ represents an integer of 1 or more; and * indicates a bonding site.

Each a independently represents 0 or an integer of 1 or more; and in one embodiment, a is preferably 0, or an integer of 1 to 10, and more preferably 0 or 1. Each b independently represents an integer of 1 or more, and in one embodiment, preferably an integer of 1 to 100, and more preferably an integer of 1 to 10. In one embodiment, each c independently represents an integer of 1 or more, preferably an integer of 1 to 100, more preferably an integer of 1 to 10, and still more preferably 1. Each d independently represents 0 or an integer of 1 or more, and in one embodiment, preferably 0 or an integer of 1 to 100, and more preferably 0 or an integer of 1 to 10.

There is no particular restriction in the weight-average molecular weight of the component (A); this may be preferably in the range of 500 to 10,000, more preferably in the range of 1,000 to 8,000, still more preferably in the range of 2,000 to 7,000, and especially preferably in the range of 3,000 to 6,000.

As for the component (A), a commercially available product may be used, or this may be synthesized using a known method.

In the resin composition, there is no particular restriction in the content of the component (A); the content thereof relative to 100% by mass of nonvolatile components in the resin composition may be preferably 20% by mass or less, more preferably 15% by mass or less, still more preferably 10% by mass or less, far still more preferably 7% by mass or less, and especially preferably 5% by mass or less. Although there is no particular restriction in the lower limit of the content of the component (A) in the resin composition, from the viewpoint of clearly obtaining the intended effects of the present invention, the content thereof relative to 100% by mass of the nonvolatile components in the resin composition is preferably 0.001% by mass or more, more preferably 0.01% by mass or more, still more preferably 0.05% by mass or more, far still more preferably 0.1% by mass or more, and especially preferably 0.5% by mass or more.

(A') Another Carbodiimide Compound

The resin composition may contain, in addition to the component (A), (A') another carbodiimide compound as an optional component. (A') The other carbodiimide compound is the compound having one or more (preferably 2 or more) carbodiimide structures (—N═C═N—) in one molecule, but not having a radical polymerizable group. (A') The other carbodiimide compound may have a function to cure (C1) an epoxy resin by reacting with it when (C1) the epoxy resin is included as (C) the thermosetting resin, which will be described later. (A') The other carbodiimide compound may be used singly or as a combination of two or more.

Illustrative examples of (A') the other carbodiimide compound include biscarbodiimides including aliphatic biscarbodiimides such as tetramethylene-bis(t-butylcarbodiimide) and cyclohexane-bis(methylene-t-butylcarbodiimide); and aromatic biscarbodiimides such as phenylene-bis(xylylcarbodiimide); polycarbodiimides including aliphatic polycarbodiimides such as polyhexamethylene carbodiimide, polytrimethylhexamethylene carbodiimide, polycyclohexylene carbodiimide, poly(methylenebiscyclohexylene carbodiimide), and poly(isophorone carbodiimide); and aromatic polycarbodiimides such as poly(phenylene carbodiimide), poly (naphthylene carbodiimide), poly(tolylene carbodiimide), poly(methyldiisopropylphenylene carbodiimide), poly(triethylphenylene carbodiimide), poly(diethylphenylene carbodiimide), poly(triisopropylphenylene carbodiimide), poly (diisopropylphenylene carbodiimide), poly(xylylene carbodiimide), poly(tetramethylxylylene carbodiimide), poly(methylenediphenylene carbodiimide), and poly[methylenebis(methylphenylene) carbodiimide].

ether resin, a polyether ether ketone resin, and a polyester resin; in this embodiment, the component (B) includes modified resins of these resins having 2 or more groups represented by the formula (R).

In the first embodiment, the component (B) preferably includes a resin selected from a modified polyphenylene ether resin having 2 or more groups represented by the formula (R) and a modified polystyrene resin having 2 or more groups represented by the formula (R), more preferably a modified polyphenylene ether resin having 2 or more groups represented by the formula (R), and especially preferably a resin represented by the formula (2):

(2)

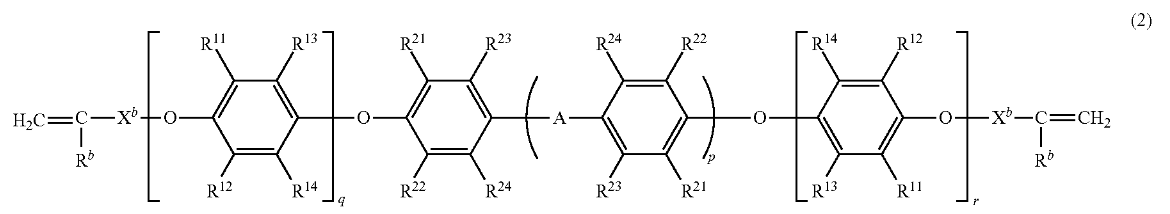

Illustrative examples of the commercially available (A') the other carbodiimide compound include “Carbodilite V-02B”, “Carbodilite V-03”, “Carbodilite V-04K”, “Carbodilite V-07”, and “Carbodilite V-09”, all being manufactured by Nisshinbo Chemical Inc.; and “Stabaxol P”, “Stabaxol P400”, and “Hycasyl 510”, all being manufactured by Rhein Chemie GmbH.

There is no particular restriction in the content of (A') the other carbodiimide compound in the resin composition; the content thereof relative to 100% by mass of the nonvolatile components in the resin composition is preferably 15% by mass or less, more preferably 10% by mass or less, still more preferably 5% by mass or less, and especially preferably 2% by mass or less. There is no particular restriction in the lower limit of the content of (A') the other carbodiimide compound in the resin composition; the content thereof relative to 100% by mass of the nonvolatile components in the resin composition may be, for example, 0% by mass or more, 0.001% by mass or more, 0.01% by mass or more, or 0.1% by mass or more.

(B) Compound Containing Radical Polymerizable Group not Having Carbodiimide Structure It is preferable that the resin composition according to the present invention include (B) a compound containing a radical polymerizable group not having a carbodiimide structure. (B) The compound containing a radical polymerizable group not having a carbodiimide structure is the compound that contains one or more (preferably two or more) of a radical polymerizable group in one molecule but does not have the carbodiimide structure (—N═C═N—). The component (B) may be used singly, or as a combination of two or of it.

In a first embodiment, it is preferable that the component (B) include a thermoplastic resin having two or more groups represented by the above formula (R) (e.g., a number-average molecular weight of 800 or more). There is no particular restriction in the thermoplastic resin; illustrative examples thereof include a phenoxy resin, a polyvinyl acetal resin, a polystyrene resin, a polyethylene resin, a polypropylene resin, a polybutadiene resin, a polyimide resin, a polyamide imide resin, a polyether imide resin, a polysulfone resin, a polyether sulfone resin, a polyphenylene in the formula, each $R^b$ independently represents a hydrogen atom or a methyl group; each $X^b$ independently represents a carbonyl group, a methylene group, a phenylene group, or a phenylene-methylene group (the bonding direction is not particularly limited, but the phenylene side is bonded preferably to C in “$R^b$—C”); each $R^{11}$ and each $R^{12}$ independently represent an alkyl group; $R^{13}$, $R^{14}$, $R^{21}$, $R^{22}$, $R^{23}$, and $R^{24}$ each independently represent a hydrogen atom or an alkyl group; A represents a single bond, —$C(R^c)_2$—, —O—, —CO—, —S—, —SO—, or —$SO_2$—; each $R^c$ independently represents a hydrogen atom or an alkyl group; p represents 0 or 1; and each q and each r independently represent an integer of one or more. The q and r units may be the same or different in each structural unit.

Each $R^b$ independently represents a hydrogen atom or a methyl group. Each $X^b$ independently represents a carbonyl group, a methylene group, a phenylene group, or a phenylene-methylene group (the bonding direction is not particularly limited, but the phenylene side is preferably bonded to C in “$R^b$—C”), and represents preferably a carbonyl group or a phenylene-methylene group.

Each $R^{11}$ and each $R^{12}$ independently represent an alkyl group, and preferably a methyl group. Each $R^{13}$ and each $R^{14}$ independently represent a hydrogen atom or an alkyl group, and preferably a hydrogen atom. Each $R^{21}$ and each $R^{22}$ independently represent a hydrogen atom or an alkyl group, preferably a hydrogen atom or a methyl group, and more preferably a methyl group. Each $R^{23}$ and each $R^{24}$ independently represent a hydrogen atom or an alkyl group, and preferably a hydrogen atom or a methyl group.

A represents a single bond, —$C(R^c)_2$—, —O—, —CO—, —S—, —SO—, or —$SO_2$—, and preferably a single bond, —$C(R^c)_2$—, or —O—. Each $R^c$ independently represents a hydrogen atom or an alkyl group, and preferably a hydrogen atom or a methyl group. Here, p represents 0 or 1, and preferably 1. Each q and each r independently represent an integer of 1 or more, preferably an integer of 1 to 200, and more preferably an integer of 1 to 100.

The radical polymerizable group equivalent of the component (B) in the first embodiment is preferably in the range of 300 g/eq. to 2500 g/eq. and more preferably in the range of 400 g/eq. to 2000 g/eq. The radical polymerizable group equivalent indicates the mass of the resin (compound) per one equivalent of the radical polymerizable group.

The number-average molecular weight of the component (B) in the first embodiment is preferably in the range of 800 to 10000, and more preferably in the range of 900 to 5000. The number-average molecular weight of the resin may be measured in terms of polystyrene by a gel permeation chromatography (GPC) method.

Illustrative examples of the commercially available product of the component (B) in the first embodiment include "OPE-2St 1200" and "OPE-2St 2200" (vinyl benzyl modified polyphenylene ether resins), both being manufactured by Mitsubishi Gas Chemical Inc.; and "SA9000" and "SA9000-111" (methacrylate-modified polyphenylene ether resin), both being manufactured by SABIC Innovative Plastics, Inc.

In a second embodiment, the component (B) includes a low molecular weight compound (e.g., molecular weight of less than 800) having two or more groups represented by the formula (R). Illustrative examples of such a compound include a polyfunctional (meth)acryloyl group-containing compound having a molecular weight of less than 800, a polyfunctional vinylaryl group-containing compound having a molecular weight of less than 800, and a polyfunctional allyl group-containing compound having a molecular weight of less than 800.

The polyfunctional (meth)acryloyl group-containing compound having the molecular weight of less than 800 is the compound having two or more (meth)acryloyl groups. Illustrative examples of the polyfunctional (meth)acryloyl group-containing compound having a molecular weight of less than 800 include aliphatic (meth)acrylate ester compounds such as cyclohexane-1,4-dimethanol di(meth)acrylate, cyclohexane-1,3-dimethanol di(meth)acrylate, tricyclodecanedimethanol di(meth)acrylate, neopentylglycol di(meth)acrylate, 1,4-butanediol di(meth)acrylate, 1,6-hexanediol di(meth)acrylate, 1,8-octanediol di(meth)acrylate, 1,9-nonanediol di(meth)acrylate, 1,10-decanediol di(meth)acrylate, trimethylolpropane tri(meth)acrylate, trimethylolethane tri(meth)acrylate, glycerin tri(meth)acrylate, and pentaerythritol tetra(meth)acrylate; ether-containing (meth)acrylate compounds such as dioxaneglycol di(meth)acrylate, 3,6-dioxa-1,8-dioxanediol di(meth)acrylate, 3,6,9-trioxaundecane-1,11-diol di(meth)acrylate, polyethylene glycol di(meth)acrylate, polypropylene glycol di(meth)acrylate, 9,9-bis[4-(2-acryloyloxyethoxy)phenyl]fluorene, ethoxylated bisphenol A di(meth)acrylate, and propoxylated bisphenol A di(meth)acrylate; isocyanurate-containing (meth)acrylate ester compounds such as tris(3-hydroxypropyl)isocyanurate tri(meth)acrylate, tris(2-hydroxyethyl)isocyanurate tri(meth)acrylate, and ethoxylated isocyanurate tri(meth)acrylate. Illustrative examples of the commercially available multifunctional (meth)acryloyl group-containing compound having a molecular weight of less than 800 include "A-DOG" (dioxaneglycol diacrylate) manufactured by Shin-Nakamura Chemical Co., Ltd.; "DCP-A" (tricyclodecanedimethanol diacrylate) and "DCP" (tricyclodecanedimethanol dimethacrylate), both being manufactured by Kyoeisha Chemical Co., Ltd.; and "KAYARAD R-684" (tricyclodecanedimethanol diacrylate) and "KAYARAD R-604" (dioxaneglycol diacrylate), both being manufactured by Nippon Kayaku Co., Ltd.

The polyfunctional vinylaryl group-containing compound having a molecular weight of less than 800 is the compound having two or more vinylaryl groups. Illustrative examples of the polyfunctional vinylaryl group-containing compound having a molecular weight of less than 800 include 4,4'-divinylbiphenyl, 1,2-bis(4-vinylphenyl)ethane, 2,2-bis(4-vinylphenyl)propane, and bis(4-vinylphenyl)ether.

The polyfunctional allyl group-containing compound having a molecular weight of less than 800 is the compound having two or more allyl groups. Illustrative examples of the polyfunctional allyl group-containing compound having a molecular weight of less than 800 include aromatic carboxylate allyl ester compounds such as diallyl diphenate, triallyl trimellitate, diallyl phthalate, diallyl isophthalate, diallyl terephthalate, diallyl 2,6-naphthalene dicarboxylate, and diallyl 2,3-naphthalene carboxylate; allyl isocyanurate ester compounds such as 1,3,5-triallyl isocyanurate and 1,3-diallyl-5-glycidyl isocyanurate; epoxy-containing aromatic allyl compounds such as 2,2-bis[3-allyl-4-(glycidyloxy)phenyl] propane; benzoxazine-containing aromatic allyl compounds such as bis[3-allyl-4-(3,4-dihydro-2H-1,3-benzoxazine-3-yl)phenyl]methane; ether-containing aromatic allyl compounds such as 1,3,5-triallyl ether benzene; and allyl silane compounds such as diallyldiphenylsilane. Illustrative examples of the commercially available polyfunctional allyl group-containing compound having a molecular weight of less than 800 include "TAIC" (1,3,5-triallylisocyanurate) manufactured by Nippon Kasei Chemical Company Limited; "DAD" (diallyl diphenate) manufactured by Nisshoku Techno Fine Chemical Co., Ltd.; "TRIAM-705" (triallyl trimellitate) manufactured by Wako Pure Chemical Industries, Ltd.; "DAND" (diallyl 2,3-naphthalenecarboxylate) manufactured by Nihon Joryu Kogyo Co., Ltd.; "ALP-d" (bis[3-allyl-4-(3,4-dihydro-2H-1,3-benzoxazin-3-yl)phenyl] methane) manufactured by Shikoku Chemicals Corp.; "RE-810NM" (2,2-bis[3-allyl-4-(glycidyloxy)phenyl]propane) manufactured by Nippon Kayaku Co., Ltd.; and "DA-MGIC" (1,3-diallyl-5-glycidylisocyanurate) manufactured by Shikoku Chemicals Corp.

The radical polymerizable group equivalent of the component (B) in the second embodiment is preferably in the range of 30 g/eq. to 400 g/eq., more preferably in the range of 50 g/eq. to 300 g/eq., and still more preferably in the range of 75 g/eq. to 200 g/eq.

The molecular weight of the component (B) in the second embodiment is preferably in the range of 100 to 700, more preferably in the range of 200 to 400, and still more preferably in the range of 250 to 500.

In a third embodiment, the component (B) is preferably a maleimide compound containing a partial structure represented by the formula (3'):

(3')

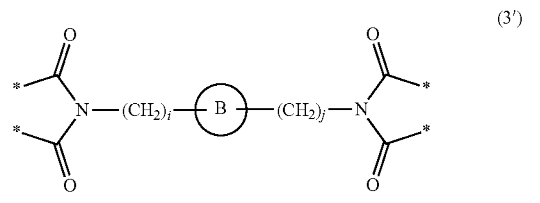

in the formula, the ring B represents a monocycloalkane ring optionally having a substituent group, or a monocycloalkene ring optionally having a substituent group; each i and each j independently represent 0 or an integer of 1 or more, and the sum of i and j is 6 or more; and * indicates a bonding site. The maleimide compound means the compound containing at least one maleimide group (2,5-dihydro-2,5-dioxo-1H-pyrrol-1-yl group) in one molecule. The number of the maleimide group in one molecule of the maleimide compound in the third embodiment is preferably 2 or more, and especially preferably 2. The maleimide compound in the third embodiment may be used singly or as a combination of two or more in an arbitrary ratio.

The monocycloalkane ring means a monocyclic saturated aliphatic hydrocarbon ring. The monocycloalkane ring is preferably a monocycloalkane ring having 4 to 14 carbon atoms, more preferably a monocycloalkane ring having 4 to 10 carbon atoms, and especially preferably a monocycloalkane ring having 5 or 6 carbon atoms. Illustrative examples of the monocycloalkane ring include a cyclobutane ring, a cyclopentane ring, a cyclohexane ring, a cycloheptane ring, and a cyclooctane ring. The monocycloalkene ring means a monocyclic unsaturated aliphatic hydrocarbon ring having at least one carbon-carbon double bond. The monocycloalkene ring is preferably a monocycloalkene ring having 4 to 14 carbon atoms, more preferably a monocycloalkene ring having 4 to 10 carbon atoms, and especially preferably a monocycloalkene ring having 5 or 6 carbon atoms. Illustrative examples of the monocycloalkene ring include a cyclobutene ring, a cyclopentene ring, a cyclohexene ring, a cycloheptene ring, a cyclooctene ring, a cyclopentadiene ring, and a cyclohexadiene ring.

Illustrative examples of the "substituent group" in the monocycloalkane ring and the monocycloalkene ring are the same as the "substituent group" previously mentioned in the cycloalkane ring, the benzene ring, and the naphthalene ring.

The ring B represents a monocycloalkane ring optionally having a substituent group, or a monocycloalkene ring optionally having a substituent group. The ring B is preferably a monocycloalkane ring which may be optionally substituted with a group selected from an alkyl group and an alkenyl group; or a monocycloalkene ring which may be optionally substituted with a group selected from an alkyl group and an alkenyl group. The ring B is more preferably a monocycloalkane ring which may be optionally substituted with a group selected from an alkyl group having 1 to 14 carbon atoms and an alkenyl group having 2 to 14 carbon atoms; or a monocycloalkene ring which may be optionally substituted with a group selected from an alkyl group having 1 to 14 carbon atoms and an alkenyl group having 2 to 14 carbon atoms.

Each i and each j independently represent 0 or an integer of 1 or more, and the sum of i and j is 6 or more (preferably 8 or more, and more preferably 10 or more). Each i and each j independently represent preferably an integer of 0 to 20, and the sum of i and j is 6 or more (preferably 8 or more, and more preferably 10 or more). Each i and each j independently represent more preferably an integer of 1 to 20 and the sum of i and j is 6 or more (preferably 8 or more, and more preferably 10 or more). Each i and each j independently represent still more preferably an integer of 5 to 10. Each i and each j represent especially preferably 8.

In the third embodiment, the component (B) includes especially preferably a maleimide compound represented by the formula (3):

in the formula, each $R^1$ independently represents a substituent group; each ring C independently represents an aromatic ring optionally having a substituent group; each $D^1$ and each $D^2$ independently represent a single bond, $-C(R^x)_2-$, $-O-$, $-CO-$, $-S-$, $-SO-$, $SO_2-$, $-CONH-$, $-NHCO-$, $-COO-$, or $-OCO-$; each $R^x$ independently represents a hydrogen atom or an alkyl group; each e independently represents 0 or 1; each f independently represents 0 or an integer of 1 or more; each g independently represents 0, 1, or 2; m represents 0 or an integer of 1 or more; and the other symbols represent the same as described before. The f unit, the g unit, and the m unit may be the same or different in each structural unit.

The aromatic ring is the ring that obeys Hückel's rule where the number of electrons in the n-electron system on the ring is 4p+2 (p is a natural number). The aromatic ring may be an aromatic carbon ring having only a carbon atom as the ring constituent atom, or an aromatic heterocyclic ring having a heteroatom such as an oxygen atom, a nitrogen atom, or a sulfur atom in addition to the carbon atom as the ring constituent atom. In one embodiment, an aromatic carbon ring is preferable. In one embodiment, an aromatic ring formed of 5 to 14 members are preferable, an aromatic ring formed of 6 to 14 members are more preferable, and an aromatic ring formed of 6 or 10 members are still more preferable. Specifically, illustrative examples of the aromatic ring include a benzene ring, a naphthalene ring, and an anthracene ring, preferably a benzene ring or a naphthalene ring, and especially preferably a benzene ring.

The "substituent group" in $R^1$ and the "substituent group" in the aromatic ring are the same as those in the cycloalkane ring, the benzene ring, and the naphthalene ring described before.

Each ring C independently represents an aromatic ring optionally having a substituent group, and preferably a benzene ring which may be optionally substituted with a group selected from an alkyl group. Each $D^1$ and each $D^2$ independently represent a single bond, $-C(R^x)_2-$, $-O-$, $-CO-$, $-S-$, $-SO-$, $-SO_2-$, $-CONH-$, $-NHCO-$, $-COO-$, or $-OCO-$; here, a single bond, $-C(R^x)_2-$, or $-O-$ is preferable. Each $R^x$ independently represents a hydrogen atom or an alkyl group, and preferably a hydrogen atom or a methyl group. Each e independently represents 0 or 1, and preferably 0. Each f independently represents 0 or an integer of 1 or more, preferably 0, 1, 2, or 3, and more preferably 0, 1, or 2. Each g independently represents 0, 1 or 2, and preferably 0. Here, m represents 0 or an integer of 1 or more, and preferably 0.

Illustrative examples of a partial structure represented by the formula (D) contained in the formula (3):

(3)

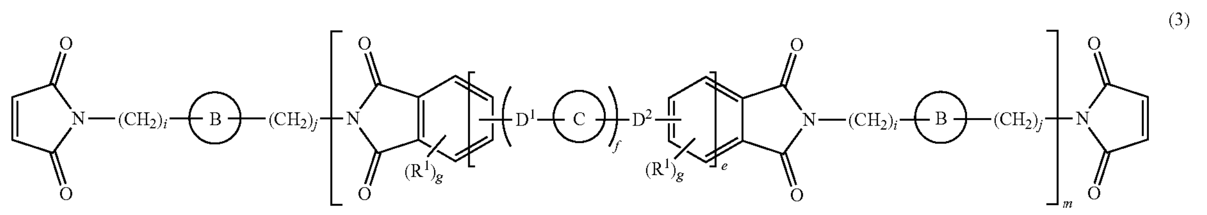

(D)

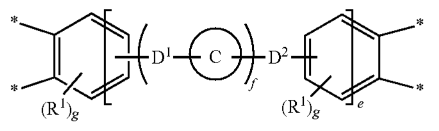

in the formula, * indicates a bonding site; the other symbols are the same as before include, but not particularly limited to, partial structures represented by the formulae (D-1) to (D-3):

(D-1)

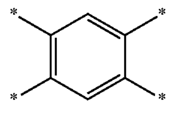

(D-2)

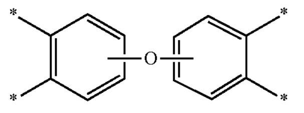

(D-3)

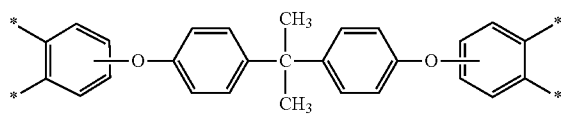

in these formulae, * represents the same as described before.

The radical polymerizable group equivalent of the component (B) in the third embodiment is preferably in the range of 200 g/eq. to 2500 g/eq., more preferably in the range of 250 g/eq. to 2000 g/eq., and still more preferably in the range of 300 g/eq. to 1500 g/eq. The radical polymerizable group equivalent of the component (B) indicates the mass of the resin per one equivalent of the radical polymerizable group.

The weight-average molecular weight of the component (B) in the third embodiment is preferably in the range of 400 to 100000, more preferably in the range of 500 to 7000, and especially preferably in the range of 600 to 5000.

Illustrative examples of the commercially available product of the component (B) in the third embodiment include "BMI-689", "BMI-1500", "BMI-1700", and "BMI-3000J", all being manufactured by Molecular Designer Molecules Inc.; and "SLK-6895-T90" manufactured by Shin-Etsu Chemical Co., Ltd.

In a fourth embodiment, the component (B) includes preferably a maleimide compound represented by the formula (4):

(4)

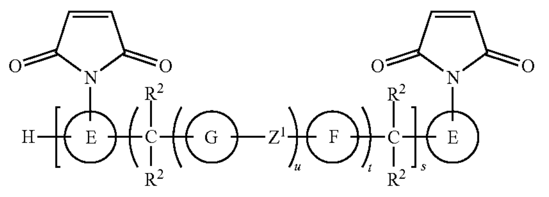

in the formula, each $R^2$ independently represents a hydrogen atom or an alkyl group; each ring E, each ring F, and each ring G independently represent an aromatic ring optionally having a substituent group; each $Z^1$ independently represents a single bond, —$C(R^z)_2$—, —O—, —CO—, —S—, —SO—, —$SO_2$—, —CONH—, or —NHCO—; each $R^z$ independently represents a hydrogen atom or an alkyl group; s represents an integer of 1 or more; each t independently represents 0 or 1; and each u independently represents 0, 1, 2, or 3. The s unit and the u unit may be the same or different in each structural unit. The maleimide compound in the fourth embodiment may be used singly or as a combination of two or more in an arbitrary ratio.

Each $R^2$ independently represents a hydrogen atom or an alkyl group, preferably a hydrogen atom or a methyl group, and more preferably a hydrogen atom. Each ring E, each ring F, and each ring G independently represent an aromatic ring optionally having a substituent group, preferably a benzene ring optionally having a substituent group, more preferably a benzene ring which may be substituted with a group selected from an alkyl group and an aryl group, and especially preferably a (unsubstituted) benzene ring.

Each $Z^1$ independently represents preferably a single bond, —$C(R^z)_2$—, —O—, —CO—, —S—, —SO—, —$SO_2$—, —CONH—, or —NHCO—, more preferably a single bond, —$C(R^z)_2$—, or —O—, still more preferably a single bond or —$C(R^z)_2$—, and especially preferably a single bond. Each $R^z$ independently represents a hydrogen atom or an alkyl group, preferably a hydrogen atom or a methyl group.

Here, s represents an integer of 1 or more, and preferably an integer of 1 to 10. Each t independently represents 0 or 1, and preferably 1. Each u independently represents 0, 1, 2, or 3, preferably 0, 1, or 2, more preferably 0 or 1, and especially preferably 1.

The radical polymerizable group equivalent of the component (B) in the fourth embodiment is preferably in the range of 150 g/eq. to 1000 g/eq. and more preferably in the range of 200 g/eq. to 500 g/eq.

The weight-average molecular weight of the component (B) in the fourth embodiment is preferably in the range of 100 to 10000, more preferably in the range of 150 to 5000, and especially preferably in the range of 200 to 3000.

Illustrative examples of the commercial products of the component (B) in the fourth embodiment include "MIR-3000-70MT" and "MIR-5000-60T", both being manufactured by Nippon Kayaku Co., Ltd.

The component (B) may include preferable thermoplastic resins in the first embodiment, preferable compounds in the second embodiment, preferable maleimide compounds in the third embodiment, and preferable maleimide compounds in the fourth embodiment, either singly, or as a combination of two or more of these compounds in an arbitrary ratio.

The radical polymerizable group equivalent of the component (B) is preferably in the range of 30 g/eq. to 2500 g/eq. and especially preferably in the range of 75 g/eq. to 2000 g/eq.

There is no particular restriction in the content of the component (B) in the resin composition; here, the content thereof relative to 100% by mass of the nonvolatile components in the resin composition is preferably 60% by mass or less, more preferably 50% by mass or less, still more preferably 40% by mass or less, far still more preferably 30% by mass or less, and especially preferably 20% by mass or less. Although there is no particular restriction in the lower limit of the content of the component (B) in the resin composition, the content thereof relative to 100% by mass of the nonvolatile components in the resin composition is preferably 0.01% by mass or more, more preferably 0.1% by mass or more, still more preferably 0.5% by mass or more, far still more preferably 1% by mass or more, and especially preferably 2% by mass or more.

(C) Thermosetting Resin

It is preferable that the resin composition according to the present invention contain (C) a thermosetting resin. Illustrative examples of (C) the thermosetting resin include an epoxy resin, an epoxy acrylate resin, a urethane acrylate resin, a urethane resin, a cyanate resin, a polyimide resin, a benzoxazine resin, an unsaturated polyester resin, a phenol resin, a melamine resin, and a silicone resin, in which a curing agent or the like that has a function of curing these resins by reacting with them may also be included (for example, an epoxy resin curing agent).

Although the content of (C) the thermosetting resin in the resin composition is not particularly restricted, the content thereof relative to 100% by mass of the nonvolatile components in the resin composition is preferably 50% by mass or less, more preferably 40% by mass or less, still more preferably 30% by mass or less, and especially preferably 25% by mass or less. The lower limit of the content of (C) the thermosetting resin in the resin composition relative to 100% by mass of the nonvolatile components in the resin composition is, for example, preferably 0% by mass or more, more preferably 0.1% by mass or more, still more preferably 1% by mass or more, far still more preferably 10% by mass or more, and especially preferably 20% by mass or less.

(C1) Epoxy Resin

It is preferable that the resin composition according to the present invention include, as (C) the thermosetting resin, (C1) an epoxy resin. (C1) The epoxy resin is the curable resin having an epoxy group with an epoxy equivalent of 5,000 g/eq. or less. (C1) The epoxy resin described here is the component other than those falling under a component (F) to be described later.

Illustrative examples of (C1) the epoxy resin include a bixylenol type epoxy resin, a bisphenol A type epoxy resin, a bisphenol F type epoxy resin, a bisphenol S type epoxy resin, a bisphenol AF type epoxy resin, a dicyclopentadiene type epoxy resin, a trisphenol type epoxy resin, a naphthol novolac type epoxy resin, a phenol novolac type epoxy resin, a tert-butyl-catechol type epoxy resin, a naphthalene type epoxy resin, a naphthol type epoxy resin, an anthracene type epoxy resin, a glycidyl amine type epoxy resin, a glycidyl ester type epoxy resin, a cresol novolac type epoxy resin, a phenol aralkyl type epoxy resin, a biphenyl type epoxy resin, a linear aliphatic epoxy resin, an epoxy resin having a butadiene structure, an alicyclic epoxy resin, a heterocyclic epoxy resin, an epoxy resin having a spiro ring, a cyclohexane type epoxy resin, a cyclohexane dimethanol type epoxy resin, a naphthylene ether type epoxy resin, a trimethylol type epoxy resin, a tetraphenylethane type epoxy resin, an isocyanurate type epoxy resin, and a phenolphthalimidine type epoxy resin. (C1) The epoxy resin may be used singly or as a combination of two or more.

It is preferable that the resin composition according to the present invention include, as (C1) the epoxy resin, the epoxy resin having two or more epoxy groups in one molecule thereof. The ratio of the epoxy resin having two or more epoxy groups in one molecule thereof to 100% by mass of nonvolatile components in (C1) the epoxy resin is preferably 50% by mass or more, more preferably 60% by mass or more, and especially preferably 70% by mass or more.

In the epoxy resin, there are an epoxy resin that is in the state of liquid at 20° C. (hereinafter, this is sometimes referred to as "liquid epoxy resin") and an epoxy resin that is in the state of solid at 20° C. (hereinafter, this is sometimes referred to as "solid epoxy resin"). The resin composition according to the present invention may include, as the epoxy resin, only the liquid epoxy resin, or only the solid epoxy resin, or both the liquid epoxy resin and the solid epoxy resin; but it is especially preferable to include both the liquid epoxy resin and the solid epoxy resin.

As for the liquid epoxy resin, the liquid epoxy resin having two or more epoxy groups in one molecule thereof is preferable.

The liquid epoxy resin is preferably a glycyrol type epoxy resin, a bisphenol A type epoxy resin, a bisphenol F type epoxy resin, a bisphenol AF type epoxy resin, a naphthalene type epoxy resin, a glycidyl ester type epoxy resin, a glycidyl amine type epoxy resin, a phenol novolac type epoxy resin, an alicyclic epoxy resin having an ester skeleton, a cyclohexane dimethanol type epoxy resin, a cyclic aliphatic glycidyl ether, and an epoxy resin having a butadiene structure.

Specifically, illustrative examples of the liquid epoxy resin include "EX-992L" manufactured by Nagase ChemteX Corp.; "YX7400" manufactured by Mitsubishi Chemical Corp., "HP4032", "HP4032D", and "HP4032SS" (these are naphthalene type epoxy resins), all being manufactured by DIC Corp.; "828US", "828EL", "825", and "Epikote 828EL" (these are bisphenol A type epoxy resins), all being manufactured by Mitsubishi Chemical Corp.; "jER807" and "1750" (both are bisphenol F type epoxy resins), both being manufactured by Mitsubishi Chemical Corp.; "jER152" (a phenol novolac type epoxy resin) manufactured by Mitsubishi Chemical Corp.; "630", "630LSD", and "604" (these are glycidyl amine type epoxy resins), all being manufactured by Mitsubishi Chemical Corp.; "ED-523T" (a glycyrol type epoxy resin) manufactured by Adeka Corp.; "EP-3950L" and "EP-3980S" (both are glycidylamine type epoxy resins), both being manufactured by Adeka Corp.; "EP-4088S" (a dicyclopentadiene type epoxy resin) manufactured by Adeka Corp.; "ZX1059" (a mixture of a bisphenol A type epoxy resin and a bisphenol F type epoxy resin) manufactured by Nippon Steel Chemical & Material Co., Ltd.; "EX-721" (a glycidyl ester type epoxy resin) manufactured by Nagase ChemteX Corp.; "EX-991L" (an epoxy resin containing an alkyleneoxy skeleton and a butadiene skeleton) manufactured by Nagase ChemteX Corp.; "Celloxide 2021P" (an alicyclic epoxy resin having an ester skeleton) manufactured by Daicel Corp.; "ZX1658" and "ZX1658GS" (liquid 1,4-glycidylcyclohexane type epoxy resins), both being manufactured by Nippon Steel Chemical & Material Co., Ltd.; "EG-280" (an epoxy resin having a fluorene structure) manufactured by Osaka Gas Chemicals Co., Ltd., and "EX-201" (a cyclic aliphatic glycidyl ether) manufactured by Nagase ChemteX Corp.

As for the solid epoxy resin, a solid epoxy resin having three or more epoxy groups in one molecule thereof is preferable, and an aromatic solid epoxy resin having three or more epoxy groups in one molecule thereof is more preferable.

The solid epoxy resin is preferably a bixylenol type epoxy resin, a naphthalene type epoxy resin, a naphthalene tetrafunctional type epoxy resin, a naphthol novolac type epoxy resin, a cresol novolac type epoxy resin, a dicyclopentadiene type epoxy resin, a trisphenol type epoxy resin, a naphthol type epoxy resin, a biphenyl type epoxy resin, a naphthylene ether type epoxy resin, an anthracene type epoxy resin, a bisphenol A type epoxy resin, a bisphenol AF type epoxy resin, a phenol aralkyl type epoxy resin, a tetraphenylethane type epoxy resin, and a phenol phthalimidine type epoxy resin.

Specifically, illustrative examples of the solid epoxy resin include "HP4032H" (a naphthalene type epoxy resin) manufactured by DIC Corp.; "HP-4700" and "HP-4710" (naphthalene tetrafunctional type epoxy resins), both being manufactured by DIC Corp.; "N—690" (a cresol novolac type epoxy resin) manufactured by DIC Corp.; "N—695" (a cresol novolac type epoxy resin) manufactured by DIC Corp.; "HP-7200", "HP-7200HH", "HP-7200H", and "HP-7200L" (dicyclopentadiene type epoxy resins), all being manufactured by DIC Corp.; "EXA-7311", "EXA-7311-G3", "EXA-7311-G4", "EXA-7311-G4S", "HP6000", and "HP6000L" (naphthylene ether type epoxy resins), all being manufactured by DIC Corp.; "EPPN-502H" (a trisphenol type epoxy resin) manufactured by Nippon Kayaku Co., Ltd.; "NC7000L" (a naphthol novolac type epoxy resin) manufactured by Nippon Kayaku Co., Ltd.; "NC3000H", "NC3000", "NC3000L", "NC3000FH", and "NC3100" (biphenyl type epoxy resins), all being manufactured by Nippon Kayaku Co., Ltd.; "ESN475V" and "ESN4100V" (naphthalene type epoxy resins), both being manufactured by Nippon Steel Chemical & Materials Co., Ltd.; "ESN485" (a naphthol type epoxy resin) manufactured by Nippon Steel Chemical & Materials Co., Ltd.; "ESN375" (a dihydroxynaphthalene type epoxy resin) manufactured by Nippon Steel Chemical & Materials Co., Ltd.; "YX4000H", "YX4000", "YX4000HK", and "YL7890" (bixylenol type epoxy resins), all being manufactured by Mitsubishi Chemical Corp.; "YL6121" (a biphenyl type epoxy resin) manufactured by Mitsubishi Chemical Corp.; "YX8800" (an anthracene type epoxy resin) manufactured by Mitsubishi Chemical Corp.; "YX7700" (a phenol aralkyl type epoxy resin) manufactured by Mitsubishi Chemical Corp.; "PG-100" and "CG-500", both being manufactured by Osaka Gas Chemicals Co., Ltd.; "YX7760" (a bisphenol AF type epoxy resin) manufactured by Mitsubishi Chemical Corp.; "YL7800" (a fluorene type epoxy resin) manufactured by Mitsubishi Chemical Corp.; "jER1010" (a bisphenol A type epoxy resin) manufactured by Mitsubishi Chemical Corp.; "jER1031S" (a tetraphenylethane type epoxy resin) manufactured by Mitsubishi Chemical Corp.; and "WHR991S" (a phenol phthalimidine type epoxy resin) manufactured by Nippon Kayaku Co., Ltd. The epoxy resin may be used singly or as a combination of two or more.

When a combination of the liquid epoxy resin and the solid epoxy resin is used as (C1) the epoxy resin, the mass ratio of them (solid epoxy resin:liquid epoxy resin) is preferably in the range of 10:1 to 1:50, more preferably in the range of 5:1 to 1:20, and especially preferably in the range of 2:1 to 1:10.

The epoxy equivalent of (C1) the epoxy resin is preferably in the range of 50 g/eq. to 5,000 g/eq., more preferably in the range of 60 g/eq. to 2,000 g/eq., still more preferably in the range of 70 g/eq. to 1,000 g/eq., and far still more preferably in the range of 80 g/eq. to 500 g/eq. The epoxy equivalent is the mass of the resin per one equivalent of the epoxy group. The epoxy equivalent may be measured by the method in accordance with JIS K7236.

The weight-average molecular weight (Mw) of (C1) the epoxy resin is preferably in the range of 100 to 5,000, more preferably in the range of 250 to 3,000, and still more preferably in the range of 400 to 1,500. The weight-average molecular weight of the resin may be measured in terms of polystyrene by a gel permeation chromatography (GPC) method.

Although the content of (C1) the epoxy resin in the resin composition is not particularly restricted, the content thereof relative to 100% by mass of the nonvolatile components in the resin composition is preferably 40% by mass or less, more preferably 30% by mass or less, still more preferably 25% by mass or less, far still more preferably 20% by mass or less, and especially preferably 15% by mass or less. Although the lower limit of the content of (C1) the epoxy resin in the resin composition is not particularly restricted, the content thereof relative to 100% by mass of the nonvolatile components in the resin composition is, for example, 0% by mass or more, preferably 0.1% by mass or more, more preferably 0.5% by mass or more, still more preferably 1% by mass or more, far still more preferably 5% by mass or more, and especially preferably 10% by mass or more.

(C2) Epoxy Resin Curing Agent

When the resin composition according to the present invention includes (C1) as (C) the thermosetting resin, the resin composition may further include (C2) an epoxy resin curing agent as an arbitrary component. (C2) The epoxy resin curing agent may be used singly or as an arbitrary combination of two or more. (C2) The epoxy resin curing agent can have the function of curing (C1) the epoxy resin by reacting with it when (C1) the epoxy resin is included as (C) the thermosetting resin. (C2) The epoxy resin curing agent described here is other than those falling under (A) and (A') components described before and the component (F) to be described later.

Although (C2) the epoxy resin curing agent is not particularly restricted, illustrative examples thereof include an active ester type curing agent, a phenol type curing agent, an acid anhydride type curing agent, an amine type curing agent, a benzoxazine type curing agent, a cyanate ester type curing agent, and a thiol type curing agent. In the resin composition according to the present invention, in one embodiment, (C2) the epoxy resin curing agent ((C) component) includes preferably one or more epoxy resin curing agents selected from an active ester type curing agent, a phenol type curing agent, and a cyanate ester type curing agent, and more preferably one or more epoxy resin curing agent selected from an active ester type curing agent and a phenol type curing agent. In one embodiment, from the viewpoint of further decreasing the dielectric dissipation factor, (C2) the epoxy resin curing agent ((C) component) is especially preferable to include an active ester type curing agent. In addition, in one embodiment, from the viewpoint of further improving curability, (C2) the epoxy resin curing agent ((C) component) is especially preferable to include a phenolic type curing agent.

In general, as for the active ester type curing agent, a compound having two or more ester groups having a high reactivity in one molecule, such as a phenol ester, a thiophenol ester, a N-hydroxylamine ester, and an ester of a heterocyclic hydroxy compound, is preferably used. The active ester compound is preferably the compound that is obtained by condensation reaction of a carboxylic acid compound and/or a thiocarboxylic acid compound with a hydroxy compound and/or a thiol compound. Especially, in view of enhancing the heat resistance, an active ester compound obtained from a carboxylic acid compound and a hydroxy compound is preferable, and an active ester compound obtained from a carboxylic acid compound and a phenol compound and/or a naphthol compound is more preferable. Illustrative examples of the carboxylic acid compound include benzoic acid, acetic acid, succinic acid, maleic acid, itaconic acid, phthalic acid, isophthalic acid, terephthalic acid, and pyromellitic acid. Illustrative examples of the phenol compound or the naphthol compound include hydroquinone, resorcin, bisphenol A, bisphenol F, bisphenol S, phenolphthalin, methylated bisphenol A, methylated bisphenol F, methylated bisphenol S, phenol, o-cresol, m-cresol, p-cresol, catechol, α-naphthol, β-naphthol, 1,5-dihydroxy naphthalene, 1,6-dihydroxy naphthalene, 2,6-dihydroxy naphthalene, dihydroxy benzophenone, trihydroxy benzophenone, tetrahydroxy benzophenone, phloroglucin, benzene triol, a dicyclopentadiene type diphenol compound, and phenol novolac. Here, the "dicyclopentadiene type diphenol compound" means a diphenol compound obtained by condensation of one dicyclopentadiene molecule with two phenol molecules.

Specifically, as for the active ester type curing agent, preferable are a dicyclopentadiene type active ester compound, a naphthalene type active ester compound containing a naphthalene structure, an active ester compound containing an acetylated phenol novolac, and an active ester compound containing a benzoylated phenol novolac. In particular, more preferable is at least one type selected from a dicyclopentadiene type active ester compound and a naphthalene type active ester compound. As for the dicyclopentadiene type active ester compound, an active ester compound containing a dicyclopentadiene type diphenol structure is preferable.

Illustrative examples of the commercially available product of the active ester type curing agent include: as the active ester compound containing a dicyclopentadiene type diphenol structure, "EXB9451", "EXB9460", "EXB9460S", "HPC-8000L-65TM", "HPC-8000-65T", "HPC-8000H", and "HPC-8000H-65TM", all being manufactured by DIC Corp.; as the active ester compound containing a naphthalene structure, "HP-B-8151-62T", "EXB-8100L-65T", "EXB-9416-70BK", "HPC-8150-62T", and "EXB-8", all being manufactured by DIC Corp.; as the active ester compound containing phosphorous, "EXB9401" manufactured by DIC Corp.; as the active ester compound containing an acetylated phenol novolac, "DC808" manufactured by Mitsubishi Chemical Corp.; as the active ester compound containing a benzoylated phenol novolac, "YLH1026", "YLH1030", and "YLH1048", all being manufactured by Mitsubishi Chemical Corp.; and as the active ester compound containing a styryl group and a naphthalene structure, "PC1300-02-65MA" manufactured by Air Water Inc.

As for the phenol type curing agent, in view of the heat resistance and the water resistance, a phenol type curing agent having a novolac structure is preferable. In view of the adhesion property to a material to be adhered, a nitrogen-containing phenol type resin is preferable, and a phenol type curing agent having a triazine skeleton is more preferable. In particular, in view of highly satisfying the heat resistance, the water resistance, and the adhesion property, a phenol novolac resin having a triazine skeleton is preferable. Specifically, illustrative examples of the phenol type curing agent include "MEH-7700", "MEH-7810", and "MEH-7851", all being manufactured by Meiwa Plastic Industries, Ltd.; "NHN", "CBN", and "GPH", all being manufactured by Nippon Kayaku Co., Ltd.; "SN-170", "SN-180", "SN-190", "SN-475", "SN-485", "SN-495", "SN-375", and "SN-395", all being manufactured by Nippon Steel Chemical & Material Co., Ltd.; and "LA-7052", "LA-7054", "LA-3018", "LA-3018-50P", "LA-1356", "TD2090", and "KA-1160", all being manufactured by DIC Corp.

As for the acid anhydride type curing agent, the curing agent that has one or more acid anhydride groups in one molecule may be used, in which the curing agent that has two or more acid anhydride groups in one molecule is preferable. Specifically, illustrative examples of the acid anhydride type curing agent include phthalic anhydride, tetrahydrophthalic anhydride, hexahydrophthalic anhydride, methyl tetrahydrophthalic anhydride, methyl hexahydrophthalic anhydride, methylnadic anhydride, hydrogenated methylnadic anhydride, trialkyl tetrahydrophthalic anhydride, dodecenyl succinic anhydride, 5-(2,5-dioxotetrahydro-3-furanyl)-3-methyl-3-cyclohexene-1,2-dicarboxylic anhydride, trimellitic anhydride, pyromellitic anhydride, benzophenone tetracarboxylic dianhydride, biphenyl tetracarboxylic dianhydride, naphthalene tetracarboxylic dianhydride, oxydiphthalic dianhydride, 3,3'-4,4'-diphenylsulfone tetracarboxylic dianhydride, 1,3,3a,4,5,9b-hexahydro-5-(tetrahydro-2,5-dioxo-3-furanyl)-naphto[1,2-C]furan-1,3-dione, ethylene glycol bis(anhydrotrimellitate), and a polymer type acid anhydride such as a styrene-maleic acid resin, which is a copolymer of styrene and maleic acid. Illustrative examples of the commercially available product of the acid anhydride type curing agent include "HNA-100", "MH-700", "MTA-15", "DDSA", and "OSA", all being manufactured by New Japan Chemical Co., Ltd.; "YH-306" and "YH-307", both being manufactured by Mitsubishi Chemical Corp.; "HN-2200" and "HN-5500", both being manufactured by Hitachi Chemical Co., Ltd.; and "EF-30", "EF-40, "EF-60", and "EF-80", all being manufactured by Cray Valley S.A.

As for the amine type curing agent, the curing agent having one or more amino groups, preferably two or more amino groups, in one molecule is mentioned. Illustrative examples thereof include an aliphatic amine, a polyether amine, an alicyclic amine, and an aromatic amine; among them, from the viewpoint of obtaining the intended effects of the present invention, an aromatic amine is preferable. As for the amine type curing agent, a primary amine or a secondary amine is preferable, and a primary amine is more preferable. Specifically, illustrative examples of the amine type curing agent include 4,4'-methylenebis(2,6-dimethylaniline), 4,4'-diaminodiphenylmethane, 4,4'-diaminodiphenyl sulfone, 3,3'-diaminodiphenyl sulfone, m-phenylenediamine, m-xylylenediamine, diethyltoluenediamine, 4,4'-diaminodiphenyl ether, 3,3'-dimethyl-4,4'-diaminobiphenyl, 2,2'-dimethyl-4,4'-diaminobiphenyl, 3,3'-dihydroxybenzidine, 2,2-bis(3-amino-4-hydroxyphenyl)propane, 3,3-dimethyl-5,5-diethyl-4,4-diphenylmethanediamine, 2,2-bis(4-aminophenyl)propane, 2,2-bis(4-(4-aminophenoxy)phenyl) propane, 1,3-bis(3-aminophenoxy)benzene, 1,3-bis(4-aminophenoxy)benzene, 1,4-bis(4-aminophenoxy)benzene, 4,4'-bis(4-aminophenoxy)biphenyl, bis(4-(4-aminophenoxy)phenyl) sulfone, and bis(4-(3-aminophenoxy)phenyl) sulfone. Commercially available amine type curing agents may be used; illustrative examples thereof include "SEIKACURE-S" manufactured by Seika Corp.; "KAYABOND C-200S", "KAYABOND C-100", "KAYAHARD A-A", "KAYAHARD A-B", and "KAYAHARD A-S", all being manufactured by Nippon Kayaku Co., Ltd.; and "Epicure W" manufactured by Mitsubishi Chemical Corp.

Specifically, illustrative examples of the benzoxazine type curing agent include "JBZ-OP100D" and "ODA-BOZ", both being manufactured by JFE Chemical Corp.; "HFB2006M" manufactured by Showa Highpolymer Co., Ltd.; and "P-d" and "F-a", both being manufactured by Shikoku Chemicals Corp.

Illustrative examples of the cyanate ester type curing agent include bifunctional cyanate resins such as bisphenol A dicyanate, polyphenol cyanate (oligo(3-methylene-1,5-phenylenecyanate)), 4,4'-methylenebis(2,6-dimethylphenylcyanate), 4,4'-ethylidene diphenyl dicyanate, hexafluorobisphenol A dicyanate, 2,2-bis(4-cyanate)phenylpropane, 1,1-bis(4-cyanatephenylmethane), bis(4-cyanate-3,5- dimethylphenyl)methane, 1,3-bis(4-cyanatephenyl-1-(methylethylidene))benzene, bis(4-cyanatephenyl) thioether, and bis(4-cyanatephenyl) ether; polyfunctional cyanate resins derived from a phenol novolac, a cresol novolac, and the like; and a prepolymer in which these cyanate resins are partially made to triazine. Specifically, illustrative examples of the cyanate ester type curing agent include "PT30" and "PT60" (both are phenol novolac type polyfunctional cyanate ester resins); "BA230" and "BA230S75" (both are prepolymers in which part or all of bisphenol A dicyanate is made to triazine so as to be a trimer); all of these being manufactured by Lonza K.K.

Illustrative examples of the thiol type curing agent include trimethylolpropane tris(3-mercaptopropionate), pentaerythritol tetrakis(3-mercaptobutyrate), and tris(3-mercaptopropyl) isocyanurate.

The reactive group equivalent of (C2) the epoxy resin curing agent is preferably in the range of 50 g/eq. to 3000 g/eq., more preferably in the range of 100 g/eq. to 1000 g/eq., still more preferably in the range of 100 g/eq. to 500 g/eq., and especially preferably in the range of 100 g/eq. to 300 g/eq. The reactive group equivalent is the mass of (C2) the epoxy resin curing agent per one equivalent of the reactive group.

When the active ester type curing agent is included as (C2) the epoxy resin curing agent, from the viewpoint of further decreasing the dielectric dissipation factor, the content of the active ester type curing agent relative to 100% by mass of the nonvolatile components in the resin composition is preferably 1% by mass or more, more preferably 3% by mass or more, still more preferably 5% by mass or more, and especially preferably 6.5% by mass or more. From the viewpoint of further decreasing the dielectric dissipation factor, the content of the active ester type curing agent in the resin composition relative to 100% by mass of (C2) the epoxy resin curing agent in the resin composition is preferably 10% by mass or more, more preferably 30% by mass or more, still more preferably 40% by mass or more, and especially preferably 50% by mass or more.

When the phenol type curing agent is included as (C2) the epoxy resin curing agent, from the viewpoint of further enhancing the curability, the content of the phenol type curing agent in the resin composition relative to 100% by mass of the nonvolatile components in the resin composition is preferably 0.5% by mass or more, more preferably 1% by mass or more, and especially preferably 1.5% by mass or more.

Although the content of (C2) the epoxy resin curing agent in the resin composition is not particularly restricted, the content thereof relative to 100% by mass of the nonvolatile components in the resin composition is preferably 30% by mass or less, more preferably 20% by mass or less, still more preferably 15% by mass or less, and especially preferably 10% by mass or less. Although the lower limit of the content of (C2) the epoxy resin curing agent in the resin composition is not particularly restricted, the content thereof relative to 100% by mass of the nonvolatile components in the resin composition may be, for example, 0% by mass or more, 0.01%, by mass or more, preferably 0.1% by mass or more, more preferably 1% by mass or more, still more preferably 3% by mass or more, and especially preferably 5% by mass or more.

(D) Inorganic Filler

The resin composition according to the present invention may further include (D) an inorganic filler as an optional component. (D) The inorganic filler is included in the resin composition in the form of a particle.

An inorganic compound is used as the material of (D) the inorganic filler. Illustrative examples of the material of (D) the inorganic filler include silica, alumina, glass, cordierite, silicon oxide, barium sulfate, barium carbonate, talc, clay, mica powder, zinc oxide, hydrotalcite, boehmite, aluminum hydroxide, magnesium hydroxide, calcium carbonate, magnesium carbonate, magnesium oxide, boron nitride, aluminum nitride, manganese nitride, aluminum borate, strontium carbonate, strontium titanate, calcium titanate, magnesium titanate, bismuth titanate, titanium oxide, zirconium oxide, barium titanate, barium titanate zirconate, barium zirconate, calcium zirconate, zirconium phosphate, and zirconium phosphate tungstate. Among these, silica is especially preferable. Illustrative examples of the silica include amorphous silica, fused silica, crystalline silica, synthesized silica, and hollow silica. Spherical silica is preferable as the silica. (D) The inorganic filler may be used singly or as a combination of two or more in an arbitrary ratio.

Illustrative examples of the commercially available product of (D) the inorganic filler include: "SP60-05" and "SP507-05", both being manufactured by Nippon Steel Chemical & Material Co., Ltd.; "YC100C", "YA050C", "YA050C-MJE", and "YA010C", all being manufactured by Admatechs Co., Ltd.; "UFP-30" manufactured by Denka Company Limited.; "Silfil NSS-3N", "Silfil NSS-4N", and "Silfil NSS-5N", all being manufactured by Tokuyama Corp.; "SC2500SQ", "SO-C4", "SO-C2", and "SO-C1", all being manufactured by Admatechs Co., Ltd; and "DAW-03" and "FB-105FD", both being manufactured by Denka Company Limited.

Although the average particle diameter of (D) the inorganic filler is not particularly restricted, the average particle diameter thereof is preferably 10 μm or less, more preferably 5 μm or less, still more preferably 2 μm or less, far still more preferably 1 μm or less, and especially preferably 0.7 μm or less. Although the lower limit of the average particle diameter of (D) the inorganic filler is not particularly restricted, this is preferably 0.01 μm or more, more preferably 0.05 μm or more, still more preferably 0.1 μm or more, and especially preferably 0.2 μm or more. The average particle diameter of (D) the inorganic filler may be measured with a laser diffraction scattering method based on the Mie scattering theory. Specifically, the particle diameter distribution of the inorganic filler on the volume basis is prepared using a laser diffraction scattering type particle diameter distribution measurement apparatus, and the average particle diameter thereof can be measured from the median diameter thus obtained. The measurement sample to be used for this can be obtained by weighing 100 mg of the inorganic filler and 10 g of methyl ethyl ketone into a vial bottle, followed by dispersing this mixture for 10 minutes by means of an ultrasonic wave. The particle diameter distribution of the measurement sample of the inorganic filler on the volume basis was measured with a flow cell method using the light source wavelengths of blue and red by means of the laser diffraction type particle diameter distribution measurement apparatus; then, the average particle diameter thereof was calculated as the median diameter from the particle diameter distribution thus obtained. Illustrative examples of the laser diffraction type particle diameter distribution measurement apparatus include "LA-960" manufactured by Horiba, Ltd.

Although the specific surface area of (D) the inorganic filler is not particularly restricted, it is preferably 0.1 $m^2/g$ or more, more preferably 0.5 $m^2/g$ or more, still more preferably 1 $m^2/g$ or more, and especially 3 $m^2/g$ or more. Although the upper limit of the specific surface area of (D) the inorganic filler is not particularly limited, it is preferably 100 $m^2/g$ or less, more preferably 70 $m^2/g$ or less, still more preferably 50 $m^2/g$ or less, and particularly preferably 40 $m^2/g$ or less. The specific surface area of the inorganic filler may be calculated by means of a BET multipoint method, in which a nitrogen gas is adsorbed onto the sample surface in accordance with a BET method using a specific surface area measurement apparatus (Macsorb HM-1210, manufactured by Mountech Co., Ltd.).

From the viewpoint of improving moisture resistance and dispersibility, it is preferable that (D) the inorganic filler be treated by a surface treatment agent. Illustrative examples of the surface treatment agent include a fluorine-containing silane coupling agent, an aminosilane type coupling agent, an epoxy silane type coupling agent, a mercapto silane type coupling agent, a silane type coupling agent, an alkoxy silane, an organosilazane compound, and a titanate type coupling agent. These surface treatment agents may be used singly or as an arbitrary combination of two or more of the agents described above.

Illustrative examples of the commercially available product of the surface treatment agent include "KBM403" (3-glycidoxypropyl trimethoxysilane) manufactured by Shin-Etsu Chemical Co., Ltd., "KBM803" (3-mercaptopropyl trimethoxysilane) manufactured by Shin-Etsu Chemical Co., Ltd., "KBE903" (3-aminopropyl triethoxysilane) manufactured by Shin-Etsu Chemical Co., Ltd., "KBM573" (N-phenyl-3-aminopropyl trimethoxysilane) manufactured by Shin-Etsu Chemical Co., Ltd., "SZ-31" (hexamethyl disilazane) manufactured by Shin-Etsu Chemical Co., Ltd., "KBM103" (phenyl trimethoxysilane) manufactured by Shin-Etsu Chemical Co., Ltd., "KBM-4803" (a long chain epoxy type silane coupling agent) manufactured by Shin-Etsu Chemical Co., Ltd., and "KBM-7103" (3,3,3-trifluoropropyl trimethoxysilane) manufactured by Shin-Etsu Chemical Co., Ltd.

From the viewpoint of enhancing a dispersion property of the inorganic filler, the degree of the surface treatment by means of the surface treatment agent is preferably within a prescribed range. Specifically, the inorganic filler is surface-treated by a surface treatment agent with the amount thereof preferably in the range of 0.2 to 5% by mass, more preferably in the range of 0.2 to 3% by mass, and still more preferably in the range of 0.3 to 2% by mass, relative to 100% by mass of the inorganic filler.

The degree of the surface treatment by the surface treatment agent may be evaluated by the carbon amount per unit surface area of the inorganic filler. In view of enhancing the dispersion property of the inorganic filler, the carbon amount per unit surface area of the inorganic filler is preferably 0.02 $mg/m^2$ or more, more preferably 0.1 $mg/m^2$ or more, and still more preferably 0.2 $mg/m^2$ or more. On the other hand, in view of prevention of the increase in the melt viscosity of the resin composition and in the melt viscosity in the sheet form thereof, the carbon amount is preferably 1.0 $mg/m^2$ or less, more preferably 0.8 $mg/m^2$ or less, and still more preferably 0.5 $mg/m^2$ or less.

The carbon amount per unit surface area of (D) the inorganic filler may be measured after the inorganic filler whose surface has been treated is cleaned by a solvent (for example, methyl ethyl ketone (MEK)). Specifically, after a sufficient amount of MEK as the solvent is added to the inorganic filler whose surface has been treated with a surface treatment agent, this is cleaned by means of an ultrasonic wave at 25° C. for 5 minutes. The supernatant solution thereof is removed; and then, after the solid component is dried, the carbon amount per unit surface area of the inorganic filler may be measured using a carbon analysis apparatus. The carbon analysis apparatus such as "EMIA-320V" manufactured by Horiba, Ltd., and the like may be used.

The content of (D) the inorganic filler in the resin composition is not particularly restricted, but the content thereof relative to 100% by mass of the nonvolatile components in the resin composition may be preferably 90% by mass or less, more preferably 85% by mass or less, still more preferably 80% by mass or less, and especially preferably 75% by mass or less. The lower limit of the content of (D) the inorganic filler in the resin composition is not particularly restricted, but the content thereof relative to 100% by mass of the nonvolatile components in the resin composition may be, for example, 0% by mass or more, 1% by mass or more, 10% by mass or more, and 20% by mass or more, and preferably 30% by mass or more, more preferably 40% by mass or more, still more preferably 50% by mass or more, far still more preferably 55% by mass or more, and especially preferably 60% by mass or more or 65% by mass or more.

(E) Thermoplastic Resin

The resin composition according to the present invention may further include (E) a thermoplastic resin as an arbitrary component. (E) The thermoplastic resin described here is the component other than those falling under the (A) through (C) components described above and the (F) component to be described later.

Illustrative examples of (E) the thermoplastic resin include a polyimide resin, a phenoxy resin, a polyvinyl acetal resin, a polyolefin resin, a polybutadiene resin, a polyamide imide resin, a polyether imide resin, a polysulfone resin, a polyether sulfone resin, a polyphenylene ether resin, a polycarbonate resin, a polyether ether ketone resin, and a polyester resin. In one embodiment, it is preferable that the resin composition according to the present invention include, as (E) the thermoplastic resin, a thermoplastic resin selected from the group consisting of a polyimide resin and a phenoxy resin; and it is more preferable to include a phenoxy resin. The thermoplastic resin may be used singly or as a combination of two or more.

Specifically, illustrative examples of the polyimide resin include "SLK-6100" manufactured by Shin-Etsu Chemical Co., Ltd.; and "Rikacoat SN20" and "Rikacoat PN20", both being manufactured by New Japan Chemical Co., Ltd.

Illustrative examples of the phenoxy resin include the phenoxy resin having one or more skeletons selected from the group consisting of a bisphenol A skeleton, a bisphenol F skeleton, a bisphenol S skeleton, a bisphenol acetophenone skeleton, a novolac skeleton, a biphenyl skeleton, a fluorene skeleton, a dicyclopentadiene skeleton, a norbornene skeleton, a naphthalene skeleton, an anthracene skeleton, an adamantane skeleton, a terpene skeleton, and a trimethylcyclohexane skeleton. The phenoxy resin may be terminated with any functional group, such as a phenolic hydroxy group or an epoxy group.

Specifically, illustrative examples of the phenoxy resin include "1256" and "4250" (phenoxy resins containing a bisphenol A skeleton), both being manufactured by Mitsubishi Chemical Corp.; "YX8100" (phenoxy resin containing a bisphenol S skeleton) manufactured by Mitsubishi Chemical Corp.; "YX6954" (phenoxy resin containing a bisphenol acetophenone skeleton) manufactured by Mitsubishi Chemical Corp.; "FX280" and "FX293", both being manufactured by Nippon Steel Chemical & Material Co., Ltd.; and "YX7200B35", "YL7500BH30", "YX6954BH30", "YX7553BH30", "YL7769BH30", "YL6794", "YL7213", "YL7290", and "YL7482", all being manufactured by Mitsubishi Chemical Corp.

Illustrative examples of the polyvinyl acetal resin include a polyvinylformal resin and a polyvinyl butyral resin; here, the polyvinyl butyral resin is preferable. Specifically, illustrative examples of the polyvinyl acetal resin include "Denka Butyral 4000-2", "Denka Butyral 5000-A", "Denka Butyral 6000-C", and "Denka Butyral 6000-EP", all being manufactured by Denka Company Limited.; and the S-LEC BH series, the BX series (e.g., BX-5Z), the KS series (e.g., KS-1), the BL series, and the BM series, all being manufactured by Sekisui Chemical Co., Ltd.

Illustrative examples of the polyolefin resin include low-density polyethylene, ultra-low-density polyethylene, high-density polyethylene, ethylene copolymer resins such as an ethylene-vinyl acetate copolymer, an ethylene-ethyl acrylate copolymer, and an ethylene-methyl acrylate copolymer; and polyolefin polymers such as polypropylene and ethylene-propylene block copolymer.

Illustrative examples of the polybutadiene resin include a resin containing a hydrogenated polybutadiene skeleton, a polybutadiene resin containing a hydroxy group, a polybutadiene resin containing a phenolic hydroxy group, a polybutadiene resin containing a carboxy group, a polybutadiene resin containing an acid anhydride group, a polybutadiene resin containing an epoxy group, a polybutadiene resin containing an isocyanate group, a polybutadiene resin containing a urethane group, and a polyphenylene ether-polybutadiene resin.

Specifically, illustrative examples of the polyamide imide resin include "Vylomax HR11NN" and "Vylomax HR16NN", both being manufactured by Toyobo Co., Ltd. Specifically, illustrative examples of the polyamide imide resin also include modified polyamide imides such as "KS9100" and "KS9300" (polyamide imide containing a polysiloxane skeleton), both being manufactured by Hitachi Chemical Co., Ltd.

Specifically, illustrative examples of the polyethersulfone resin include "PES5003P" manufactured by Sumitomo Chemical Company.

Specifically, illustrative examples of the polysulfone resin include polysulfone "P1700" and "P3500", both being manufactured by Solvay Advanced Polymers, Inc.

Specifically, illustrative examples of the polyphenylene ether resin include "NORYL SA90" manufactured by SABIC Innovative Plastics, Inc. Specifically, illustrative examples of the polyether imide resin include "Ultem" manufactured by GE.

Illustrative examples of the polycarbonate resin include a carbonate resin containing a hydroxy group, a carbonate resin containing a phenolic hydroxy group, a carbonate resin containing a carboxy group, a carbonate resin containing an acid anhydride group, a carbonate resin containing an isocyanate group, and a carbonate resin containing a urethane group. Specifically, illustrative examples of the polycarbonate resin include "FPC0220" manufactured by Mitsubishi Gas Chemical Company, Inc., "T6002" and "T6001" (polycarbonate diol), both being manufactured by Asahi Kasei Chemicals Corp.; and "C-1090", "C-2090", and "C-3090" (polycarbonate diol), all being manufactured by Kuraray Co., Ltd. Specifically, illustrative examples of the polyether ether ketone resin include "Sumiploy K" manufactured by Sumitomo Chemical Company.

Illustrative examples of the polyester resin include a polyethylene terephthalate resin, a polyethylene naphthalate resin, a polybutylene terephthalate resin, a polybutylene naphthalate resin, a polytrimethylene terephthalate resin, a polytrimethylene naphthalate resin, and a polycyclohexanedimethyl terephthalate resin.

From the viewpoint of clearly obtaining the effects of the present invention, a weight-average molecular weight (Mw) of (E) the thermoplastic resin is preferably 5,000 or more, more preferably 8,000 or more, still more preferably 10,000 or more, and especially preferably 20,000 or more, and preferably 100,000 or less, more preferably 70,000 or less, still more preferably 60,000 or less, and especially preferably 50,000 or less.

Although there is no particular restriction in the content of (E) the thermoplastic resin in the resin composition, the content thereof relative to 100% by mass of the nonvolatile components in the resin composition may be preferably 20% by mass or less, more preferably 15% by mass or less, still more preferably 10% by mass or less, far still more preferably 7% by mass or less, and especially preferably 5% by mass or less. Although there is no particular restriction in the lower limit of the content of (E) the thermoplastic resin in the resin composition, the content thereof relative to 100% by mass of the nonvolatile components in the resin composition may be, for example, 0% by mass or more, 0.01% by mass or more, 0.1% by mass or more, 0.5% by mass or more, or 1% by mass or more.

(F) Stress Relaxing Material

The resin composition according to the present invention includes (F) a stress relaxing material. (F) The stress relaxing material means the resin having flexibility and may be a particulate resin component that maintains a particle form in the resin composition (particulate stress relaxing material) or a non-particulate resin component that tends to be miscible or soluble in the resin composition (non-particulate stress relaxing material), and may contain only one or both of these components. The resin component forming the material may be a resin that exhibits itself a rubber elasticity or a resin that exhibits rubber elasticity by reacting with other components. The resin that exhibits the rubber elasticity is the resin having an elastic modulus of 1 GPa or less when subjected to a tensile test at a temperature of 25° C. and a humidity of RH 40% according to, for example, the Japanese Industrial Standard (JIS K7161).

The particulate stress relaxing material is preferably spherical. The particulate stress relaxing material may be a hollow particle having a void hole inside the particle or a non-hollow particle not having a void hole inside the particle. The hollow particle may be any of a single hollow particle having only one void hole inside the particle or a multi-hollow particle having a plurality of void holes inside the particle.

The particulate stress relaxing material is, for example, a rubber particle containing a rubber component, preferably the rubber particle containing, as the rubber component, a silicone type elastomer such as polydimethylsiloxane; an olefin type thermoplastic elastomer such as polybutadiene, polyisoprene, polychlorobutadiene, ethylene-vinyl acetate copolymer, styrene-butadiene copolymer, styrene-isoprene copolymer, styrene-isobutylene copolymer, acrylonitrile-butadiene copolymer, isoprene-isobutylene copolymer, isobutylene-butadiene copolymer, ethylene-propylene-butadiene ternary copolymer, and ethylene-propylene-butene ternary copolymer; or a thermoplastic elastomer such as an acryl type thermoplastic elastomer, for example, propyl poly(meth)acrylate, butyl poly(meth)acrylate, cyclohexyl poly(meth)acrylate, and octyl poly(meth)acrylate. In addition, the rubber component may be mixed with a silicone type rubber such as polyorganosiloxane rubber. The rubber component included in the rubber particles has a glass transition temperature of, for example, 0° C. or lower, preferably −10° C. lower, more preferably −20° C. or lower, and still more preferably −30° C. or lower.

It is preferable that the particulate stress relaxing material contain a core-shell type rubber particle. The core-shell type rubber particle is the particulate stress relaxing material consisting of a core particle containing the rubber component as described above and one or more layers of a shell portion that covers the core particle. The core-shell type rubber particle is preferably a core-shell type graft copolymer rubber particle consisting of a core particle containing the rubber component as described above and a shell portion formed by graft copolymerizing a monomer component that can be copolymerized with the rubber component contained in the core particle. The core-shell type here does not necessarily refer only to those in which the core particle and the shell portion are clearly distinguishable, but also includes those in which the boundary between the core particle and the shell portion is unclear, and the core particle may not be completely covered by the shell portion.

The content of the rubber component in the core-shell type rubber particle is preferably 40% by mass or more, more preferably 50% by mass or more, and still more preferably 60% by mass or more. The upper limit of the content of the rubber component in the core-shell type rubber particle is not particularly restricted; but from the viewpoint of sufficiently covering the core particle with the shell portion, the content is preferably, for example, 95% by mass or less or 90% by mass or less.

Illustrative examples of the monomer component forming the shell portion of the core-shell type rubber particle includes (meth)acrylate esters such as methyl (meth)acrylate, ethyl (meth)acrylate, butyl (meth)acrylate, cyclohexyl (meth)acrylate, octyl (meth)acrylate, and glycidyl (meth) acrylate; (meth)acrylic acid; N-substituted maleimides such as N-methylmaleimide and N-phenylmaleimide; maleimide; α,β-unsaturated carboxylic acids such as maleic acid and itaconic acid; aromatic vinyl compounds such as styrene, 4-vinyltoluene, and a-methylstyrene; and (meth)acrylonitrile. Among these, it is preferable to include a (meth) acrylate ester, and more preferable to include methyl (meth) acrylate. The term "(meth)acrylic acid" refers to methacrylic acid or acrylic acid.

Illustrative examples of the commercially available product of the core-shell type rubber particle include "CHT" manufactured by Cheil Industries, Inc.; "B602" manufactured by UMGABS, Ltd.; "Paraloid EXL-2602", "Paraloid EXL-2603", "Paraloid EXL-2655", "Paraloid EXL-2311", "Paraloid-EXL2313", "Paraloid EXL-2315", "Paraloid KM-330", "Paraloid KM-336P", and "Paraloid KCZ-201", all being manufactured by Dow Chemical Japan Ltd.; "Metablen C-223A", "Metablen E 901", "Metablen S-2001", "Metablen W-450A", and "Metablen SRK-200", all being manufactured by Mitsubishi Rayon Co., Ltd.; "Kane Ace M-511", "Kane Ace M-600", "Kane Ace M-400", "Kane Ace M-580", and "Kane Ace MR-01", all being manufactured by Kaneka Corp.; and "AC3401N" and "AC3816N", both being manufactured by Ganz Chemical Co., Ltd.

Although the average particle diameter (average primary particle diameter) of the particulate stress relaxing material is not particularly restricted, this is preferably 20 nm or more, more preferably 30 nm or more, and still more preferably 50 nm or more. The upper limit of the average particle diameter (average primary particle diameter) of the particulate stress relaxing material is not particularly restricted; this is preferably 10,000 nm or less, more preferably 5,000 nm or less, and still more preferably 1,000 nm or less. The average particle diameter (average primary particle diameter) of the particulate stress relaxing material may be measured using a zeta potential particle diameter distribution measurement instrument or the like.

The non-particulate stress relaxing material includes preferably a resin having one or more structures selected from a polybutadiene structure, a polysiloxane structure, a poly (meth)acrylate structure, a polyalkylene structure, a polyalkyleneoxy structure, a polyisoprene structure, a polyisobutylene structure, and a polycarbonate structure in its molecules, more preferably a resin having one or more structures selected from a polybutadiene structure and a polycarbonate structure, and especially preferably a resin having a polybutadiene structure and a phenolic hydroxide group (polybutadiene resin containing a phenolic hydroxy group) or a resin having a polycarbonate structure (polycarbonate resin). The term "(meth)acrylate" refers to a methacrylate and an acrylate.

The polybutadiene structure includes not only the structure formed by polymerizing butadiene, but also the structure formed by hydrogenating this structure. The polybutadiene structure may be hydrogenated only in part or all of it. Furthermore, the polybutadiene structure may be included in the main chain or in the side chain in the molecule of the stress relaxing material.

Preferable illustrative examples of the polybutadiene resin include a resin containing a hydrogenated polybutadiene skeleton, a polybutadiene resin containing a hydroxy group, a polybutadiene resin containing a phenolic hydroxy group, a polybutadiene resin containing a carboxy group, a polybutadiene resin containing an acid anhydride group, a polybutadiene resin containing an epoxy group, a polybutadiene resin containing an isocyanate group, and a polybutadiene resin containing a urethane group. Among these, a polybutadiene resin containing a phenolic hydroxy group and a polybutadiene resin containing an epoxy group are more preferable, and a polybutadiene resin containing a phenolic hydroxy group is especially preferable. Here, the "resin containing a hydrogenated polybutadiene skeleton" refers to a resin in which at least part of the polybutadiene skeleton is hydrogenated, and does not necessarily mean that the polybutadiene skeleton is completely hydrogenated. The resin containing a hydrogenated polybutadiene skeleton includes, for example, an epoxy resin containing a hydrogenated polybutadiene skeleton. Preferable examples of the polybutadiene resin containing a phenolic hydroxy group include the resin made from, as raw materials, a polybutadiene terminated with a hydroxy group, a diisocyanate compound, and a resin containing a phenolic hydroxy group. Here, the polybutadiene terminated with a hydroxy group and the diisocyanate compound may be the same as those that are exemplified below. The resin containing a phenolic hydroxy group includes, for example, a cresol novolac resin.

Specifically, illustrative examples of the polybutadiene resin include "PB-3600" (polybutadiene containing an epoxy group) manufactured by Daicel Corp.; "JP-100" and "JP-200" (polybutadiene containing an epoxy group), both being manufactured by Nippon Soda Co., Ltd.; "Ricon 657" (polybutadiene containing an epoxy group), "Ricon 130MA8", "Ricon 130MA13", "Ricon 130MA20", "Ricon 131MA5", "Ricon 131MA10", "Ricon 131MA17", "Ricon 131MA20", "Ricon 184MA6" (polybutadiene containing an acid anhydride group), as well as "GQ-1000" (polybutadiene having a hydroxy group and a carboxyl group introduced), all being manufactured by Cray Valley S.A.;

"G-1000", "G-2000", "G-3000" (polybutadiene terminated with hydroxy groups at both ends), as well as "GI-1000", "GI-2000", and "GI-3000" (hydrogenated polybutadiene terminated with hydroxy groups at both ends), all being manufactured by Nippon Soda Co., Ltd.; "PB3600" and "PB4700" (epoxy compound containing a polybutadiene skeleton), as well as "Epofriend A1005", "Epofriend A1010", and "Epofriend A1020" (epoxidated compound of styrene, butadiene, and styrene block copolymer), all being manufactured by Daicel Corp.; and "FCA-061L" (epoxy compound containing a hydrogenated polybutadiene skeleton) and "R-45EPT" (epoxy compound containing a polybutadiene skeleton), both being manufactured by Nagase ChemteX Corp.

Another example of the preferable polybutadiene resin is a linear polyimide made from, as the raw materials, a polybutadiene terminated with a hydroxy group, a diisocyanate compound, and a polybasic acid or its anhydrides (polyimide described in Japanese Patent Application Laid-open No. 2006-37083 and International Patent Application Laid-open No. 2008-153208, which are incorporated herein by reference in their entireties). The content of the polybutadiene structure in the polyimide resin is preferably in the range of 60 to 95% by mass, and more preferably in the range of 75 to 85% by mass. For details of the polyimide resin, Japanese Patent Application Laid-open No. 2006-37083 and International Patent Application Laid-open No. 2008-153208, which are incorporated herein by reference in their entireties, may be referred, and the contents of these patent literatures are incorporated into this specification.

The number-average molecular weight of the polybutadiene terminated with a hydroxy group is preferably in the range of 500 to 5,000 and more preferably in the range of 800 to 3,500. The hydroxy group equivalent of the polybutadiene terminated with a hydroxy group is preferably in the range of 250 to 5,000 g/eq. and more preferably in the range of 1,000 to 3,000 g/eq.

Illustrative examples of the diisocyanate compound include aromatic diisocyanates such as toluene-2,4-diisocyanate, toluene-2,6-diisocyanate, xylylene diisocyanate, and diphenylmethane diisocyanate; aliphatic diisocyanates such as hexamethylene diisocyanate; and alicyclic diisocyanates such as isophorone diisocyanate. Among these, the aromatic diisocyanates are preferable, and toluene-2,4-diisocyanate is more preferable.

Illustrative examples of the polybasic acid or its anhydride include tetrabasic acids such as ethylene glycol bistrimellitic acid, pyromellitic acid, benzophenone tetracarboxylic acid, biphenyl tetracarboxylic acid, naphthalene tetracarboxylic acid, 5-(2,5 dioxotetrahydrofuryl)-3-methylcyclohexene-1,2-dicarboxylic acid, and 3,3'-4,4'-diphenylsulfone tetracarboxylic acid, as well as their anhydrides; tribasic acids such as trimellitic acid and cyclohexane tricarboxylic acid, as well as their anhydride; and 1,3,3a,4,5,9b-hexahydro-5-(tetrahydro-2,5-dioxo-3-furanyl)-naphtho (1,2-C)furan-1,3-dione.

The polybutadiene resin may also contain a polystyrene structure that is obtained by polymerization of styrene.

Specifically, illustrative examples of the polystyrene resin, the resin having the polystyrene structure inside its molecule, include styrene-butadiene-styrene block copolymer (SBS), styrene-isoprene-styrene block copolymer (SIS), styrene-ethylene-butylene-styrene block copolymer (SEBS), styrene-ethylene-propylene-styrene block copolymer (SEPS), styrene-ethylene-ethylene-propylene-styrene block copolymer (SEEPS), styrene-butadiene-butylene-styrene block copolymer (SBBS), styrene-butadiene diblock copolymer, hydrogenated styrene-butadiene block copolymer, hydrogenated styrene-isoprene block copolymer, and hydrogenated styrene-butadiene random copolymer.

The commercially available polystyrene resin may be used; and illustrative examples thereof include hydrogenated styrenic thermoplastic elastomers "H1041", "TUFTEC H1043", "TUFTEC P2000", and "TUFTEC MP10", all being manufactured by Asahi Kasei Corp.; epoxidized styrene-butadiene thermoplastic elastomers "Epofriend AT501" and "CT310", both being manufactured by Daicel Corp.; modified styrenic elastomer having a hydroxy group "SEPTON HG252" manufactured by Kuraray Co., Ltd.; a modified styrenic elastomer containing a carboxyl group "TUFTEC N503M", a modified styrenic elastomer containing an amino group "TUFTEC N501", and a modified styrenic elastomer containing an acid anhydride group "TUFTEC M1913", all being manufactured by Asahi Kasei Chemicals Corp.; and an unmodified styrenic elastomer "SEPTON S8104" manufactured by Kuraray Co., Ltd. The component (C) may be used singly, or as a combination of two or more.

The polysiloxane structure is the structure containing a siloxane bond, and this is contained in a silicone rubber, for example. The polysiloxane structure may be contained in a main chain or in a side chain in the molecule of the stress relaxing material.

Specifically, illustrative examples of the polysiloxane resin, i.e., the resin having the polysiloxane structure in its molecule, include "SMP-2006", "SMP-2003PGMEA", and "SMP-5005PGMEA", all being manufactured by Shin-Etsu Chemical Co., Ltd.; and a linear polyimide made from, as the raw materials, a polysiloxane terminated with an amino group and a tetrabasic acid anhydride (International Patent Application Laid-open No. 2010-053185, which is incorporated herein by reference in its entirety).

The poly(meth)acrylate structure is the structure formed by polymerizing acrylic acid or an acrylate ester, and also includes the structure formed by polymerizing methacrylic acid or a methacrylate ester. The (meth)acrylate structure may be included in the main chain or in the side chain in the molecule of the stress relaxing material.

Illustrative examples of the preferable poly(meth)acrylate resin, i.e., the resin having a poly(meth)acrylate structure in its molecule, include a poly(meth)acrylate resin containing a hydroxy group, a poly(meth)acrylate resin containing a phenolic hydroxy group, a poly(meth)acrylate resin containing a carboxyl group, a poly(meth)acrylate resin containing an acid anhydride group, a poly(meth)acrylate resin containing an epoxy group, a poly(meth)acrylate resin containing an isocyanate group, and a poly(meth)acrylate resin containing a urethane group.

Specifically, illustrative examples of the poly(meth)acrylate resin include Teisan Resin "SG-70L", "SG-708-6", "WS-023", "SG-700AS", and "SG-280TEA" (acrylate ester copolymer resin containing a carboxy group; acid number of 5 to 34 mg KOH/g, weight-average molecular weight of 400,000 to 900,000, Tg of −30° C. to 5° C.), "SG-80H", "SG-80H-3", and "SG-P3" (acrylate ester copolymer resin containing an epoxy group; epoxy equivalent of 4761 to 14285 g/eq; weight-average molecular weight of 350,000 to 850,000; Tg of 11° C. to 12° C.), as well as "SG-600TEA" and "SG-790" (acrylate ester copolymer resin containing a hydroxy group; hydroxy group value of 20 to 40 mg KOH/g, weight-average molecular weight of 500,000 to 1,200,000, Tg of −37° C. to −32° C.), all being manufactured by Nagase ChemteX Corp.; and "ME-2000" and "W-116.3" (acrylate ester copolymer resin containing a carboxy group), "W-197C" (acrylate ester copolymer resin containing a hydroxy group), "KG-25" and "KG-3000" (acrylate ester copolymer resin containing an epoxy group), all being manufactured by Negami Chemical Industrial Co., Ltd.

It is preferable that the polyalkylene structure have a predetermined number of carbon atoms. Specific number of the carbon atoms in the polyalkylene structure is preferably 2 or more, more preferably 3 or more, especially preferably 5 or more, and preferably 15 or less, more preferably 10 or less, and especially preferably 6 or less. The polyalkylene structure may be included in the main chain or in the side chain in the molecule of the stress relaxing material.

It is preferable that the polyalkyleneoxy structure have a predetermined number of carbon atoms. Specific number of the carbon atoms in the polyalkyleneoxy structure is preferably 2 or more, preferably 3 or more, more preferably 5 or more, and preferably 15 or less, more preferably 10 or less, and especially preferably 6 or less. The polyalkyleneoxy structure may be included in a main chain or in a side chain in the molecule of the stress relaxing material.

Specifically, illustrative examples of the polyalkylene resin, which is the resin having a polyalkylene structure in its molecule, and of the polyalkyleneoxy resin, which is the resin having a polyalkyleneoxy structure in its molecule, include "PTXG-1000" and "PTXG-1800", both being manufactured by Asahi Kasei Fibers Corp.; "YX-7180" (resin containing an alkylene structure having an ether bond) manufactured by Mitsubishi Chemical Corp.; "EXA-4850-150", "EXA-4816", and "EXA-4822", all being manufactured by DIC Corporation; "EP-4000", "EP-4003", "EP-4010" and "EP-4011", all being manufactured by Adeka Corp.; "BEO-60E" and "BPO-20E", both being manufactured by New Japan Chemical Co., Ltd.; and "YL7175" and "YL7410", both being manufactured by Mitsubishi Chemical Corp.

The polyisoprene structure may be included in a main chain or in a side chain in the molecule of the stress relaxing material. Specifically, illustrative examples of the polyisoprene resin, i.e., the resin containing the polyisoprene structure in its molecule, include "KL-610" and "KL-613", both being manufactured by Kuraray Co., Ltd.

The polyisobutylene structure may be included in a main chain or in a side chain in the molecule of the stress relaxing material. Specifically, illustrative examples of the polyisobutylene resin, i.e., the resin containing the polyisobutylene structure in its molecule, include "SIBSTAR-073T" (styrene-isobutylene-styrene triblock copolymer) and "SIBSTAR-042D" (styrene-isobutylene diblock copolymer), both being manufactured by Kaneka Corp.

The polycarbonate structure may be included in a main chain or in a side chain in the molecule of the stress relaxing material.

Illustrative examples of the polycarbonate resin, i.e., the resin having the polycarbonate structure in its molecule, include a polycarbonate resin containing a hydroxy group, a polycarbonate resin containing a phenolic hydroxy group, a polycarbonate resin containing a carboxy group, a polycarbonate resin containing an acid anhydride group, a polycarbonate resin containing an epoxy group, a polycarbonate resin containing an isocyanate group, and a polycarbonate resin containing a urethane group.

Specifically, illustrative examples of the polycarbonate resin include "T6002" and "T6001" (polycarbonate diol), both being manufactured by Asahi Kasei Chemicals Corp.; and "C-1090", "C-2090", and "C-3090" (polycarbonate diol), all being manufactured by Kuraray Co., Ltd.

Examples of the preferable polycarbonate resin also include a linear polyimide made from, as the raw materials, a polycarbonate terminated with a hydroxy group, a diisocyanate compound, and a polybasic acid or its anhydride. The linear polyimide has a urethane structure and a polycarbonate structure. The content of the polycarbonate structure in the polyimide resin is preferably in the range of 60 to 95% by mass, and more preferably in the range of 75 to 85% by mass. For details of the polyimide resin, International Patent Application Laid-open No. 2016-129541 may be referred, and the contents of this patent literature are incorporated into this specification.

The number-average molecular weight of the polycarbonate terminated with a hydroxy group is preferably in the range of 500 to 5,000, and more preferably in the range of 1,000 to 3,000. The hydroxy group equivalent of the polycarbonate terminated with a hydroxy group is preferably in the range of 250 to 1,250.

It is preferable that the non-particulate stress relaxing material further has an imide structure. The imide structure can effectively increase the heat resistance and crack resistance of the non-particulate stress relaxing material.

The chemical structure of the non-particulate stress relaxing material may be any of a linear structure, a branched structure, and a cyclic structure, but the linear structure is preferable.

It is preferable that the non-particulate stress relaxing material further have a functional group that is capable of reacting with an epoxy resin. The functional group includes a reactive group that emerges upon heating. When the non-particulate stress relaxing material has the functional group, the mechanical strength of the cured product of the resin composition can be enhanced.

Illustrative examples of the functional group include a carboxy group, a hydroxy group, an acid anhydride group, a phenolic hydroxy group, an epoxy group, an isocyanate group, and a urethane group. In particular, from the viewpoint of clearly obtaining the effects of the present invention, it is preferable to have, as the functional group, one or more functional groups selected from a hydroxy group, an acid anhydride group, a phenolic hydroxy group, an epoxy group, an isocyanate group, and a urethane group; among these, a phenolic hydroxy group is especially preferable.

The non-particulate stress relaxing material may be used singly or as a combination of two or more.

Specifically, the number-average molecular weight Mn of the non-particulate stress relaxing material is preferably 500 or more, more preferably 800 or more, still more preferably 1,000 or more, and especially preferably 1,200 or more, and preferably 100,000 or less, more preferably 50,000 or less, and especially preferably 10,000 or less. The number-average molecular weight Mn of the non-particulate stress relaxing material is the number-average molecular weight in terms of polystyrene measured using GPC (gel permeation chromatography).

When the non-particulate stress relaxing material has a functional group, the functional group equivalent of the non-particulate stress relaxing material is preferably 100 g/eq. or more, more preferably 200 g/eq. or more, more preferably 1,000 g/eq. or more, especially preferably 2,500 g/eq. or more, and preferably 50,000 g/eq. or less, more preferably 30,000 g/eq. or less, even more preferably 10,000 g/eq. or less, and especially preferably 5,000 g/eq. or less. The functional group equivalent is the number of grams of the resin containing one gram equivalent of a functional group. The epoxy equivalent may be measured in accordance with JIS K7236, for example. For example, the hydroxy group equivalent may be calculated by dividing the molecular weight of KOH by the hydroxy group value measured in accordance with JIS K1557-1.

The glass transition temperature (Tg) of (F) the stress relaxing material is preferably 20° C. or lower, more preferably 10° C. or lower, and still more preferably 0° C. or lower.

Although the content of (F) the stress relaxing material in the resin composition is not particularly restricted, the content thereof relative to 100% by mass of the nonvolatile components in the resin composition is preferably 50% by mass or less, more preferably 30% by mass or less, still more preferably 20% by mass or less, far still more preferably 10% by mass or less, and especially preferably 5% by mass or less. Although the lower limit of the content of (F) the stress relaxing material in the resin composition is not particularly restricted, the content thereof relative to 100% by mass of the nonvolatile components in the resin composition is preferably 0.01% by mass or more, more preferably 0.05% by mass or more, still more preferably 0.1% by mass or more, far still more preferably 0.3% by mass or more, and especially preferably 0.5% by mass or more.

(G) Radical Polymerization Initiator

The resin composition according to the present invention may include (G) a radical polymerization initiator as an arbitrary component. (G) The radical polymerization initiator may be, for example, a thermal polymerization initiator that generates a free radical upon heating. (G) The radical polymerization initiator may be initiators of the radical polymerizable groups contained in (A) and (B) components. (G) The radical polymerization initiator may be used singly or as an arbitrary combination of two or more.

Illustrative examples of (G) the radical polymerization initiator include a peroxide type radical polymerization initiator and an azo type radical polymerization initiator. In particular, a peroxide type radical polymerization initiator is preferable.

Illustrative examples of the peroxide type radical polymerization initiator include hydroperoxide compounds such as 1,1,3,3-tetramethylbutyl hydroperoxide; dialkyl peroxide compounds such as tert-butylcumyl peroxide, di-tert-butyl peroxide, di-tert-hexyl peroxide, dicumyl peroxide, 1,4-bis(1-tert-butylperoxy-1-methylethyl)benzene, and 2,5-dimethyl-2,5-bis(tert-butylperoxy)hexane; diacyl peroxide compounds such as dilauroyl peroxide, didecanoyl peroxide, dicyclohexyl peroxydicarbonate, and bis(4-tert-butylcyclohexyl)peroxydicarbonate; peroxy ester compounds such as tert-butylperoxy acetate, tert-butylperoxy benzoate, tert-butylperoxy isopropyl monocarbonate, tert-butylperoxy-2-ethyl hexanoate, tert-butylperoxy neodecanoate, tert-hexylperoxy isopropyl monocarbonate, tert-butylperoxy laurate, (1,1-dimethylpropyl) 2-ethylperhexanoate, tert-butyl 2-ethylperhexanoate, tert-butyl 3,5,5-trimethylperhexanoate, tert-butylperoxy-2-ethylhexyl monocarbonate, and tert-butyl peroxymaleate.

Illustrative examples of the azo type radical polymerization initiator include azonitrile compounds such as 2,2'-azobis(4-methoxy-2,4-dimethylvaleronitrile), 2,2'-azobis(2,4-dimethylvaleronitrile), 2,2'-azobisisobutyronitrile, 2,2'-azobis(2-methylbutyronitrile), 1,1'-azobis(cyclohexane-1-carbonitrile), 1-[(1-cyano-1-methylethyl)azo]formamide, and 2-phenylazo-4-methoxy-2,4-dimethyl-valeronitrile; azoamide compounds such as 2,2'-azobis[2-methyl-N—[1,1-bis(hydroxymethyl)-2-hydroxyethyl]propionamide], 2,2'-azobis[2-methyl-N—[1,1-bis(hydroxymethyl)ethyl]propionamide], 2,2'-azobis[2-methyl-N—[2-(1-hydroxybutyl)]-propionamide], 2,2'-azobis[2-methyl-N-(2-hydroxyethyl)propionamide], 2,2'-azobis(2-methylpropionamide) dihydrate, 2,2'-azobis[N-(2-propenyl)-2-methylpropionamide], 2,2'-azobis(N-butyl-2-methylpropionamide), and 2,2'-azobis(N-cyclohexyl-2-methylpropionamide); and alkylazo compounds such as 2,2'-azobis(2,4,4-trimethylpentane) and 2,2'-azobis(2-methylpropane).

Illustrative examples of the commercially available product of (G) the radical polymerization initiator include "Perbutyl C", "Perbutyl A", "Perbutyl P", "Perbutyl L", "Perbutyl O", "Perbutyl ND", "Perbutyl Z", "Perbutyl I", "Percumyl P", "Percumyl D", "Perhexyl D", "Perhexyl A", "Perhexyl I", "Perhexyl Z", "Perhexyl ND", "Perhexyl O", and "Perhexyl PV", all being manufactured by NOF Corp.

Although the content of (G) the radical polymerization initiator in the resin composition is not particularly restricted, the content thereof relative to 100% by mass of the nonvolatile components in the resin composition may be preferably 5% by mass or less, more preferably 2% by mass or less, still more preferably 1.5% by mass or less, and especially preferably 1% by mass or less. Although the lower limit of the content of (G) the radical polymerization initiator in the resin composition is not particularly restricted, the lower limit thereof relative to 100% by mass of the nonvolatile components in the resin composition may be, for example, 0% by mass or more, or 0.0001% by mass or more, preferably 0.001% by mass or more, more preferably 0.01% by mass or more, still more preferably 0.05% by mass or more, and especially preferably 0.1% by mass or more.

(H) Curing Accelerator

The resin composition according to the present invention may include (H) a curing accelerator as an arbitrary component. (H) The curing accelerator functions as a curing catalyst to accelerate the curing of (C1) the epoxy resin when (C1) the epoxy resin is included as (C) the thermosetting resin.

Illustrative examples of (H) the curing accelerator include a phosphorous type curing accelerator, a urea type curing accelerator, a guanidine type curing accelerator, an imidazole type curing accelerator, a metal type curing accelerator, and an amine type curing accelerator. Among these, the curing accelerator selected from an amine type curing accelerator and a metal type curing accelerator are preferable, and an amine type curing accelerator is especially preferable. (H) The curing accelerator may be used singly, or as a combination of two or more.

Illustrative examples of the phosphorus type curing accelerator include aliphatic phosphonium salts such as tetrabutylphosphonium bromide, tetrabutylphosphonium chloride, tetrabutylphosphonium acetate, tetrabutylphosphonium decanoate, tetrabutylphosphonium laurate, bis (tetrabutylphosphonium) pyromellitate, tetrabutylphosphonium hydrogen hexahydrophthalate, tetrabutylphosphonium 2,6-bis[(2-hydroxy-5-methylphenyl)methyl]-4-methylphenolate, and di-tert-butylmethylphosphonium tetraphenylborate; aromatic phosphonium salts such as methyltriphenylphosphonium bromide, ethyltriphenylphosphonium bromide, propyltriphenylphosphonium bromide, butyltriphenylphosphonium bromide, benzyltriphenylphosphonium chloride, tetraphenylphosphonium bromide, p-tolyltriphenylphosphonium tetra-p-tolylborate, tetraphenylphosphonium tetraphenylborate, tetraphenylphosphonium tetra-p-tolylborate, triphenylethylphosphonium tetraphenylborate, tris(3-methylphenyl)ethylphosphonium tetraphenylborate, tris(2-methoxyphenyl)ethylphosphonium tetraphenylborate, (4-methylphenyl)triphenylphosphonium thiocyanate, tetraphenylphosphonium thiocyanate, and butyltriphenylphosphonium thiocyanate; aromatic phosphine-borane complexes such as triphenylphosphine-triphenylborane; aromatic phosphine-quinone adducts such as a triphenylphosphine p-benzoquinone adduct; aliphatic phosphines such as tributylphosphine, tri-tert-butylphosphine, trioctylphosphine, di-tert-butyl(2-butenyl)phosphine, di-tert-butyl(3-methyl-2-butenyl)phosphine, and tricyclohexylphosphine; and aromatic phosphines such as dibutylphenylphosphine, di-tert-butylphenylphosphine, methyldiphenylphosphine, ethyldiphenylphosphine, butyldiphenylphosphine, diphenylcyclohexylphosphine, triphenylphosphine, tri-o-tolylphosphine, tri-m-tolylphosphine, tri-p-tolylphosphine, tris(4-ethylphenyl)phosphine, tris(4-propylphenyl)phosphine, tris(4-isopropylphenyl)phosphine, tris(4-butylphenyl)phosphine, tris(4-tert-butylphenyl)phosphine, tris(2,4-dimethylphenyl)phosphine, tris(2,5-dimethylphenyl)phosphine, tris(2,6-dimethylphenyl)phosphine, tris(3,5-dimethylphenyl)phosphine, tris(2,4,6-trimethylphenyl)phosphine, tris(2,6-dimethyl-4-ethoxyphenyl)phosphine, tris(2-methoxyphenyl)phosphine, tris(4-methoxyphenyl)phosphine, tris(4-ethoxyphenyl)phosphine, tris(4-tert-butoxyphenyl)phosphine, diphenyl-2-pyridylphosphine, 1,2-bis(diphenylphosphino)ethane, 1,3-bis(diphenylphosphino)propane, 1,4-bis(diphenylphosphino)butane, 1,2-bis (diphenylphosphino)acetylene, and 2,2'-bis(diphenylphosphino) diphenyl ether.

Illustrative examples of the urea type curing accelerator include aliphatic dimethylureas such as 1,1-dimethylurea, 1,1,3-trimethylurea, 3-ethyl-1,1-dimethylurea, 3-cyclohexyl-1,1-dimethylurea, and 3-cyclooctyl-1,1-dimethylurea; and aromatic dimethylureas such as 3-phenyl-1,1-dimethylurea, 3-(4-chlorophenyl)-1,1-dimethylurea, 3-(3,4-dichlorophenyl)-1,1-dimethylurea, 3-(3-chloro-4-methylphenyl)-1,1-dimethylurea, 3-(2-methylphenyl)-1,1-dimethylurea, 3-(4-methylphenyl)-1,1-dimethylurea, 3-(3,4-dimethylphenyl)-1,1-dimethylurea, 3-(4-isopropylphenyl)-1,1-dimethylurea, 3-(4-methoxyphenyl)-1,1-dimethylurea, 3-(4-nitrophenyl)-1,1-dimethylurea, 3-[4-(4-methoxyphenoxy) phenyl]-1,1-dimethylurea, 3-[4-(4-chlorophenoxy)phenyl]-1,1-dimethylurea, 3-[3-(trifluoromethyl)phenyl]-1,1-dimethylurea, N,N-(1,4-phenylene) bis(N',N'-dimethylurea), and N,N-(4-methyl-1,3-phenylene) bis(N', N'-dimethylurea) [toluene bisdimethylurea].

Illustrative examples of the guanidine type curing accelerator include dicyandiamide, 1-methylguanidine, 1-ethylguanidine, 1-cyclohexylguanidine, 1-phenylguanidine, 1-(o-tolyl)guanidine, dimethylguanidine, diphenylguanidine, trimethylguanidine, tetramethylguanidine, pentamethylguanidine, 1,5,7-triazabicyclo[4.4.0]deca-5-ene, 7-methyl-1,5,7-triazabicyclo[4.4.0]deca-5-ene, 1-methylbiguanide, 1-ethylbiguanide, 1-n-butylbiguanide, 1-n-octadecylbiguanide, 1,1-dimethylbiguanide, 1,1-diethylbiguanide, 1-cyclohexylbiguanide, 1-allylbiguanide, 1-phenylbiguanide, and 1-(o-tolyl)biguanide.

Illustrative examples of the imidazole type curing accelerator include imidazole compounds such as 2-methylimidazole, 2-undecylimidazole, 2-heptadecylimidazole, 1,2-dimethylimidazole, 2-ethyl-4-methylimidazole, 1,2-dimethylimidazole, 2-ethyl-4-methylimidazole, 2-phenylimidazole, 2-phenyl-4-methylimidazole, 1-bezyl-2-methylimidazole, 1-benzyl-2-phenylimidazole, 1-cyanoethyl-2-methylimidazole, 1-cyanoethyl-2-undecylimidazole, 1-cyanoethyl-2-ethyl-4-methylimidazole, 1-cyanoethyl-2-phenylimidazole, 1-cyanoethyl-2-undecylimidazolium trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-metylimidazolyl-(1')]-ethyl-s-triazine, a 2,4-diamino-6-[2'-methylimidazolyl-(1')]-ethyl-s-triazine isocyanuric acid adduct, a 2-phenylimidazole isocyanuric acid adduct, 2-phenyl-4,5-dihydroxymethylimidazole, 2-phenyl-4-methyl-5-hydroxymethylimidazole, 2,3-dihydro-1H-pyrrolo[1,2-a] benzimidazole, 1-dodecyl-2-methyl-3-benzylimidazolium chloride, 2-methylimidazoline, and 2-phenylimidazoline; and adducts of the imidazole compounds with an epoxy resin.

Commercially available products may be used as the imidazole type curing accelerator. Illustrative examples thereof include "1B2PZ", "2MZA-PW", "2PHZ-PW", and "C11Z-A", all being manufactured by Shikoku Chemicals Corp., and "P200-H50" manufactured by Mitsubishi Chemical Corp.

Illustrative examples of the metal type curing accelerator include organometallic complexes or organometallic salts of metals such as cobalt, copper, zinc, iron, nickel, manganese, and tin. Specifically, illustrative examples of the organometallic complex include organic cobalt complexes such as cobalt (II) acetylacetonate and cobalt (III) acetylacetonate; organic copper complexes such as copper (II) acetylacetonate; organic zinc complexes such as zinc (II) acetylacetonate; organic iron complexes such as iron (III) acetylacetonate; organic nickel complexes such as nickel (II) acetylacetonate; and organic manganese complexes such as manganese (II) acetylacetonate. Illustrative examples of the organic metal salt include zinc octylate, tin octylate, zinc naphthenate, cobalt naphthenate, tin stearate, and zinc stearate.

Illustrative examples of the amine type curing accelerator include: trialkylamines such as triethylamine and tributylamine; and 4-dimethylaminopyridine, benzyldimethyl amine, 2,4,6-tris(dimethylaminomethyl)phenol, and 1,8-diazabicyclo (5,4,0)-undecene.

Commercially available products may be used as the amine type curing accelerator. Illustrative examples thereof include "MY-25" manufactured by Ajinomoto Fine-Techno Co., Inc.

Although the content of (H) the curing accelerator in the resin composition is not particularly restricted, the content thereof relative to 100% by mass of the nonvolatile components in the resin composition is preferably 15% by mass or less, more preferably 10% by mass or less, still more preferably 5% by mass or less, and especially preferably 2% by mass or less. Although the lower limit of the content of (H) the curing accelerator in the resin composition is not particularly restricted, the content thereof relative to 100% by mass of the nonvolatile components in the resin composition may be, for example, 0% by mass or more, 0.001% by mass or more, or 0.01% by mass or more.

(I) Another Additive

The resin composition according to the present invention may further include an arbitrary additive. Illustrative examples of the additive like this include organic metal compounds such as an organic copper compound, an organic zinc compound, and an organic cobalt compound; coloring materials such as a phthalocyanine blue, a phthalocyanine green, an iodine green, a diazo yellow, a crystal violet, titanium oxide, and carbon black; polymerization inhibitors such as hydroquinone, catechol, pyrogallol, and phenothiazine; leveling agents such as a silicone type leveling agent and an acrylic polymer type leveling agent; thickeners such as bentone and montmorillonite; antifoaming agents such as a silicone type antifoaming agent, an acrylic type antifoaming agent, a fluorine type antifoaming agent, and a vinyl resin type antifoaming agent; UV absorbers such as a benzotriazole type UV absorber; adhesion enhancers such as a urea silane; adhesion assisting agents such as a triazole type adhesion assisting agent, a tetrazole type adhesion assisting agent, and a triazine type adhesion assisting agent; antioxidants such as a hindered phenol type antioxidant; fluorescent whitening agents such as a stilbene derivative; surfactants such as a fluorine type surfactant and a silicone type surfactant; flame retardants such as phosphorous type flame retardants (for example, a phosphate ester compound, a phosphazene compound, a phosphinate compound, and red phosphorus), nitrogen type flame retardants (for example, melamine sulfate), halogen type flame retardants, and inorganic type flame retardants (for example, antimony trioxide); dispersants such as a phosphate ester type dispersant, a polyoxyalkylene type dispersant, an acetylene type dispersant, a silicone type dispersant, an anionic dispersant, and a cationic dispersant; and stabilizers such as a borate type stabilizer, a titanate type stabilizer, an aluminate type stabilizer, a zirconate type stabilizer, an isocyanate type stabilizer, a carboxylate type stabilizer, and a carboxylic anhydride type stabilizer. (I) The other additive may be used singly or as a combination of two or more in an arbitrary ratio. The content of (I) the other additive may be determined as appropriate by a person ordinarily skilled in the art.

(J) Organic Solvent

The resin composition according to the present invention may further include an organic solvent as an arbitrarily component. There is no particular restriction in (J) the organic solvent; thus, any known solvent may be used as appropriate. Illustrative examples of (J) the organic solvent include: ketone type solvents such as acetone, methyl ethyl ketone, methyl isobutyl ketone, and cyclohexanone; ester type solvents such as methyl acetate, ethyl acetate, butyl acetate, isobutyl acetate, isoamyl acetate, methyl propionate, ethyl propionate, and γ-butyrolactone; ether type solvents such as tetrahydropyran, tetrahydrofuran, 1,4-dioxane, diethyl ether, diisopropyl ether, dibutyl ether, and diphenyl ether; alcohol type solvents such as methanol, ethanol, propanol, butanol, and ethyleneglycol; ether ester type solvents such as 2-ethoxyethyl acetate, propyleneglycol monomethyl ether acetate, diethyleneglycol monoethyl ether acetate, ethyldiglycol acetate, γ-butyrolactone, and methyl methoxypropionate; ester alcohol type solvents such as methyl lactate, ethyl lactate, and methyl 2-hydroxyisobutyrate; ether alcohol type solvents such as 2-methoxypropanol, 2-methoxyethanol, 2-ethoxyethanol, propyleneglycol monomethyl ether, and diethyleneglycol monobutyl ether (butyl carbitol); amide type solvents such as N,N-dimethylformamide, N,N-dimethylacetamide, and N-methyl-2-pyrrolidone; sulfoxide type solvents such as dimethyl sulfoxide; nitrile type solvents such as acetonitrile and propionitrile; aliphatic hydrocarbon type solvents such as hexane, cyclopentane, cyclohexane, and methylcyclohexane; and aromatic hydrocarbon type solvents such as benzene, toluene, xylene, ethylbenzene, and trimethylbenzene. (J) The organic solvent may be used singly or as a combination of two or more in an arbitrary ratio.

Although there is no particular restriction in the content of (J) the organic solvent in the resin composition that is in the form of varnish before drying, the content thereof relative to 100% by mass of the total components in the resin composition is, for example, 40% by mass or less, 30% by mass or less, preferably 20% by mass or less, more preferably 10% by mass or less, still more preferably 8% by mass or less, and especially preferably 6% by mass or less. Although the content of (J) the organic solvent in the resin composition forming a resin composition layer in a resin sheet after drying is not particularly restricted, the content thereof relative to 100% by mass of the total components in the resin composition is preferably 5% by mass or less, more preferably 3% by mass or less, still more preferably 2% by mass or less, and especially preferably 1% by mass or less.

Production Method of Resin Composition

The resin composition according to the present invention is produced, for example, in any preparation vessel by mixing (A) a compound containing a radical polymerizable group having a carbodiimide structure with at least any one of (B) a compound containing a radical polymerizable group not having a carbodiimide structure and (C) a thermosetting resin, as well as (A') another carbodiimide compound as needed, (D) an inorganic filler as needed, (E) a thermoplastic resin as needed, (F) a stress relaxing material as needed, (G) a radical polymerization initiator as needed, (H) a curing accelerator as needed, (I) another additive as needed, and (J) an organic solvent as needed, in any order and/or by adding some or all of these components simultaneously. During the course of mixing of each component, the temperature may be set as appropriate, in which temporarily or throughout the entire process, heating and/or cooling may be carried out. During the course of adding and mixing or thereafter, the resin composition may be uniformly dispersed by stirring or shaking with stirring equipment such as a mixer or with shaking equipment. At the same time as stirring or shaking, defoaming may be carried out under a reduced pressure condition such as a vacuum condition.

Characteristics of Resin Composition

The resin composition according to the present invention includes (A) the compound containing the radical polymerizable group having the carbodiimide structure, and further includes at least any one of (B) the compound containing the radical polymerizable group not having the carbodiimide structure and (C) the thermosetting resin. By using the resin composition as described above, a cured product having excellent mechanical strength and plating adhesion property can be obtained. In one embodiment, the cured product of the resin composition according to the present invention can have a characteristic of an excellent crack resistance. In one embodiment, the cured product of the resin composition according to the present invention can have a characteristic of a low dielectric dissipation factor.

The cured product of the resin composition according to the present invention can have a characteristic of an excellent adhesion property. In particular, in one embodiment, the cured product of the resin composition according to the present invention can have a characteristic of an excellent durable, stable plating adhesion property. Therefore, in one embodiment, for example, when a copper-plated conductive layer is formed on the cured product as illustrated in Test Example 1 to be described later, which is followed by placing it in an environment of 130° C. and 85% RH for 100 hours for an ultra-accelerated high temperature and high humidity life test (HAST test). The copper plating peel strength calculated from the load when the copper-plated conductive layer after the test is peeled off in the vertical direction may be preferably 0.10 kgf/cm or more, more preferably 0.15 kgf/cm or more, still more preferably 0.18 kgf/cm or more, or 0.20 kgf/cm or more, and especially preferably 0.21 kgf/cm or more, or 0.24 kgf/cm or more. There is no particular restriction in the upper limit thereof; this may be, for example, 10 kgf/cm or less, or the like.

The cured product of the resin composition according to the present invention can have a characteristic of an excellent mechanical strength. Accordingly, in one embodiment, the elongation at a breaking point of the cured product measured at 23° C. in the way as described in Test Example 2 to be described later may be preferably 0.2% or more, more preferably 0.5% or more, still more preferably 0.8% or more, far still more preferably 1.0% or more, and especially preferably 1.2% or more, 1.5% or more, 1.8% or more, or 2.0% or more. Although the upper limit of the elongation at a breaking point is not particularly restricted, this may be usually made 10.0% or less, 5.0% or less, or the like.

In one embodiment, the cured product of the resin composition according to the present invention can have a characteristic of a low dielectric dissipation factor (Df). Accordingly, in one embodiment, when measured at 5.8 GHz and at 23° C., as in Test Example 3 to be described later, the dielectric dissipation factor (Df) of the cured product of the resin composition may be preferably 0.010 or less, more preferably 0.008 or less, still more preferably 0.007 or less, and especially preferably 0.006 or less, 0.005 or less, or 0.004 or less.

In one embodiment, the cured product of the resin composition according to the present invention can have a characteristic of suppressing the occurrence of cracks after desmearing (roughening) treatment. Thus, in one embodiment, after the circuit board is formed and desmeared as in Test Example 4 to be described later, when 100 copper pad sections of the circuit board are observed, the number of cracks may be preferably less than 15 (less than 15%) and more preferably less than 5 (less than 5%).

Use of Resin Composition

The resin composition according to the present invention may be suitably used as the resin composition for an insulation application, especially as the resin composition to form an insulating layer. Specifically, this may be suitably used as the resin composition for forming the insulating layer to form a conductive layer (including a rewiring layer) on the insulating layer (resin composition for forming an insulating layer to form a conductive layer). In addition, in the printed wiring board to be described later, this may be suitably used as the resin composition for forming the insulating layer in the printed wiring board (resin composition for forming the insulating layer in the printed wiring board). The resin composition according to the present invention may also be used in a wide range of uses where the resin composition is required, including sheet laminate materials such as a resin sheet and a prepreg, a solder resist, an underfill material, a die bonding material, a semiconductor encapsulating material, a hole-filling resin, and a component-embedding resin.

Also, for example, when a semiconductor chip package is manufactured by the processes (1) through (6) below, the resin composition according to the present invention may be suitably used as the resin composition for forming a rewiring forming layer as an insulating layer to form a rewiring layer (resin composition for forming a rewiring forming layer) and the resin composition for encapsulating a semiconductor chip (resin composition for encapsulating a semiconductor chip). At the time when the semiconductor chip package is manufactured, a rewiring layer may be further formed on the encapsulation layer.

(1) A process of laminating a temporary fixing film on a substrate;

(2) a process for temporarily fixing a semiconductor chip on the temporary fixing film;

(3) a process of forming an encapsulation layer on the semiconductor chip;

(4) a process of peeling the substrate and the temporary fixing film from the semiconductor chip;

(5) a process of forming a rewiring forming layer as an insulating layer on the surface of the semiconductor chip from which the substrate and the temporary fixing film have been peeled off; and (6) a process of forming a rewiring layer as a conductive layer on the rewiring forming layer.

Because the resin composition according to the present invention can provide the insulating layer with an excellent component-embedding property, this can also be suitably used when the printed wiring board is a component-embedded circuit board.

Sheet Laminate Material

The resin composition according to the present invention may be used in the state of a varnish at the time of application, but for an industrial use, it is generally suitable to use in the form of a sheet-like laminate material containing this resin composition.

As for the sheet-like laminate material, the resin sheet and the prepreg that are described later are preferable.

In one embodiment, the resin sheet is formed of a support and a resin composition layer formed on the support, in which the resin composition layer is formed from the resin composition according to the present invention.

From the viewpoint of reducing the thickness in the printed wiring board and of providing a cured product having excellent insulation properties even when the cured product of the resin composition is a thin film, the thickness of the resin composition layer is preferably 50 μm or less, and more preferably 40 μm or less. There is no particular restriction in the lower limit of the thickness of the resin composition; in general, this may be 5 μm or more, 10 μm or more, or the like.

Illustrative examples of the support include a film formed of a plastic material, metal foil, and releasing paper. Among these, a film formed of a plastic material and metal foil are preferable.

When the film formed of a plastic material is used as the support, illustrative examples of the plastic material include polyesters such as polyethylene terephthalate (hereinafter, sometimes this is simply referred to as "PET") and polyethylene naphthalate (hereinafter, sometimes this is simply referred to as "PEN"); polycarbonate (hereinafter, sometimes this is simply referred to as "PC"); acrylic polymers such as polymethyl methacrylate (PMMA); a cyclic polyolefin; triacetyl cellulose (TAC); polyether sulfide (PES); polyether ketone; and polyimide. Among these, polyethylene terephthalate and polyethylene naphthalate are preferable, and inexpensive polyethylene terephthalate is especially preferable.

In the case that metal foil is used as the support, illustrative examples of the metal foil include copper foil and aluminum foil, and copper foil is preferable. As for the copper foil, foil formed of a copper single metal or foil formed of an alloy of copper with other metals (for example, tin, chromium, silver, magnesium, nickel, zirconium, silicon, and titanium) may be used.

The support may be subjected to a mat treatment, a corona treatment, or an antistatic treatment on the surface to be bonded with the resin composition layer.

As for the support, a releasing layer-attached support having a releasing layer on the surface to be bonded with the resin composition layer may be used. The releasing agent to be used in the releasing layer of the releasing layer-attached support may be one or more releasing agents selected from the group consisting of an alkyd resin, a polyolefin resin, a urethane resin, and a silicone resin, for example. A commercially available product may also be used as the releasing layer-attached support. Illustrative examples thereof include a PET film having a releasing layer formed of mainly an alkyd resin type releasing agent, such as "SK-1", "AL-5", and "AL-7", which are manufactured by Lintech Corp.; "Lumirror T60" manufactured by Toray Industries, Inc.; "Purex" manufactured by Teijin Ltd.; and "Unipeel" manufactured by Unitika Ltd.

Although there is no particular restriction in the thickness of the support, this is preferably in the range of 5 μm to 75 μm, and more preferably in the range of 10 μm to 60 μm. When the releasing layer-attached support is used, the total thickness of the releasing layer-attached support is preferably within the above-mentioned range.

In one embodiment, the resin sheet may further include an arbitrary layer as needed. An example of the arbitrary layer like this may be a protective film, which is suitable for the support, that is formed on the surface of the resin composition layer not bonded to the support (namely, on the surface opposite to the support). There is no particular restriction in the thickness of the protective film; this is, for example, in the range of 1 μm to 40 μm. By laminating the protection film, attachment of dirt and the like as well as a scar on the surface of the resin composition layer may be prevented.

The resin sheet may be produced, for example, by applying a liquid (in the form of varnish) resin composition as-is or a resin liquid (in the form of varnish) prepared by dissolving the resin composition in an organic solvent to a support by using a die coater or the like, which is then followed by forming the resin composition layer by drying.

As for the organic solvent, those similar to the organic solvents that have been described as the component of the resin composition may be used. The organic solvent may be used singly or as a combination of two or more.

Drying may be carried out by a known method such as heating and blowing of a hot air. The drying condition is not particularly restricted. Drying is carried out in such a way as to bring the content of the organic solvent in the resin composition layer to 10% by mass or less and preferably to 5% by mass or less. For example, when the resin composition containing 30 to 60% by mass of organic solvent is used, the resin composition layer may be formed, for example, by drying at 50 to 150° C. for the period of 3 to 10 minutes, but these conditions vary depending on the boiling point of the organic solvent used in the resin composition.

The resin sheet may be rolled up so as to be stored. When the resin sheet has the protection film, the resin sheet can be used by removing the protection film.

In one embodiment, a prepreg is formed by impregnating the resin composition according to the present invention into a sheet-like fiber substrate.

There is no particular restriction in the sheet-like fiber substrate to be used for a prepreg; herein, a substrate generally used for a prepreg, such as glass cloth, an aramid non-woven fabric, a liquid crystal polymer non-woven fabric, or the like, may be used. From the viewpoint of decreasing the thickness of a printed wiring board, the thickness of the sheet-like fiber substrate is preferably 50 μm or less, more preferably 40 μm or less, still more preferably 30 μm or less, and especially preferably 20 μm or less. There is no particular restriction in the lower limit of the thickness of the sheet-like fiber substrate. Usually, the thickness is 10 μm or more.

The prepreg may be produced by a known method such as a hot-melting method or a solvent method.

The thickness of the prepreg may be in the same range as that of the resin composition layer in the resin sheet described above.

The sheet-like laminate material according to the present invention may be preferably used to form an insulating layer of a printed wiring board (for insulating layer of a printed wiring board) and more preferably to form an interlayer insulating layer of a printed wiring board (for interlayer insulating layer of a printed wiring board).

Printed Wiring Board

The printed wiring board according to the present invention includes an insulating layer composed of a cured product obtained by curing the resin composition according to the present invention.

The printed wiring board may be produced, for example, by the method including the processes (I) and (II) described below using the resin sheet described above.

(I) A process of laminating the resin sheet on an inner layer substrate such that the resin composition layer of the resin sheet may be bonded to the inner layer substrate.

(II) A process of forming an insulating layer by curing (e.g., thermosetting) the resin composition layer.

The "inner layer substrate" used at the process (I) is a member that is the substrate for a printed wiring board; and illustrative examples thereof include a glass epoxy substrate, a metal substrate, a polyester substrate, a polyimide substrate, a BT resin substrate, and a thermosetting type polyphenylene ether substrate. This substrate may have a conductive layer on one or both sides thereof. Herein, the conductive layer may be patterned. The inner layer substrate having the conductive layer (circuit) formed on one or both sides of the substrate is sometimes referred to as an "inner layer circuit board". An intermediate product to which an insulating layer and/or a conductive layer is/are to be further formed at the time when producing a printed wiring board is also included in the "inner layer substrate" that is referred to in the present invention. In the case when the printed wiring board is a circuit board having a built-in component, an inner layer substrate having a built-in component may be used.

Lamination of the inner layer substrate with the resin sheet may be conducted, for example, by hot-pressing of the resin sheet to the inner layer substrate from the side of the support. Illustrative examples of the member for hot-pressing of the resin sheet to the inner layer substrate (hereinafter, this member is sometimes referred to as "hot-pressing member") include a heated metal plate (SUS mirror plate and the like) and a heated metal roll (SUS roll). Herein, it is preferable that the hot-pressing member be not pressed directly to the resin sheet but be pressed via an elastic material such as a heat-resistant rubber in order that the resin sheet well follows the surface irregularity of the inner layer substrate.

Lamination of the inner layer substrate with the resin sheet may be conducted by a vacuum lamination method. The temperature of the hot-pressing in the vacuum lamination method is preferably in the range of 60° C. to 160° C., and more preferably in the range of 80° C. to 140° C.; and the pressure at the time of the hot-pressing is preferably in the range of 0.098 MPa to 1.77 MPa, and more preferably in the range of 0.29 MPa to 1.47 MPa; and the period at the time of the hot-pressing is preferably in the range of 20 seconds to 400 seconds, and more preferably in the range of 30 seconds to 300 seconds. The lamination may be carried out under a reduced pressure, preferably 26.7 hPa or less.

The lamination may be carried out by using a commercially available laminator. Illustrative examples of the commercially available vacuum laminator include a vacuum pressing type laminator manufactured by Meiki Co., Ltd., and a vacuum applicator and a batch type vacuum pressing laminator manufactured by Nikko-Materials Co., Ltd.

After the lamination, the laminated resin sheet may be flattened by pressing the hot-pressing member from the side of the support under a normal pressure (under an atmospheric pressure). The pressing conditions at the flattening process may be the same as the hot-pressing condition in the before-mentioned lamination. The flattening process may be carried out by using a commercially available laminator. The lamination and the flattening processes may be carried out continuously by using the commercially available vacuum laminator described before.

The support may be removed between the process (I) and the process (II), or after the process (II).

At the process (II), the resin composition layer is cured (e.g., thermally cured) to form an insulating layer composed of a cured product of the resin composition. There is no particular restriction in the curing condition of the resin composition layer; herein, the conditions generally used in formation of the insulating layer in a printed wiring board may be used.

The condition for thermal curing of the resin composition layer varies depending on the type of the resin composition and so forth; for example, in one embodiment, the curing temperature is preferably 120° C. to 240° C., more preferably 150° C. to 220° C., and still more preferably 170° C. to 210° C. The curing time may be preferably 5 to 120 minutes, more preferably 10 to 100 minutes, and still more preferably 15 to 100 minutes.

Before thermally curing the resin composition layer, the resin composition layer may be preheated at a temperature lower than the curing temperature. For example, before thermally curing the resin composition layer, the resin composition layer may be preliminarily heated at 50° C. to 120° C., preferably 60° C. to 115° C., and more preferably 70° C. to 110° C., and for the period of 5 minutes or longer, preferably 5 to 150 minutes, more preferably 15 to 120 minutes, and still more preferably 15 to 100 minutes.

In production of a printed wiring board, (III) a process of drilling a hole in the insulating layer, (IV) a process of roughening the insulating layer, and (V) a process of forming a conductive layer may be further carried out. These processes (III) through (V) may be carried out by any method known to a person ordinarily skilled in the art for production of a printed wiring board. In the case where the support is removed after the process (II), the removal of the support may be carried out between the process (II) and the process (III), between the process (III) and the process (IV), or between the process (IV) and the process (V). When necessary, formation of the insulating layer and the conductive layer in the processes (II) through (V) may be repeated to form a multilayered wiring board.

In another embodiment, the printed wiring board according to the present invention may be produced using the prepreg described above. The production method thereof is basically the same as those used in production of the resin sheet.

The process (III) is the process of drilling a hole in the insulating layer, by which a via hole, a through hole, and the like are formed in the insulating layer. The process (III) may be carried out by using, for example, a drilling method, a laser method, a plasma method, or the like, in accordance with the composition of the resin composition that is used to form the insulating layer and the like. The size and shape of the hole may be determined as appropriate in accordance with a design of the printed wiring board.

The process (IV) is the process of roughening the insulating layer. Usually, a smear is also removed at this process (IV). There is no particular restriction in the procedure and condition at the roughening process; for example, known procedures and conditions that are usually used in formation of the insulating layer of a printed wiring board may be used. The insulating layer may be roughened by carrying out, for example, a swelling treatment using a swelling liquid, a roughening treatment using an oxidant, and a neutralizing treatment using a neutralizing solution in this order.

There is no particular restriction in the swelling liquid to be used at the roughening process; herein, examples thereof include an alkali solution and a surfactant solution, of these, an alkali solution is preferable, and further, a sodium hydroxide solution and a potassium hydroxide solution are more preferable as the alkali solution. Illustrative examples of the swelling liquid that is commercially available include "Swelling Dip Securiganth P" and "Swelling Dip Securiganth SBU", which are both manufactured by Atotech Japan K.K. There is no particular restriction in the swelling treatment with the swelling liquid; for example, this may be carried out by immersing the insulating layer into the swelling liquid at 30° C. to 90° C. for the period of 1 to 20 minutes. From the viewpoint of suppressing swelling of the resin in the insulating layer to a suitable level, it is preferable that the insulating layer be immersed into the swelling liquid at 40° C. to 80° C. for the period of 5 to 15 minutes.

There is no particular restriction in the oxidant to be used in the roughening treatment; herein, illustrative examples thereof include an alkaline permanganate solution having potassium permanganate or sodium permanganate dissolved into an aqueous sodium hydroxide solution. The roughening treatment using the oxidant such as the alkaline permanganate solution may be carried out preferably by immersing the insulating layer into the oxidant solution heated at 60° C. to 100° C. for the period of 10 to 30 minutes. The concentration of the permanganate salt in the alkaline permanganate solution is preferably 5 to 10% by mass. Illustrative examples of the oxidant that is commercially available include alkaline permanganate solutions such as "Concentrate Compact CP" and "Dosing Solution Securiganth P", which are both manufactured by Atotech Japan K.K.

Illustrative examples of the commercially available neutralizing solution to be used for the roughening treatment include "Reduction Solution Securiganth P", which is manufactured by Atotech Japan K.K.

The treatment with the neutralizing solution may be carried out by immersing the surface, which has been treated with the roughening treatment using the oxidant, into the neutralizing solution at 30° C. to 80° C. for the period of 5 to 30 minutes. From the viewpoint of workability and the like, it is preferable to immerse the subject, which has been treated with the roughening process using the oxidant, in the neutralizing solution at 40° C. to 70° C. for the period of 5 to 20 minutes.

In one embodiment, there is no particular restriction in the arithmetic average roughness (Ra) of the surface of the insulating layer after the roughening treatment; herein, the roughness is preferably 500 nm or less, more preferably 400 nm or less, and still more preferably 300 nm or less. There is no particular restriction in the lower limit thereof; for example, this may be 1 nm or more, or 2 nm or more. The root mean square roughness (Rq) of the surface of the insulating layer after the roughening treatment is preferably 500 nm or less, more preferably 400 nm or less, and still more preferably 300 nm or less. There is no particular restriction in the lower limit thereof; for example, this may be 1 nm or more, or 2 nm or more. The arithmetic average roughness (Ra) and the root mean square roughness (Rq) of the surface of the insulating layer may be measured by using a non-contact type surface roughness meter.

The process (V) is the process of forming a conductive layer, at which a conductive layer is formed on the insulating layer. There is no particular restriction in the conductive material to be used in the conductive layer. In a preferred embodiment, the conductive layer includes one or more metals selected from the group consisting of gold, platinum, palladium, silver, copper, aluminum, cobalt, chromium, zinc, nickel, titanium, tungsten, iron, tin, and indium. The conductive layer may be a single metal layer or an alloy layer. The alloy layer is, for example, a layer formed from an alloy of two or more metals selected from the group described above (e.g., a nickel-chromium alloy, a copper-nickel alloy, and a copper-titanium alloy). Among these, in view of general applicability in formation of the conductive layer, cost, easiness in patterning, and the like, preferably usable are single metal layers of chromium, nickel, titanium, aluminum, zinc, gold, palladium, silver, or copper, as well as alloy layers of a nickel-chromium alloy, a copper-nickel alloy, or a copper-titanium alloy; more preferable are single metal layers of chromium, nickel, titanium, aluminum, zinc, gold, palladium, silver, or copper, as well as alloy layers of a nickel-chromium alloy; still more preferable is a single metal layer of copper.

The conductive layer may be any of a monolayer structure and a multilayer structure in which two or more single metal layers or alloy layers formed of different metals or alloys are laminated. When the conductive layer has the multilayer structure, the layer in contact with the insulating layer is preferably a single metal layer of chromium, zinc, or titanium, or an alloy layer of a nickel-chromium alloy.

The thickness of the conductive layer is generally in the range of 3 μm to 35 μm, and preferably in the range of 5 μm to 30 μm, but this varies depending on the intended design of the printed wiring board.

In one embodiment, the conductive layer may be formed by plating. For example, the conductive layer having an intended wiring pattern may be formed by plating the surface of the insulating layer using a conventionally known technique such as a semi-additive method and a full-additive method. From the viewpoint of simplicity in production thereof, it is preferable to form the conductive layer by a semi-additive method. Hereinafter, an example of forming the conductive layer by a semi-additive method will be described.

First, a plating seed layer is formed on the surface of the insulating layer by an electroless plating. Next, on the formed plating seed layer a mask pattern is formed to expose a part of the plating seed layer correspondingly to the intended wiring pattern. After forming a metal layer on the exposed plating seed layer by an electrolytic plating, the mask pattern is removed. Then, an unnecessary plating seed layer is removed by etching or the like, so that the conductive layer having the intended wiring pattern can be formed.

In another embodiment, the conductive layer may be formed using metal foil. When metal foil is used to form the conductive layer, it is preferable to carry out the process (V) between the process (I) and the process (II). For example, after the process (I), the support is removed, and then, metal foil is laminated on the surface of the exposed resin composition layer. Lamination of the resin composition layer with the metal foil may be carried out by a vacuum lamination method. The conditions for lamination may be the same as those described for the process (I). Next, the process (II) is carried out to form the insulating layer. Then, by using the metal foil on the insulating layer, the conductive layer having the intended wiring pattern can be formed by a conventional known technique such as a subtractive method or a modified semi-additive method.

The metal foil may be produced, for example, by a known method such as an electrolysis method or a rolling method. Illustrative examples of the commercially available metal foil include HLP foil and JXUT-III foil manufactured by JX Nippon Mining & Metals Corp., and 3EC-III foil and TP-III foil manufactured by Mitsui Mining & Smelting Co., Ltd.

Semiconductor Device

The semiconductor device according to the present invention includes the printed wiring board according to the present invention. The semiconductor device according to the present invention can be produced using the printed wiring board according to the present invention.

Examples of the semiconductor device include various semiconductor devices that are used in electric products (for example, a computer, a cell phone, a digital camera, and a television), and vehicles (for example, a motor bike, an automobile, a train, a marine ship, and an airplane), and so forth.

Other features of the invention will become apparent in the course of the following descriptions of exemplary embodiments which are given for illustration of the invention and are not intended to be limiting thereof.

EXAMPLES

In the description below, “part” and “%” that describe quantities mean “part by mass” and “% by mass”, respectively, unless otherwise specifically mentioned. In the case that temperature is not particularly specified, the temperature condition is room temperature (23° C.), and in the case that pressure is not particularly specified, the pressure condition is an atmospheric pressure (1 atm).

Synthesis Example 1

(S1)

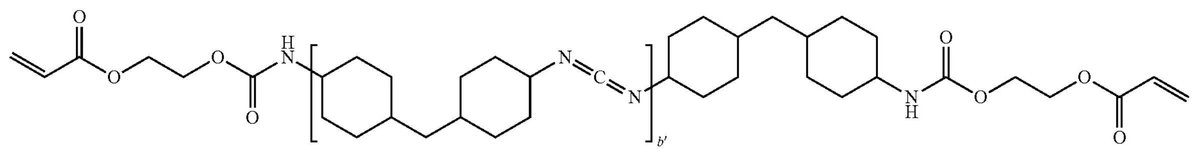

100 parts by mass of dicyclohexylmethane-4,4'-diisocyanate (HMDI) and 0.5 parts by mass of 3-methyl-1-phenyl-2-phospholene-1-oxide as a carbodiimidation catalyst were charged into a reaction vessel equipped with a reflux tube and a stirrer, and then the carbodiimidation reaction was carried out with stirring and mixing for 24 hours under a stream of nitrogen at 185° C. to obtain an isocyanate-terminated polycarbodiimide. In the obtained isocyanate-terminated polycarbodiimide, an absorption peak due to the carbodiimide group was confirmed at a wavelength of around 2150 $cm^{-1}$ by the IR spectrum measurement. The amount of the terminal NCO was 8.19% by mass, and the average degree of polymerization of the carbodiimide group was 3.5, as determined by the above measurement method.

Next, 8.8 parts by mass of ethyleneglycol monoacrylate was added to the resulting isocyanate-terminated polycarbodiimide at 150° C. under a nitrogen stream; then, they were heated to 180° C. to carry out the reaction for 2 hours by mixing with stirring. After confirming by IR spectrum measurement that the absorption peak due to the isocyanate group at a wavelength of 2200 to 2300 $cm^{-1}$ had disappeared, the reaction product was removed from the reaction vessel and cooled to room temperature to obtain a light yellow transparent solid polycarbodiimide compound (compound containing the radical polymerizable group having the carbodiimide structure; the main component thereof is the compound having the above formula (S1); b' means the average degree of polymerization of the carbodiimide group).

Synthesis Example 2

(S2)

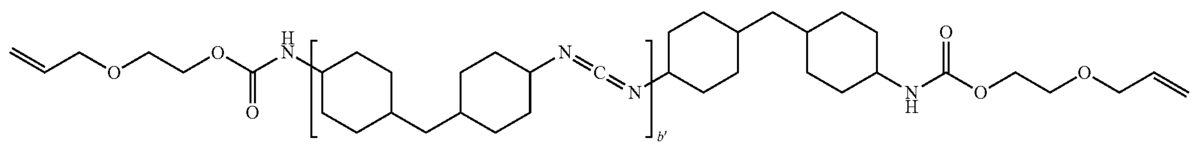

In the same manner as in Synthesis Example 1, except that ethyleneglycol monoallyl ether was used in place of ethyleneglycol monoacrylate, a solid polycarbodiimide compound (compound containing the radical polymerizable group having the carbodiimide structure; the main component thereof is the compound having the above formula (S2); b' is the same as above) was obtained.

Synthesis Example 3

(S3)

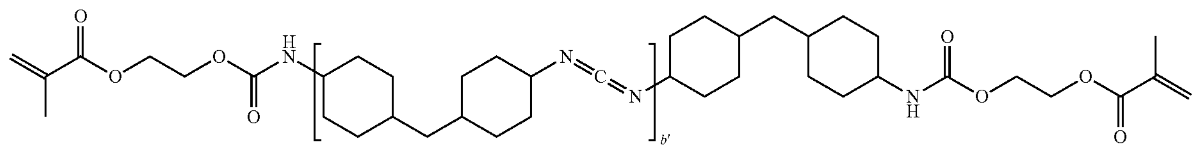

In the same manner as in Synthesis Example 1, except that ethylene glycol methacrylate was used in place of ethylene glycol monoacrylate, a solid polycarbodiimide compound (compound containing the radical polymerizable group having the carbodiimide structure; the main component thereof is the compound having the above formula (S3); b' is the same as above) was obtained.

Synthesis Example 4

(S4)

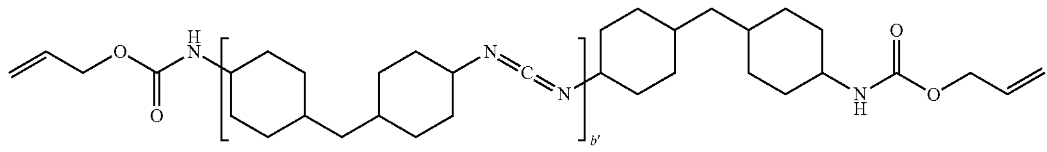

In the same manner as in Synthesis Example 1, except that ethyleneglycol monoacrylate was changed to allyl alcohol, a solid polycarbodiimide compound (compound containing the radical polymerizable group having the carbodiimide structure; main component thereof is the compound having the above formula (S4); b' is the same as above) was obtained.

Synthesis Example 5

(S5)

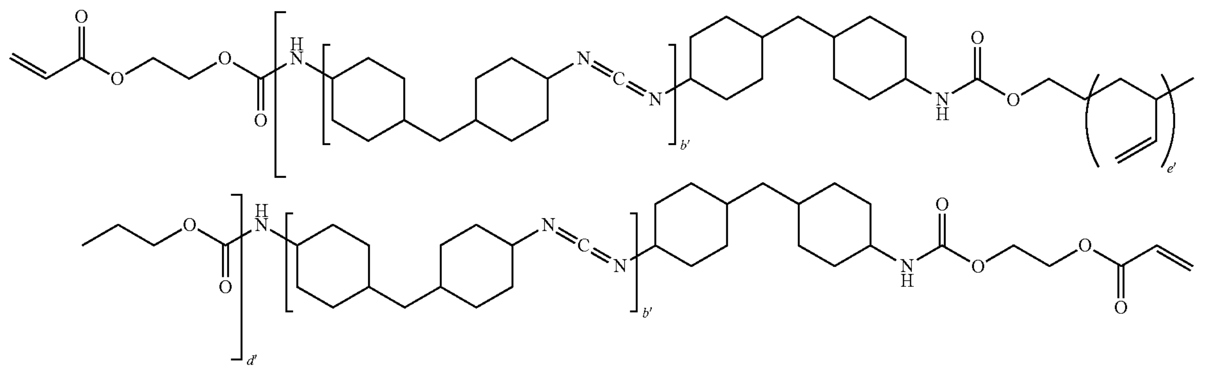

To the isocyanate-terminated polycarbodiimide obtained by the same method as in Synthesis Example 1 were added 8.8 parts by mass of ethyleneglycol monoacrylate and 4 parts by mass of polybutadiene terminated with a hydroxy group at both ends ("G-1000"; manufactured by Nippon Soda Co., Ltd.; number-average molecular weight of 1400; 1,2-addition structure unit of 85% or more; trans-1,4-addition structure unit of 15% or less); and then, they were heated to 180° C. to carry out the reaction for 2 hours with mixing by stirring. After confirming by IR spectrum measurement that the absorption peak due to the isocyanate group at a wavelength of 2200 to 2300 $cm^{-1}$ had disappeared, the reaction product was removed from the reaction vessel and cooled to room temperature to obtain a light yellow transparent solid polycarbodiimide compound (compound containing the radical polymerizable group having the carbodiimide structure; the main component thereof is the compound having the above formula (S5); b' means the same as above; d' means the average degree of polymerization of the combined unit of polybutadiene and polycarbodiimide; e' means the average degree of polymerization of the butadiene unit corresponding to the above number-average molecular weight; and only 1,2-addition structure unit is described as the e' unit, but 1,4-addition structure units (cis, trans) are also included.).

Example 1

30 parts of the multifunctional acrylate ester resin ("A-DOG"; manufactured by Shin-Nakamura Chemical Co., Ltd.; acrylic equivalent of approx. 163 g/eq.) was uniformly mixed with 20 parts of solvent naphtha at room temperature with stirring. To the resulting mixed solution was added 110 parts of spherical silica ("SO-C2"; manufactured by Admatechs Co., Ltd.; average particle diameter of 0.5 μm) surface-modified with the amino silane type coupling agent ("KBM573"; manufactured by Shin-Etsu Chemical Co., Ltd.); and this was uniformly dispersed by kneading with three rolls. To the resulting roll dispersion were added 20 parts of the phenoxy resin ("YX6954BH30"; manufactured by Mitsubishi Chemical Corp.; mixed MEK and cyclohexanone solution with 30% solid content), 46 parts of the styrene-modified polyphenylene ether resin ("OPE-2St 1200 (number-average molecular weight of 1200)"; manufactured by Mitsubishi Gas Chemical Company, Inc.; toluene solution with 65% solid content), 12 parts of the polycarbodiimide compound (obtained in Synthesis Example 1, toluene solution with 50% solid content), and 5 parts of the organic peroxide ("Perbutyl C" manufactured by NOF Corp., MEK solution with 20% solid content); then, the resulting mixture was uniformly dispersed with a high-speed rotary mixer to prepare the resin composition in the form of varnish.

Comparative Example 1

The resin composition in the form of varnish was prepared by the same manner as in Example 1, except that in place of 12 parts of the polycarbodiimide compound (synthesized in Synthesis Example 1; toluene solution with 50% solid content), 12 parts of the polycarbodiimide compound ("V-03"; manufactured by Nisshinbo Chemical Inc.; toluene solution with 50% solid content) was used.

Test Example 1: Measurement of Copper Plating Peel Strength after HAST Test (1) Preparation of Resin Sheet A PET film attached with an alkyd resin release layer ("AL5"; manufactured by Lintec Corp.; thickness of 38 μm) was prepared as the support. Each of the resin compositions prepared in Examples and Comparative Examples was uniformly applied onto the release layer of the support such that the thickness of the resin composition layer after drying became 40 μm, which was then followed by drying at 80 to 120° C. (average of 100° C.) for 5 minutes to prepare a resin sheet.

(2) Surface Treatment of Inner Layer Circuit Board

Both sides of the copper-clad glass cloth substrate epoxy resin laminate ("R1766"; manufactured by Panasonic Corp.; copper foil thickness of 18 μm; substrate thickness of 0.8 mm) with an inner layer circuit formed were etched by 1.0 μm with "CZ8101" manufactured by MEC Co., Ltd. to roughen the copper surface.

(3) Lamination of Resin Sheet

The resin sheet having a thickness of 40 μm prepared in (1) was laminated onto both surfaces of the inner layer circuit board treated in (2) by using a batch type vacuum-pressure laminator ("CVP700"; two-stage build-up laminator manufactured by Nikko-Materials Co., Ltd.) such that the resin composition layer was bonded to the inner layer circuit board. Lamination was carried out by depressurizing over 30 seconds to bring an atmospheric pressure to 13 hPa or less, followed by press adhesion with a pressure of 0.74 MPa and a temperature of 100° C. for 30 seconds. Then, this was hot-pressed at 100° C. and at a pressure of 0.5 MPa for 60 seconds.

(4) Curing of Resin Composition

After the resin sheet having 40 μm thickness was laminated, the resin composition layer was thermally cured at 100° C. for 30 minutes, followed by 180° C. for 30 minutes to form an insulating layer. The support was then peeled off to expose the insulating layer.

(5) Roughening Treatment

The inner layer circuit board having the insulating layer exposed was immersed in the swelling liquid ("Swelling Dip Securiganth P"; manufactured by Atotech Japan K.K.; aqueous sodium hydroxide solution containing diethyleneglycol monobutyl ether) at 60° C. for 10 minutes. Then, this was immersed in the oxidant ("Concentrate Compact CP"; manufactured by Atotech Japan K.K.; aqueous solution of approx. 6% by mass potassium permanganate concentration and approx. 4% by mass sodium hydroxide concentration) at 80° C. for 20 minutes. Finally, this was immersed in the neutralizing liquid ("Reduction Solution Securiganth P"; manufactured by Atotech Japan K.K.; aqueous hydroxylamine sulfate solution) at 40° C. for 5 minutes. Then, this was dried at 80° C. for 15 minutes. The resulting substrate is referred to as "Evaluation Substrate a".

(6) Formation of Conductive Layer

In accordance with the semi-additive method, the conductive layer was formed on the roughened surface of the insulating layer of the Evaluation Substrate a. Namely, a plating process (copper plating process using the chemicals manufactured by Atotech Japan K.K.) including the processes 1 to 6 described below was performed to form the conductive layer.

1. Alkaline cleaning (cleaning and charge adjustment of the surface of the insulating layer with a via hole formed)

Cleaning was carried out at 60° C. using Cleaning Cleaner Securiganth 902 (trade name) for 5 minutes.

2. Soft etching (cleaning inside the via hole)

The etching was carried out using an aqueous sulfonic acidic sodium peroxobisulfate solution at 30° C. for 1 minute.

3. Pre-dipping (adjustment of the charge on the surface of the insulating layer for Pd imposition)

This was carried out using Pre Dip Neoganth B (trade name) at room temperature for 1 minute.

4. Activator imposition (imposition of Pd on the surface of the insulating layer)

This was carried out using Activator Neoganth 834 (trade name) at 35° C. for 5 minutes.

5. Reduction (reduction of Pd imparted on the insulating layer)

This was carried out using a mixture of Reducer Neoganth WA (trade name) and Reducer Accelerator 810 mod. (trade name) at 30° C. for 5 minutes.

6. Electroless copper plating process (Cu is deposited on the surface of the insulating layer (Pd surface))

This was carried out using Basic Solution Printganth MSK-DK (trade name), Copper solution Printganth MSK (trade name), Stabilizer Printganth MSK-DK (trade name), and Reducer Cu (trade name) at 35° C. for 30 minutes. The thickness of the electroless copper plating layer formed was 1 μm.

(7) Annealing Treatment and HAST Test

Next, after annealing by heating at 150° C. for 30 minutes, an etching resist was formed, and a pattern was formed by etching. Then, the copper sulfate electrolytic plating was carried out using the chemicals manufactured by Atotech Japan K.K. to form a conductive layer having a thickness of 25 μm, and then the annealing treatment was carried out at 200° C. for 60 minutes. Then, the Evaluation Substrate a was placed at the temperature of 130° C. and the humidity of 85% RH for 100 hours for the ultra-accelerated high temperature and high humidity life test (HAST test). The resulting substrate is referred to as "Evaluation Substrate b".

(8) Measurement of Copper Plating Peel Strength

The post-HAST plating peel strength of the insulating layer and the conductive layer was measured as to the Evaluation Substrate b after the HAST test in accordance with the Japanese Industrial Standard (JIS C6481). Specifically, the peel strength (copper plating peel strength) was determined by making a cut with 10 mm wide and 100 mm long in the conductive layer of the Evaluation Substrate b, followed by peeling off one end of the cut and grabbing it with a gripping tool, and then measuring the load (kgf/cm) when peeling off by 35 mm in a vertical direction at a peeling speed of 50 mm/min at room temperature. A tensile tester ("AC-50C-SL" manufactured by TSE Co., Ltd.) was used for the measurement.

Test Example 2: Measurement of Elongation at Break Point

The resin sheet having a thickness of 40 μm prepared in the same manner as in Test Example 1 (1) was thermally cured by heating at 200° C. for 90 minutes, and then the support was peeled off. The cured material thereby obtained is referred to as "Cured Product for Evaluation c". The Cured Product for Evaluation c was subjected to a tensile test using a Tensilon universal testing machine ("RTC-1250A" manufactured by Orientec Co., Ltd.) in accordance with the Japanese Industrial Standard (JIS K7127) to measure the elongation (%) at a breaking point.

Test Example 3: Measurement of Dielectric Dissipation Factor

Cured Product for Evaluation c obtained by the same manner as in Test Example 2 was cut into the test piece with 2 mm wide and 80 mm long. The dielectric dissipation factor of the test piece was measured by the cavity resonance perturbation method using "HP8362B" manufactured by Agilent Technologies, Inc. at a measurement frequency of 5.8 GHz and a measurement temperature of 23° C. Measurement was made on two test pieces, and the average value thereof was calculated.

The resin compositions of Example 1 and Comparative Example 1 were measured as to the copper plating peel strength, the elongation at a breaking point, and the dielectric dissipation factor by the methods described in Test Examples 1 to 3 above. The contents of the nonvolatile components in the resin compositions of Example 1 and Comparative Example 1, as well as the measurement results of Test Examples 1 to 3 are summarized in Table 1 below.

TABLE 1

| | | | | Example 1 | Comparative Example 1 |
|---|---|---|---|---|---|
| Amount of nonvolatile component (parts by mass) | (A) | Compound containing radical polymerizable group having carbodiimide structure | Synthesis Example 1 | 6 | |
| | | | Synthesis Example 2 | | |
| | | | Synthesis Example 3 | | |
| | | | Synthesis Example 4 | | |
| | | | Synthesis Example 5 | | |
| | (A') | Other carbodiimide compound | V-03 | | 6 |
| | (B) | Compound containing radical polymerizable group not having carbodiimide structure | OPE-2St 1200 | 30 | 30 |
| | | | A-DOG | 30 | 30 |
| | | | SLK-6895-T90 | | |
| | | | MIR-3000-70MT | | |
| | (C1) | Epoxy resin | 828US | | |
| | | | NC3000H | | |
| | | | ESN475V | | |
| | | | YX4000HK | | |
| | (C2) | Epoxy resin curing agent | HPC-8000-65T | | |
| | | | LA3018-50P | | |
| | | | BA230S75 | | |
| | | | PT30 | | |
| | (D) | Inorganic filler | SO-C2 | 110 | 110 |
| | (E) | Thermoplastic resin | YX6954BH30 | 6 | 6 |
| | (F) | Stress relaxing material | EXL-2655 | | |
| | | | PB3600 | | |
| | (G) | Radical polymerization initiator | Perbutyl C | 1 | 1 |
| | (H) | Curing accelerator | DMAP | | |
| | | | Co(acac)3 | | |
| | Sum of entire nonvolatile components | | | 183 | 183 |
| Component content in resin composition | Component (A)/entire nonvolatile components (% by mass) | | | 3.3 | |
| | Component (B)/entire nonvolatile components (% by mass) | | | 32.8 | 32.8 |
| | Component (C1)/entire nonvolatile components (% by mass) | | | | |
| | Component (C2)/entire nonvolatile components (% by mass) | | | | |
| | Component (D)/entire nonvolatile components (% by mass) | | | 60.1 | 60.1 |
| Evaluation results | Elongation at breaking point (%) | | | 1.2 | 0.7 |
| | Post-HAST plating peel strength (kgf/cm) | | | 0.21 | 0.15 |
| | Dielectric dissipation factor | | | 0.0035 | 0.0035 |

It can be seen from the results in Table 1 above that when the resin composition including (A) the compound containing the radical polymerizable group having the carbodiimide structure and (B) the compound containing the radical polymerizable group not containing the carbodiimide structure are used, the cured product having the mechanical strength and the plating adhesion property superior to the cured product obtained by using the resin composition not including the component (A) can be obtained.

Example 2

25 parts of the bisphenol A type epoxy resin ("828US"; manufactured by Mitsubishi Chemical Corp.; epoxy equivalent of approx. 180 g/eq.) and 25 parts of the biphenyl type epoxy resin ("NC3000H"; manufactured by Nippon Kayaku Co., Ltd.; epoxy equivalent of approx. 269 g/eq.) were heated and dissolved in 50 parts of solvent naphtha with stirring, then cooled to room temperature. To the resulting mixed solution was added 270 parts of spherical silica ("SO-C2"; manufactured by Admatechs Co., Ltd.; average particle diameter of 0.5 μm) surface-modified with the amino silane type coupling agent ("KBM573"; manufactured by Shin-Etsu Chemical Co., Ltd.); and then this was uniformly dispersed by kneading with three rolls. To the resulting roll dispersion were added 14 parts of the phenol type curing agent containing a triazine skeleton ("LA-3018-50P"; manufactured by DIC Corp.; hydroxy equivalent of approx. 151 g/eq.; 1-methoxy-2-propanol solution with 50% solid content), 40 parts of the active ester compound ("HPC-8000-65T"; manufactured by DIC Corp.; active group equivalent of approx. 223 g/eq., toluene solution with 65% by mass of nonvolatile content), 20 parts of the phenoxy resin ("YX6954BH30"; manufactured by Mitsubishi Chemical Corp.; mixed solution of MEK and cyclohexanone with 30% solid content), 15.4 parts of the styrene-modified polyphenylene ether resin ("OPE-2St 1200 (number-average molecular weight of 1200)"; manufactured by Mitsubishi Gas Chemical Company, Inc.; toluene solution with 65% solid content), 12 parts of the polycarbodiimide compound (obtained in Synthesis Example 1; toluene solution with 50% solid content), 6 parts of the curing accelerator ("DMAP"; 4-dimethylaminopyridine, MEK solution with 5% solid content), and 5 parts of the organic peroxide ("Perbutyl C"; manufactured by NOF Corp.; MEK solution with 20% solid content); and then, the resulting mixture was uniformly dispersed with a high-speed rotary mixer to prepare the resin composition in the form of varnish.

Example 3

The resin composition in the form of varnish was prepared in the same manner as in Example 2, except that in place of 12 parts of the polycarbodiimide compound (synthesized in Synthesis Example 1; toluene solution with 50% solid content), 12 parts of the polycarbodiimide compound (synthesized in Synthesis Example 2; toluene solution with 50% solid content) was used.

Example 4

The resin composition in the form of varnish was prepared in the same manner as in Example 2, except that in place of 12 parts of the polycarbodiimide compound (synthesized in Synthesis Example 1; toluene solution with 50% solid content), 12 parts of the polycarbodiimide compound (synthesized in Synthesis Example 3; toluene solution with 50% solid content) was used.

Example 5

The resin composition in the form of varnish was prepared in the same manner as in Example 2, except that in place of 12 parts of the polycarbodiimide compound (synthesized in Synthesis Example 1; toluene solution with 50% solid content), 12 parts of the polycarbodiimide compound (synthesized in Synthesis Example 4; toluene solution with 50% solid content) was used.

Example 6

The resin composition in the form of varnish was prepared in the same manner as in Example 2, except that in place of 12 parts of the polycarbodiimide compound (synthesized in Synthesis Example 1; toluene solution with 50% solid content), 12 parts of the polycarbodiimide compound (synthesized in Synthesis Example 5; toluene solution with 50% solid content) was used.

Example 7

The resin composition in the form of varnish was prepared in the same manner as in Example 2, except that the use amount of the polycarbodiimide compound (synthesized in Synthesis Example 1; toluene solution with 50% solid content) was changed from 12 parts to 6 parts, and that 6 parts of the polycarbodiimide compound ("V-03"; manufactured by Nisshinbo Chemical Inc.; toluene solution with 50% solid content) was used.

Example 8

The resin composition in the form of varnish was prepared in the same manner as in Example 2, except that in place of 25 parts of the biphenyl type epoxy resin ("NC3000H"; manufactured by Nippon Kayaku Co., Ltd.; epoxy equivalent of approx. 269 g/eq.,), 25 parts of the naphthol type epoxy resin ("ESN475V"; manufactured by Nippon Steel Chemical & Materials Co., Ltd.; epoxy equivalent of 332 g/eq.) was used.

Example 9

The resin composition in the form of varnish was prepared in the same manner as in Example 2, except that in place of 25 parts of the biphenyl type epoxy resin ("NC3000H"; manufactured by Nippon Kayaku Co., Ltd.; epoxy equivalent of approx. 269 g/eq.,), 25 parts of the bixylenol type epoxy resin ("YX4000HK"; manufactured by Mitsubishi Chemical Corp.; epoxy equivalent of approx. 185 g/eq.) was used.

Example 10

The resin composition in the form of varnish was prepared in the same manner as in Example 2, except that in place of 15.4 parts of the styrene-modified polyphenylene ether resin ("OPE-2St 1200 (number-average molecular weight of 1200)"; manufactured by Mitsubishi Gas Chemical Company, Inc.; toluene solution with 65% solid content), 10 parts of the multifunctional acrylate ester resin ("A-DOG"; manufactured by Shin-Nakamura Chemical Co., Ltd.; acrylic equivalent of approx. 163 g/eq.) was used.

Example 11

The resin composition in the form of varnish was prepared in the same manner as in Example 2, except that in place of 15.4 parts of the styrene-modified polyphenylene ether resin ("OPE-2St 1200 (number-average molecular weight of 1200)"; manufactured by Mitsubishi Gas Chemical Company, Inc.; toluene solution with 65% solid content), 11.1 parts of the bismaleimide resin ("SLK-6895-T90"; manufactured by Shin-Etsu Chemical Co., Ltd.; maleimide equivalent of approx. 345 g/eq.; toluene solution with 90% solid content) was used.

Example 12

The resin composition in the form of varnish was prepared in the same manner as in Example 2, except that in place of 15.4 parts of the styrene-modified polyphenylene ether resin ("OPE-2St 1200 (number-average molecular weight of 1200"; manufactured by Mitsubishi Gas Chemical Company, Inc.; toluene solution with 65% solid content), 14.3 parts of the biphenyl aralkyl type polyfunctional maleimide resin ("MIR-3000-70MT"; manufactured by Nippon Kayaku Co., Ltd.; maleimide equivalent of approx. 393 g/eq., mixed solution of MEK and toluene with 70% solid content) was used.

Comparative Example 2

The resin composition in the form of varnish was prepared in the same manner as in Example 2, except that in place of 12 parts of the polycarbodiimide (synthesized in Synthesis Example 1; toluene solution with 50% solid content), 12 parts of the polycarbodiimide compound ("V-03"; manufactured by Nisshinbo Chemical Inc.; toluene solution with 50% solid content) was used.

The resin compositions of Examples 2-12 and Comparative Example 2 were measured as to the copper plating peel strength, the elongation at a break point, and the dielectric dissipation factor by the methods described in Test Examples 1 to 3 above. The contents of the nonvolatile components in the resin compositions of Examples 2 to 12 and Comparative Example 2, as well as the measurement results of Test Examples 1 to 3 are summarized in Table 2 below.

TABLE 2

| | | | | Example | | | |
|---|---|---|---|---|---|---|---|
| | | | | 2 | 3 | 4 | 5 |
| Amount of nonvolatile component | (A) | Compound containing radical polymerizable group having carbodiimide structure | Synthesis Example 1 | 6 | | | |
| | | | Synthesis Example 2 | | 6 | | |
| | | | Synthesis Example 3 | | | 6 | |

TABLE 2-continued

| | | | | | | | |
|---|---|---|---|---|---|---|---|
| (parts by mass) | | | Synthesis Example 4 | | | | 6 |
| | | | Synthesis Example 5 | | | | |
| | (A') | Other carbodiimide compound | V-03 | | | | |
| | (B) | Compound containing radical polymerizable group not having carbodiimide structure | OPE-2S, 1200 | 10 | 10 | 10 | 10 |
| | | | A-DOG | | | | |
| | | | SLK-6895-T90 | | | | |
| | | | MIR-3000-70MT | | | | |
| | (C1) | Epoxy resin | 828US | 25 | 25 | 25 | 25 |
| | | | NC3000H | 25 | 25 | 25 | 25 |
| | | | ESN475V | | | | |
| | | | YX4000HK | | | | |
| | (C2) | Epoxy resin curing agent | HPC-8000-65T | 26 | 26 | 26 | 26 |
| | | | LA3018-50P | 7 | 7 | 7 | 7 |
| | | | BA230S75 | | | | |
| | | | PT30 | | | | |
| | (D) | Inorganic filler | SO-C2 | 270 | 270 | 270 | 270 |
| | (E) | Thermoplastic resin | YX6954BH30 | 6 | 6 | 6 | 6 |
| | (F) | Stress relaxing material | EXL-2655 | | | | |
| | | | PB3600 | | | | |
| | (G) | Radical polymerization initiator | Perbutyl C | 1 | 1 | 1 | 1 |
| | (H) | Curing accelerator | DMAP | 0.3 | 0.3 | 0.3 | 0.3 |
| | | | Co(acac)3 | | | | |
| | | Sum of entire nonvolatile components | | 376.3 | 376.3 | 376.3 | 376.3 |
| Component content in resin composition | | Component (A)/entire nonvolatile components (% by mass) | | 1.6 | 1.6 | 1.6 | 1.6 |
| | | Component (B)/entire nonvolatile components (% by mass) | | 2.7 | 2.7 | 2.7 | 2.7 |
| | | Component (C1)/entire nonvolatile components (% by mass) | | 13.3 | 13.3 | 13.3 | 13.3 |
| | | Component (C2)/entire nonvolatile components (% by mass) | | 8.8 | 8.8 | 8.8 | 8.8 |
| | | Component (D)/entire nonvolatile components (% by mass) | | 71.8 | 71.8 | 71.8 | 71.8 |
| Evaluation results | | Elongation at breaking point (%) | | 2.2 | 2.3 | 2.2 | 2.3 |
| | | Post-HAST plating peel strength (kgf/cm) | | 0.31 | 0.30 | 0.31 | 0.30 |
| | | Dielectric dissipation factor | | 0.0054 | 0.0053 | 0.0054 | 0.0053 |

| | | | | Example | | | |
|---|---|---|---|---|---|---|---|
| | | | | 6 | 7 | 8 | 9 |
| Amount of nonvolatile component (parts by mass) | (A) | Compound containing radical polymerizable group having carbodiimide structure | Synthesis Example 1 | | 3 | 6 | 6 |
| | | | Synthesis Example 2 | | | | |
| | | | Synthesis Example 3 | | | | |
| | | | Synthesis Example 4 | | | | |
| | | | Synthesis Example 5 | 6 | | | |
| | (A') | Other carbodiimide compound | V-03 | | 3 | | |
| | (B) | Compound containing radical polymerizable group not having carbodiimide structure | OPE-2S, 1200 | 10 | 10 | 10 | 10 |
| | | | A-DOG | | | | |
| | | | SLK-6895-T90 | | | | |
| | | | MIR-3000-70MT | | | | |
| | (C1) | Epoxy resin | 828US | 25 | 25 | 25 | 25 |
| | | | NC3000H | 25 | 25 | | |
| | | | ESN475V | | | 25 | |
| | | | YX4000HK | | | | 25 |
| | (C2) | Epoxy resin curing agent | HPC-8000-65T | 26 | 26 | 26 | 26 |
| | | | LA3018-50P | 7 | 7 | 7 | 7 |
| | | | BA230S75 | | | | |
| | | | PT30 | | | | |
| | (D) | Inorganic filler | SO-C2 | 270 | 270 | 270 | 270 |
| | (E) | Thermoplastic resin | YX6954BH30 | 6 | 6 | 6 | 6 |
| | (F) | Stress relaxing material | EXL-2655 | | | | |
| | | | PB3600 | | | | |
| | (G) | Radical polymerization initiator | Perbutyl C | 1 | 1 | 1 | 1 |
| | (H) | Curing accelerator | DMAP | 0.3 | 0.3 | 0.3 | 0.3 |
| | | | Co(acac)3 | | | | |
| | | Sum of entire nonvolatile components | | 376.3 | 376.3 | 376.3 | 376.3 |
| Component content in resin composition | | Component (A)/entire nonvolatile components (% by mass) | | 1.6 | 0.8 | 1.6 | 1.6 |
| | | Component (B)/entire nonvolatile components (% by mass) | | 2.7 | 2.7 | 2.7 | 2.7 |
| | | Component (C1)/entire nonvolatile components (% by mass) | | 13.3 | 13.3 | 13.3 | 13.3 |
| | | Component (C2)/entire nonvolatile components (% by mass) | | 8.8 | 8.8 | 8.8 | 8.8 |
| | | Component (D)/entire nonvolatile components (% by mass) | | 71.8 | 71.8 | 71.8 | 71.8 |
| Evaluation results | | Elongation at breaking point (%) | | 2.5 | 2.0 | 2.0 | 2.2 |
| | | Post-HAST plating peel strength (kgf/cm) | | 0.33 | 0.28 | 0.24 | 0.35 |
| | | Dielectric dissipation factor | | 0.0053 | 0.0053 | 0.0047 | 0.0057 |

TABLE 2-continued

| | | | | Example | | | Comparative Example |
|---|---|---|---|---|---|---|---|
| | | | | 10 | 11 | 12 | 2 |
| Amount of nonvolatile component (parts by mass) | (A) | Compound containing radical polymerizable group having carbodiimide structure | Synthesis Example 1 | 6 | 6 | 6 | |
| | | | Synthesis Example 2 | | | | |
| | | | Synthesis Example 3 | | | | |
| | | | Synthesis Example 4 | | | | |
| | | | Synthesis Example 5 | | | | |
| | (A') | Other carbodiimide compound | V-03 | | | | 6 |
| | (B) | Compound containing radical polymerizable group not having carbodiimide structure | OPE-2St 1200 | | | | 10 |
| | | | A-DOG | 10 | | | |
| | | | SLK-6895-T90 | | 10 | | |
| | | | MIR-3000-70MT | | | 10 | |
| | (C1) | Epoxy resin | 828US | 25 | 25 | 25 | 25 |
| | | | NC3000H | 25 | 25 | 25 | 25 |
| | | | ESN475V | | | | |
| | | | YX4000HK | | | | |
| | (C2) | Epoxy resin curing agent | HPC-8000-65T | 26 | 26 | 26 | 26 |
| | | | LA3018-50P | 7 | 7 | 7 | 7 |
| | | | BA230S75 | | | | |
| | | | PT30 | | | | |
| | (D) | Inorganic filler | SO-C2 | 270 | 270 | 270 | 270 |
| | (E) | Thermoplastic resin | YX6954BH30 | 6 | 6 | 6 | 6 |
| | (F) | Stress relaxing material | EXL-2655 | | | | |
| | | | PB3600 | | | | |
| | (G) | Radical polymerization initiator | Perbutyl C | 1 | 1 | 1 | 1 |
| | (H) | Curing accelerator | DMAP | 0.3 | 0.3 | 0.3 | 0.3 |
| | | | Co(acac)3 | | | | |
| | Sum of entire nonvolatile components | | | 376.3 | 376.3 | 376.3 | 376.3 |
| Component content in resin composition | Component (A)/entire nonvolatile components (% by mass) | | | 1.6 | 1.6 | 1.6 | |
| | Component (B)/entire nonvolatile components (% by mass) | | | 2.7 | 2.7 | 2.7 | 2.7 |
| | Component (C1)/entire nonvolatile components (% by mass) | | | 13.3 | 13.3 | 13.3 | 13.3 |
| | Component (C2)/entire nonvolatile components (% by mass) | | | 8.8 | 8.8 | 8.8 | 8.8 |
| | Component (D)/entire nonvolatile components (% by mass) | | | 71.8 | 71.8 | 71.8 | 71.8 |
| Evaluation results | Elongation at breaking point (%) | | | 1.8 | 3.0 | 2.4 | 1.4 |
| | Post-HAST plating peel strength (kgf/cm) | | | 0.29 | 0.43 | 0.35 | 0.18 |
| | Dielectric dissipation factor | | | 0.0059 | 0.0050 | 0.0056 | 0.0053 |

It can be seen from the results in Table 2 above that when the resin composition including (A) the compound containing the radical polymerizable group containing the carbodiimide structure, and (B) the compound containing the radical polymerizable group not containing the carbodiimide structure or (C) the thermosetting resin are used, the cured product having the mechanical strength and the plating adhesion property superior to the cured product obtained by using the resin composition not including the component (A) can be obtained.

Example 13

25 parts of the bisphenol A type epoxy resin ("828US"; manufactured by Mitsubishi Chemical Corp.; epoxy equivalent of approx. 180 g/eq.) and 25 parts of the biphenyl type epoxy resin ("NC3000H"; manufactured by Nippon Kayaku Co., Ltd.; epoxy equivalent of approx. 269 g/eq.) were heated and dissolved in 50 parts of solvent naphtha with stirring, then cooled to room temperature. To the resulting mixed solution were added 270 parts of spherical silica ("SO-C2"; manufactured by Admatechs Co., Ltd.; average particle diameter of 0.5 μm) surface-modified with the amino silane type coupling agent ("KBM573" manufactured by Shin-Etsu Chemical Co., Ltd.) and 3 parts of methacryl butadiene styrene rubber particles ("EXL-2655"; manufactured by Dow Chemical Japan, Ltd.); and then, they were uniformly dispersed by kneading with three rolls. To the resulting roll dispersion were added 14 parts of the phenol type curing agent containing a triazine skeleton ("LA-3018-50P"; manufactured by DIC Corp.; hydroxy equivalent of approx. 151 g/eq.; 1-methoxy-2-propanol solution with 50% solid content), 40 parts of the active ester compound ("HPC-8000-65T"; manufactured by DIC Corp.; active group equivalent of approx. 223 g/eq., toluene solution with 65% by mass of nonvolatile content), 20 parts of the phenoxy resin ("YX6954BH30"; manufactured by Mitsubishi Chemical Corp.; mixed solution of MEK and cyclohexanone with 30% solid content), 15.4 parts of the styrene-modified polyphenylene ether resin ("OPE-2St 1200 (number-average molecular weight of 1200)"; manufactured by Mitsubishi Gas Chemical Company, Inc.; toluene solution with 65% solid content), 12 parts of the polycarbodiimide compound (obtained in Synthesis Example 1; toluene solution with 50% solid content), 6 parts of the curing accelerator ("DMAP"; 4-dimethylaminopyridine, MEK solution with 5% solid content), and 5 parts of the organic peroxide ("Perbutyl C"; manufactured by NOF Corp.; MEK solution with 20% solid content); and then, the resulting mixture was uniformly dispersed with a high-speed rotary mixer to prepare the resin composition in the form of varnish.

Example 14

The resin composition in the form of varnish was prepared in the same manner as in Example 13, except that in place of 12 parts of the polycarbodiimide compound (synthesized in Synthesis Example 1; toluene solution with 50% solid content), 12 parts of the polycarbodiimide compound (synthesized in Synthesis Example 2; toluene solution with 50% solid content) was used.

Example 15

The resin composition in the form of varnish was prepared in the same manner as in Example 13, except that in place of 12 parts of the polycarbodiimide compound (synthesized in Synthesis Example 1; toluene solution with 50% solid content), 12 parts of the polycarbodiimide compound (synthesized in Synthesis Example 3; toluene solution with 50% solid content) was used.

Example 16

The resin composition in the form of varnish was prepared in the same manner as in Example 13, except that in place of 12 parts of the polycarbodiimide compound (synthesized in Synthesis Example 1; toluene solution with 50% solid content), 12 parts of the polycarbodiimide compound (synthesized in Synthesis Example 4; toluene solution with 50% solid content) was used.

Example 17

The resin composition in the form of varnish was prepared in the same manner as in Example 13, except that in place of 12 parts of the polycarbodiimide compound (synthesized in Synthesis Example 1; toluene solution with 50% solid content), 12 parts of the polycarbodiimide compound (synthesized in Synthesis Example 5; toluene solution with 50% solid content) was used.

Example 18

The resin composition in the form of varnish was prepared in the same manner as in Example 13, except that the amount of the polycarbodiimide compound (obtained in Synthesis Example 1, toluene solution with 50% solid content) was changed from 6 parts to 12 parts, and that 6 parts of the polycarbodiimide compound ("V-03"; manufactured by Nisshinbo Chemical Inc.; toluene solution with 50% solid content) was used.

Example 19

The resin composition in the form of varnish was prepared in the same manner as in Example 13, except that in place of 25 parts of the biphenyl type epoxy resin ("NC3000H"; manufactured by Nippon Kayaku Co., Ltd.; epoxy equivalent of approx. 269 g/eq.,), 25 parts of the naphthol type epoxy resin ("ESN475V"; manufactured by Nippon Steel Chemical & Materials Co., Ltd.; epoxy equivalent of 332 g/eq.) was used.

Example 20

The resin composition in the form of varnish was prepared in the same manner as in Example 13, except that in place of 25 parts of the biphenyl type epoxy resin ("NC3000H"; manufactured by Nippon Kayaku Co., Ltd.; epoxy equivalent of approx. 269 g/eq.,), 25 parts of the bixylenol type epoxy resin ("YX4000HK"; manufactured by Mitsubishi Chemical Corp.; epoxy equivalent of approx. 185 g/eq.) was used.

Example 21

The resin composition in the form of varnish was prepared in the same manner as in Example 13, except that the roll dispersion was prepared without adding 3 parts of the methacrylic butadiene styrene rubber particles ("EXL-2655"; manufactured by Dow Chemical Japan, Ltd.) followed by adding 3 parts of the epoxidized polybutadiene resin ("PB3600"; manufactured by Daicel Corp.; epoxy equivalent of approx. 193 g/eq.).

Example 22

The resin composition in the form of varnish was prepared in the same manner as in Example 13, except that the amount of the phenol type curing agent containing a triazine skeleton ("LA-3018-50P"; manufactured by DIC Corp.; hydroxy group equivalent of approx. 151 g/eq.; 1-methoxy-2-propanol solution with 50% solid content) was changed from 14 parts to 50 parts, and that 40 parts of the active ester compound ("HPC-8000-65T"; manufactured by DIC Corp.; active group equivalent of approx. 223 g/eq; toluene solution with 65% by mass of solid content) was not used.

Example 23

25 parts of the bisphenol A type epoxy resin ("828US"; manufactured by Mitsubishi Chemical Corp.; epoxy equivalent of approx. 180 g/eq.) and 25 parts of the biphenyl type epoxy resin ("NC3000H"; manufactured by Nippon Kayaku Co., Ltd.; epoxy equivalent of approx. 269 g/eq.) were heated and dissolved in 50 parts of solvent naphtha with stirring, then cooled to room temperature. To the resulting mixed solution were added 270 parts of spherical silica ("SO-C2"; manufactured by Admatechs Co., Ltd.; average particle diameter of 0.5 μm) surface-modified with the amino silane type coupling agent ("KBM573" manufactured by Shin-Etsu Chemical Co., Ltd.) and 3 parts of methacryl butadiene styrene rubber particles ("EXL-2655"; manufactured by Dow Chemical Japan, Ltd.); and then, they were uniformly dispersed by kneading with three rolls. To the resulting roll dispersion were added 21.5 parts of the active ester compound ("HPC-8000-65T"; manufactured by DIC Corp.; active group equivalent of approx. 223 g/eq. toluene solution with 65% by mass of nonvolatile content), 12 parts of a prepolymer of the bisphenol A dicyanate ("BA230S75"; manufactured by Lonza K.K.; cyanate equivalent of approx. 235 g/eq., MEK solution with 75% solid content), 5 parts of the phenol novolac type multifunctional cyanate ester resin ("PT30"; manufactured by Lonza K.K.; cyanate equivalent of approx. 124 g/eq.; MEK solution with 80% solid content), 20 parts of the phenoxy resin ("YX6954BH30"; manufactured by Mitsubishi Chemical Corp.; mixed MEK and cyclohexanone solution with 30% solid content), 15.4 parts of the styrene-modified polyphenylene ether resin ("OPE-2St 1200 (number average molecular weight of 1200)"; manufactured by Mitsubishi Gas Chemical Company, Inc.; toluene solution with 65% solid content), 12 parts of the polycarbodiimide compound (obtained in Synthesis Example 1, toluene solution with 50% solid content), 0.4 parts of the curing accelerator ("DMAP"; 4-dimethylaminopyridine; MEK solution with 5% solid content), 5 parts of the organic peroxide ("Perbutyl C"; manufactured by NOF Corp.; MEK solution with 20% solid content), and 4 parts of the organometallic catalyst ("Cobalt (III) Acetylacetonate"; manufactured by Tokyo Chemical Industry Co., Ltd.; MEK solution with 1% solid content); and then, they were mixed and uniformly dispersed with a high-speed rotating mixer to prepare the resin composition in the form of varnish.

Example 24

The resin composition in the form of varnish was prepared in the same manner as in Example 13, except that in place of 15.4 parts of the styrene-modified polyphenylene ether resin ("OPE-2St 1200 (number-average molecular weight of 1200)"; manufactured by Mitsubishi Gas Chemical Company, Inc.; toluene solution with 65% solid content), 11.1 parts of the bismaleimide resin ("SLK-6895-T90"; manufactured by Shin-Etsu Chemical Co., Ltd.; maleimide equivalent of approx. 345 g/eq.; toluene solution with 90% solid content) was used.

Example 25

The resin composition in the form of varnish was prepared in the same manner as in Example 13, except that in place of 15.4 parts of the styrene-modified polyphenylene ether resin ("OPE-2St 1200 (number-average molecular weight of 1200)"; manufactured by Mitsubishi Gas Chemical Company, Inc.; toluene solution with 65% solid content), 14.3 parts of the biphenyl aralkyl type polyfunctional maleimide resin ("MIR-3000-70MT"; manufactured by Nippon Kayaku Co., Ltd.; maleimide equivalent of approx. 393 g/eq.) was used.

Comparative Example 3

The resin composition in the form of varnish was prepared in the same manner as in Example 13, except that in place of 12 parts of the polycarbodiimide compound (synthesized in Synthesis Example 1; toluene solution with 50% solid content), 12 parts of the polycarbodiimide compound ("V-03"; manufactured by Nisshinbo Chemical Inc.; toluene solution with 50% solid content) was used.

Comparative Example 4

The resin composition in the form of varnish was prepared in the same manner as in Comparative Example 3, except that the styrene-modified polyphenylene ether resin ("OPE-2St 1200 (average molecular weight of 1200)"; manufactured by Mitsubishi Gas Chemical Company, Inc.) was not used.

Test Example 4: Evaluation of Crack Resistance

In accordance with JIS K 5600-5-6, cuts were made in a grid pattern on the post-roughening Evaluation Substrate a obtained in the same manner as in Test Example 1 (5); then, the presence or absence of cracks in the cured coating film was observed and evaluated by using an optical microscope. Specifically, cuts were made in a grid pattern on the cured coating film of Evaluation Substrate a at 1 mm intervals to form a total of 100 pieces of coating film, 10 pieces in the vertical direction and 10 pieces in the horizontal direction. Here, the coating film piece indicates each portion of the cured coating film demarcated by a cut. These 100 coating film pieces were observed under an optical microscope to count the number of cracked coating film pieces. The crack resistance was evaluated using the following evaluation criteria based on the percentage of the number of cracked coating film pieces to the total number of the 100 coating film pieces.

Evaluation Standard

"O": Substantially no cracks were observed in the cured coating film (less than 5%).

"Δ": A few cracks were observed in the cured coating film (5% or more to less than 15%).

"X": Many cracks were observed in the cured coating film (15% or more).

The resin compositions of Examples 13 to 25 and Comparative Examples 3 and 4 were evaluated with regard to the copper plating peel strength, the elongation at a breaking point, and the crack resistance by the methods described in Test Examples 1, 2, and 4 above. The contents of the nonvolatile components in the resin compositions of Example 13 to 25 and Comparative Examples 3 and 4, as well as the measurement results and the evaluation results of Test Examples 1, 2, and 4 are summarized in Table 3 below.

TABLE 3

| | | | | Example | | | | |
|---|---|---|---|---|---|---|---|---|
| | | | | 13 | 14 | 15 | 16 | 17 |
| Amount of nonvolatile component (parts by mass) | (A) | Compound containing radical polymerizable group having carbodiimide structure | Synthesis Example 1 | 6 | | | | |
| | | | Synthesis Example 2 | | 6 | | | |
| | | | Synthesis Example 3 | | | 6 | | |
| | | | Synthesis Example 4 | | | | 6 | |
| | | | Synthesis Example 5 | | | | | 6 |
| | (A') | Other carbodiimide compound | V-03 | | | | | |
| | (B) | Compound containing radical polymerizable group not having carbodiimide structure | OPE-2St 1200 | 10 | 10 | 10 | 10 | 10 |
| | | | A-DOG | | | | | |
| | | | SLK-6895-T90 | | | | | |
| | | | MIR-3000-70MT | | | | | |
| | (C1) | Epoxy resin | 828US | 25 | 25 | 25 | 25 | 25 |
| | | | NC3000H | 25 | 25 | 25 | 25 | 25 |
| | | | ESN475V | | | | | |
| | | | YX4000HK | | | | | |
| | (C2) | Epoxy resin curing agent | HPC-8000-65T | 26 | 26 | 26 | 26 | 26 |
| | | | LA3018-50P | 7 | 7 | 7 | 7 | 7 |
| | | | BA230S75 | | | | | |
| | | | PT30 | | | | | |
| | (D) | Inorganic filler | SO-C2 | 270 | 270 | 270 | 270 | 270 |
| | (E) | Thermoplastic resin | YX6954BH30 | 6 | 6 | 6 | 6 | 6 |
| | (F) | Stress relaxing material | EXL-2655 | 3 | 3 | 3 | 3 | 3 |
| | | | PB3600 | | | | | |
| | (G) | Radical polymerization initiator | Perbutyl C | 1 | 1 | 1 | 1 | 1 |
| | (H) | Curing accelerator | DMAP | 0.3 | 0.3 | 0.3 | 0.3 | 0.3 |
| | | | Co(acac)3 | | | | | |
| Sum of entire nonvolatile components | | | | 379.3 | 379.3 | 379.3 | 379.3 | 379.3 |

TABLE 3-continued

| | | | | | | | | |
|---|---|---|---|---|---|---|---|---|
| Component content in resin composition | | Component (A)/entire nonvolatile components (% by mass) | | 1.6 | 1.6 | 1.6 | 1.6 | 1.6 |
| | | Component (B)/entire nonvolatile components (% by mass) | | 2.6 | 2.6 | 2.6 | 2.6 | 2.6 |
| | | Component (C1)/entire nonvolatile components (% by mass) | | 13.2 | 13.2 | 13.2 | 13.2 | 13.2 |
| | | Component (C2)/entire nonvolatile components (% by mass) | | 8.7 | 8.7 | 8.7 | 8.7 | 8.7 |
| | | Component (D)/entire nonvolatile components (% by mass) | | 71.2 | 71.2 | 71.2 | 71.2 | 71.2 |
| Evaluation results | | Elongation at breaking point (%) | | 2.4 | 2.5 | 2.4 | 2.5 | 2.7 |
| | | Post-HAST plating peel strength (kgf/cm) | | 0.34 | 0.33 | 0.34 | 0.33 | 0.36 |
| | | Crack resistance | | ○ | ○ | ○ | ○ | ○ |

| | | | | Example | | | | |
|---|---|---|---|---|---|---|---|---|
| | | | | 18 | 19 | 20 | 21 | 22 |
| Amount of nonvolatile component (parts by mass) | (A) | Compound containing radical polymerizable group having carbodiimide structure | Synthesis Example 1 | 3 | 6 | 6 | 6 | 6 |
| | | | Synthesis Example 2 | | | | | |
| | | | Synthesis Example 3 | | | | | |
| | | | Synthesis Example 4 | | | | | |
| | | | Synthesis Example 5 | | | | | |
| | (A') | Other carbodiimide compound | V-03 | 3 | | | | |
| | (B) | Compound containing radical polymerizable group not having carbodiimide structure | OPE-2St 1200 | 10 | 10 | 10 | 10 | 10 |
| | | | A-DOG | | | | | |
| | | | SLK-6895-T90 | | | | | |
| | | | MIR-3000-70MT | | | | | |
| | (C1) | Epoxy resin | 828US | 25 | 25 | 25 | 25 | 25 |
| | | | NC3000H | 25 | | | 25 | 25 |
| | | | ESN475V | | 25 | | | |
| | | | YX4000HK | | | 25 | | |
| | (C2) | Epoxy resin curing agent | HPC-8000-65T | 26 | 26 | 26 | 26 | |
| | | | LA3018-50P | 7 | 7 | 7 | 7 | 25 |
| | | | BA230S75 | | | | | |
| | | | PT30 | | | | | |
| | (D) | Inorganic filler | SO-C2 | 270 | 270 | 270 | 270 | 270 |
| | (E) | Thermoplastic resin | YX6954BH30 | 6 | 6 | 6 | 6 | 6 |
| | (F) | Stress relaxing material | EXL-2655 | 3 | 3 | 3 | | 3 |
| | | | PB3600 | | | | 3 | |
| | (G) | Radical polymerization initiator | Perbutyl C | 1 | 1 | 1 | 1 | 1 |
| | (H) | Curing accelerator | DMAP | 0.3 | 0.3 | 0.3 | 0.3 | 0.3 |
| | | | Co(acac)3 | | | | | |
| | | Sum of entire nonvolatile components | | 379.3 | 379.3 | 379.3 | 379.3 | 371.3 |
| Component content in resin composition | | Component (A)/entire nonvolatile components (% by mass) | | 0.8 | 1.6 | 1.6 | 1.6 | 1.6 |
| | | Component (B)/entire nonvolatile components (% by mass) | | 2.6 | 2.6 | 2.6 | 2.6 | 2.7 |
| | | Component (C1)/entire nonvolatile components (% by mass) | | 13.2 | 13.2 | 13.2 | 13.2 | 13.5 |
| | | Component (C2)/entire nonvolatile components (% by mass) | | 8.7 | 8.7 | 8.7 | 8.7 | 6.7 |
| | | Component (D)/entire nonvolatile components (% by mass) | | 71.2 | 71.2 | 71.2 | 71.2 | 72.7 |
| Evaluation results | | Elongation at breaking point (%) | | 2.2 | 2.2 | 2.4 | 2.7 | 2.5 |
| | | Post-HAST plating peel strength (kgf/cm) | | 0.31 | 0.27 | 0.38 | 0.38 | 0.43 |
| | | Crack resistance | | ○ | ○ | ○ | ○ | ○ |

| | | | | Example | | | Comparative Example | |
|---|---|---|---|---|---|---|---|---|
| | | | | 23 | 24 | 25 | 3 | 4 |
| Amount of nonvolatile component (parts by mass) | (A) | Compound containing radical polymerizable group having carbodiimide structure | Synthesis Example 1 | 6 | 6 | 6 | | |
| | | | Synthesis Example 2 | | | | | |
| | | | Synthesis Example 3 | | | | | |
| | | | Synthesis Example 4 | | | | | |
| | | | Synthesis Example 5 | | | | | |
| | (A') | Other carbodiimide compound | V-03 | | | | 6 | 6 |
| | (B) | Compound containing radical polymerizable group not having carbodiimide structure | OPE-2St 1200 | 10 | | | 10 | |
| | | | A-DOG | | | | | |
| | | | SLK-6895-T90 | | 10 | | | |
| | | | MIR-3000-70MT | | | 10 | | |
| | (C1) | Epoxy resin | 828US | 25 | 25 | 25 | 25 | 25 |
| | | | NC3000H | 25 | 25 | 25 | 25 | 25 |
| | | | ESN475V | | | | | |
| | | | YX4000HK | | | | | |
| | (C2) | Epoxy resin curing agent | HPC-8000-65T | 14 | 26 | 26 | 26 | 26 |
| | | | LA3018-50P | | 7 | 7 | 7 | 7 |
| | | | BA230S75 | 9 | | | | |
| | | | PT30 | 4 | | | | |
| | (D) | Inorganic filler | SO-C2 | 270 | 270 | 270 | 270 | 270 |
| | (E) | Thermoplastic resin | YX6954BH30 | 6 | 6 | 6 | 6 | 6 |
| | (F) | Stress relaxing material | EXL-2655 | 3 | 3 | 3 | 3 | 3 |
| | | | PB3600 | | | | | |

TABLE 3-continued

| | | | | | | | |
|---|---|---|---|---|---|---|---|
| (G) | Radical polymerization initiator | Perbutyl C | 1 | 1 | 1 | 1 | 1 |
| (H) | Curing accelerator | DMAP | 0.02 | 0.3 | 0.3 | 0.3 | 0.3 |
| | | Co(acac)3 | 0.04 | | | | |
| | Sum of entire nonvolatile components | | 373.06 | 379.3 | 379.3 | 379.3 | 369.3 |
| Component content in resin composition | Component (A)/entire nonvolatile components (% by mass) | | 1.6 | 1.6 | 1.6 | | |
| | Component (B)/entire nonvolatile components (% by mass) | | 2.7 | 2.6 | 2.6 | 2.6 | |
| | Component (C1)/entire nonvolatile components (% by mass) | | 13.4 | 13.2 | 13.2 | 13.2 | 13.5 |
| | Component (C2)/entire nonvolatile components (% by mass) | | 7.2 | 8.7 | 8.7 | 8.7 | 8.9 |
| | Component (D)/entire nonvolatile components (% by mass) | | 72.4 | 71.2 | 71.2 | 71.2 | 73.1 |
| Evaluation results | Elongation at breaking point (%) | | 2.0 | 3.2 | 2.6 | 1.6 | 1.2 |
| | Post-HAST plating peel strength (kgf/cm) | | 0.41 | 0.46 | 0.38 | 0.21 | 0.15 |
| | Crack resistance | | ○ | ○ | ○ | ○ | x |

It can be seen from the results in Table 3 above that when (A) the compound containing the radical polymerizable group having the carbodiimide structure and (B) the compound containing the radical polymerizable group not having the carbodiimide structure are used, the cured product having the crack resistance superior to the cured product not including the component (A) and the component (B) can be obtained, and the cured product having the mechanical strength and the plating adhesion property superior to the cured product not including the component (A) can be obtained.

Where a numerical limit or range is stated herein, the endpoints are included. Also, all values and subranges within a numerical limit or range are specifically included as if explicitly written out.

As used herein the words "a" and "an" and the like carry the meaning of "one or more."

Obviously, numerous modifications and variations of the present invention are possible in light of the above teachings. It is therefore to be understood that, within the scope of the appended claims, the invention may be practiced otherwise than as specifically described herein.

All patents and other references mentioned above are incorporated in full herein by this reference, the same as if set forth at length.

The invention claimed is:

1. A resin composition, comprising (A) at least one compound containing a radical polymerizable group having a carbodiimide structure, and (B) at least one compound containing a radical polymerizable group not having a carbodiimide structure, and optionally further comprising (C) at least one thermosetting resin, wherein the component (A) comprises a compound containing a radical polymerizable group represented by formula (1):

(1)

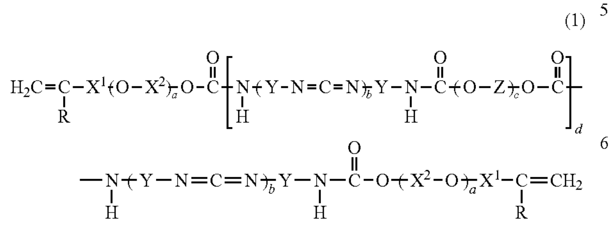

wherein, each R independently represents a hydrogen atom or a methyl group;

each $X^1$ independently represents a carbonyl group, a methylene group, a phenylene group, or a phenylene-methylene group;

each $X^2$ independently represents a saturated divalent hydrocarbon group having 2 to 4 carbon atoms;

each Y independently represents a saturated divalent hydrocarbon group having 2 to 30 carbon atoms optionally having a substituent group, or an unsaturated divalent hydrocarbon group having 2 to 30 carbon atoms optionally having a substituent group;

each Z independently represents a saturated divalent hydrocarbon group having 2 to 300 carbon atoms optionally having a substituent group, or an unsaturated divalent hydrocarbon group having 2 to 300 carbon atoms optionally having a substituent group;

each a independently represents 0, or an integer of 1 or more;

each b independently represents an integer of 1 or more;

each c independently represents an integer of 0 or more; and d represents an integer of 1 or more, and wherein the component (B) comprises at least one selected from the group consisting of a modified polyphenylene ether resin, a polyfunctional (meth) acryloyl group-containing compound, a polyfunctional vinylaryl group-containing compound, a polyfunctional allyl group-containing compound, and a maleimide compound.

2. The resin composition according to claim 1, wherein a content of the component (A) relative to 100% by mass of nonvolatile components in the resin composition is in a range of 0.05% by mass to 10% by mass.

3. The resin composition according to claim 1, wherein the component (C) comprises an epoxy resin.

4. The resin composition according to claim 3, wherein the component (C) further comprises an active ester type curing agent.

5. The resin composition according to claim 3, wherein the component (C) further comprises a phenol type curing agent.

6. The resin composition according to claim 1, further comprising (D) an inorganic filler.

7. The resin composition according to claim 6, wherein the component (D) is silica.

8. The resin composition according to claim 6, wherein a content of the component (D) relative to 100% by mass of nonvolatile components in the resin composition is 40% by mass or more.

9. The resin composition according to claim 1, further comprising a phenoxy resin.

10. The resin composition according to claim 1, wherein a dielectric dissipation factor (Df) of a cured product of the resin composition is 0.006 or less when measured at 5.8 GHz and 23° C.

11. The resin composition according to claim 1, wherein an elongation at a breaking point of a cured product of the resin composition is 1.2% or more when measured at 23° C.

12. The resin composition according to claim 1, wherein the resin composition is for forming an insulating layer to form a conductive layer.

13. The resin composition according to claim 1, wherein the resin composition is for forming an insulating layer of a printed wiring board.

14. A cured product of the resin composition according to claim 1.

15. A sheet-like laminate material comprising the resin composition according to claim 1.

16. A resin sheet comprising:

a support; and a resin composition layer formed on the support, the resin composition layer being formed from the resin composition according to claim 1.

17. A printed wiring board comprising an insulating layer composed of a cured product of the resin composition according to claim 1.

18. A semiconductor device comprising the printed wiring board according to claim 17.

19. The resin composition according to claim 1, wherein, in formula (1), c represents an integer of 1 or more.

20. The resin composition according to claim 19, wherein, in formula (1), each Z independently represents a divalent hydrocarbon group having 300 or less carbon atoms and having a structural unit selected from formulae (Z1) to (Z8):

(Z1)

(Z2)

(Z3)

(Z4)

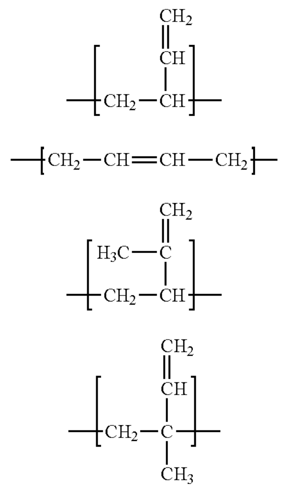

-continued (Z5)

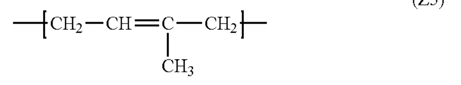

(Z6)

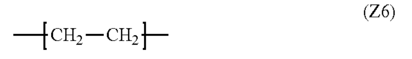

(Z7)

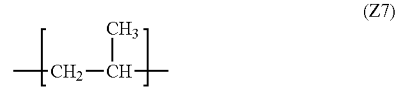

(Z8)

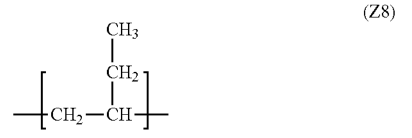

21. The resin composition according to claim 19, wherein, in formula (1), each Z independently represents a divalent hydrocarbon group having 300 or less carbon atoms and having a structural unit represented by formula (Z1):

(Z1)

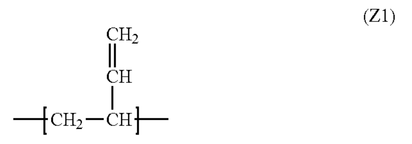

22. The resin composition according to claim 19, wherein, in formula (1), each Z independently represents a divalent hydrocarbon group having 300 or less carbon atoms represented by formula (Z1'):

(Z1')

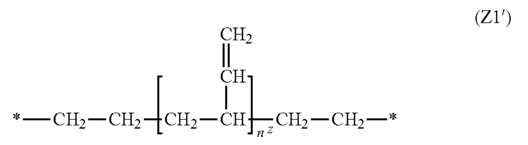

wherein, $n^z$ represents an integer of 1 or more; and

* indicates a bonding site.

23. The resin composition according to claim 1, wherein the component (A) comprises a compound represented by formula (S5):

(S5)
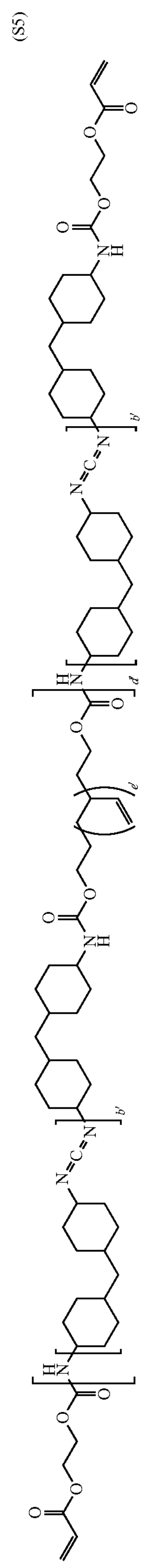

wherein, b' represents an average degree of polymerization of a carbodiimide group;

d' represents an average degree of polymerization of a combined unit of polybutadiene and polycarbodiimide; and e' represents an average degree of polymerization of a butadiene unit.

* * * * *